US012575320B2

(12) United States Patent
Hur et al.

(10) Patent No.: US 12,575,320 B2
(45) Date of Patent: Mar. 10, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Jaeweon Hur, Yongin-si (KR); Seulong Kim, Yongin-si (KR); Hyein Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 980 days.

(21) Appl. No.: 17/737,384

(22) Filed: May 5, 2022

(65) Prior Publication Data

US 2023/0284524 A1 Sep. 7, 2023

(30) Foreign Application Priority Data

Sep. 16, 2021 (KR) ........................ 10-2021-0124256

(51) Int. Cl.

| | |
|---|---|
| ***H01L 51/00*** | (2006.01) |
| ***C07F 9/6568*** | (2006.01) |
| ***C09K 11/06*** | (2006.01) |
| ***H10K 85/60*** | (2023.01) |
| *H10K 50/165* | (2023.01) |
| *H10K 59/123* | (2023.01) |

(52) U.S. Cl.

CPC ....... *H10K 85/657* (2023.02); *C07F 9/65685* (2013.01); *C09K 11/06* (2013.01); *C09K 2211/1018* (2013.01); *H10K 50/165* (2023.02); *H10K 59/123* (2023.02)

(58) Field of Classification Search

None

See application file for complete search history.

(56) References Cited

U.S. PATENT DOCUMENTS

| | | |
|---|---|---|
| 9,231,225 B2 | 1/2016 | Kim et al. |
| 11,011,723 B2 | 5/2021 | Jankus et al. |
| 2015/0236274 A1 | 8/2015 | Hatakeyama et al. |

(Continued)

FOREIGN PATENT DOCUMENTS

| | | |
|---|---|---|
| CN | 109216409 A * | 11/2019 |
| EP | 3188277 A1 * | 7/2017 |

(Continued)

*Primary Examiner* — Tae H Yoon

(74) *Attorney, Agent, or Firm* — Womble Bond Dickinson (US) LLP

(57) ABSTRACT

A light-emitting device includes a first electrode, a second electrode facing the first electrode, and an interlayer including an emission layer between the first electrode and the second electrode and an electron transport region between the emission layer and the second electrode. The electron transport region includes an electron transport layer and an electron injection layer between the electron transport layer and the second electrode. The electron transport layer includes a first material and a second material, the electron injection layer includes a third material and a fourth material, and an amount of the third material is in a range of about 50 parts by weight to about 99 parts by weight, based on a total of 100 parts by weight of the electron injection layer. The first material to the fourth material are respectively the same as described in the specification.

20 Claims, 5 Drawing Sheets

(56) References Cited

U.S. PATENT DOCUMENTS

| | | | |
|---|---|---|---|
| 2017/0263876 | A1 | 9/2017 | Kim et al. |
| 2018/0114940 | A1 | 4/2018 | Pavicic et al. |
| 2018/0190922 | A1 | 7/2018 | Gölfert et al. |

FOREIGN PATENT DOCUMENTS

| | | | |
|---|---|---|---|
| EP | 3425692 | A1 * | 1/2019 |
| JP | 3599355 | B2 * | 12/2004 |
| JP | 3737176 | B2 * | 11/2005 |
| KR | 10-2017-0106564 | A | 9/2017 |
| KR | 10-2018-0044823 | | 5/2018 |
| KR | 10-2018-0075128 | | 7/2018 |
| KR | 10-2019-0005761 | | 1/2019 |
| KR | 10-2019-0025065 | A | 3/2019 |
| KR | 10-2147845 | | 8/2020 |

* cited by examiner

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2021-0124256 under 35 U.S.C. § 119, filed on Sep. 16, 2021 in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Among light-emitting devices, self-emissive devices have wide viewing angles, high contrast ratios, short response times, and excellent characteristics in terms of luminance, driving voltage, and response speed.

In a light-emitting device, a first electrode is arranged on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include a light-emitting device having low driving voltage, high luminescence efficiency, and a long lifespan, and an electronic apparatus including the light-emitting device.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, and an interlayer including an emission layer between the first electrode and the second electrode and an electron transport region between the emission layer and the second electrode, wherein the electron transport region may include an electron transport layer and an electron injection layer between the electron transport layer and the second electrode, the electron transport layer may include a first material and a second material, the first material may be a compound represented by Formula 1 or Formula 2, the second material may include a first metal, a halide of the first metal, a complex including the first metal, or a combination thereof, the electron injection layer may include a third material and a fourth material, the third material may include a second metal, a halide of the second metal, a complex including the second metal, or a combination thereof, the fourth material may include a third metal, a halide of the third metal, a complex including the third metal, or a combination thereof, the first metal, the second metal, and the third metal may be identical to or different from each other, and an amount of the third material may be in a range of about 50 parts by weight to about 99 parts by weight, based on a total of 100 parts by weight of the electron injection layer.

[Formula 1]

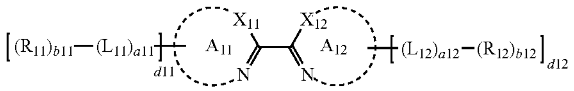

[Formula 2]

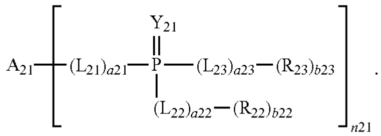

In Formula 1, $X_{11}$ may be N or $C(Z_{11})$, $X_{12}$ may be N or $C(Z_{12})$, $A_{11}$ and $A_{12}$ may each independently be a $C_1$-$C_{60}$ heterocyclic group including at least one N, and d11 and d12 may each independently be an integer from 1 to 10.

In Formula 2, $Y_{21}$ may be O, S, or Se, $A_{21}$ may be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and n21 may be an integer from 1 to 3.

In Formulae 1 and 2, $L_{11}$, $L_{12}$, and $L_{21}$ to $L_{23}$ may each independently be a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a11, a12, and a21 to a23 may each independently be an integer from 1 to 5, $R_{11}$, $R_{12}$, $R_{22}$, $R_{23}$, $Z_{11}$, and $Z_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b11, b12, b22, and b23 may each independently be an integer from 1 to 10, $R_{22}$ and $R_{23}$ may optionally be bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, $Z_{11}$ and $Z_{12}$ may optionally be bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the first electrode may be an anode, the second electrode may be a cathode, the interlayer may further include a hole transport region between the emission layer and the first electrode, the hole transport region may include a hole injection layer, a hole transport layer, an emission auxiliary layer, an electron blocking layer, or any combination thereof, and electron transport region may further include a buffer layer, a hole blocking layer, an electron control layer, or any combination thereof.

In an embodiment, the light-emitting device may further include a first capping layer disposed outside the first electrode, a second capping layer disposed outside the second electrode, or both the first capping layer and the second capping layer.

In an embodiment, the emission layer and the electron transport layer may directly contact each other.

In an embodiment, the electron transport layer and the electron injection layer may directly contact each other.

In an embodiment, the electron injection layer and the second electrode may directly contact each other.

In an embodiment, the emission layer may include a dopant, and the dopant may serve as a phosphorescent dopant to emit phosphorescence from the emission layer.

In an embodiment, the emission layer may include a dopant, and the dopant may emit blue light having a maximum emission wavelength in a range of about 450 nm to about 490 nm.

In an embodiment, the emission layer may include a dopant and the dopant may include a boron-containing compound.

In an embodiment, the electron transport layer may be formed by co-depositing the first material and the second material.

In an embodiment, the electron injection layer may be formed by co-depositing the third material and the fourth material.

In an embodiment, the first metal included in the second material, the second metal included in the third material, and the third metal included in the fourth material may each independently be an alkali metal, an alkaline earth metal, a rare earth metal, a third-row transition metal of the periodic table, or any combination thereof.

In an embodiment, the halide of the second metal may include a fluoride of the second metal, a bromide of the second metal, an iodide of the second metal, or a combination thereof.

In an embodiment, a moiety represented by

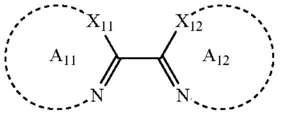

in Formula 1 may be represented by one of Formulae 1-1 to 1-32, which are explained below.

In an embodiment, the compound represented by Formula 2 may be represented by one of Formulae 2-1 to 2-4, which are explained below.

In an embodiment, $A_{21}$ in Formula 2 may be represented by one of Formulae 3-1 to 3-7, which are explained below.

According to embodiments, a light-emitting device may include first electrodes arranged for each of a first subpixel, a second subpixel, and a third subpixel, a second electrode facing the first electrodes, m emitting units between the second electrode and the first electrodes, and m−1 charge generation layers, each arranged between two neighboring emitting units among the m emitting units and including an n-type charge generation layer and a p-type charge generation layer, wherein m may be an integer of 2 or more, each of the m emitting units may include an emission layer and an electron transport region that are sequentially arranged, at least one of the m emission layers may include a first emission layer arranged on the first subpixel and emitting first-color light, a second emission layer arranged on the second subpixel and emitting second-color light, and a third emission layer arranged on the third subpixel and emitting third-color light, the first-color light may be red light, the second-color light may be green light, and the third-color light may be blue light, at least one of the m electron transport regions may include an electron transport layer and an electron injection layer that are sequentially arranged, the electron transport layer may include a first material and a second material, the first material may be a compound represented by Formula 1 or Formula 2, the second material may include a first metal, a halide of the first metal, a complex including the first metal, or a combination thereof, the electron injection layer may include a third material and a fourth material, the third material may include a second metal, a halide of the second metal, a complex including the second metal, or a combination thereof, the fourth material may include a third metal, a halide of the third metal, a complex including the third metal, or a combination thereof, the first metal, the second metal, and the third metal may be identical to or different from each other, and an amount of the third material may be in a range of about 50 parts by weight to about 99 parts by weight, based on a total of 100 parts by weight of the electron injection layer.

According to embodiments, an electronic apparatus may include the light-emitting device.

In an embodiment, the electronic apparatus may further include a thin-film transistor, wherein the thin-film transistor may include a source electrode and a drain electrode, and the first electrode of the light-emitting device may be electrically connected to the source electrode or the drain electrode.

In an embodiment, the electronic apparatus may further include a color filter, a color conversion layer, a touch screen layer, a polarizing layer, or any combination thereof.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
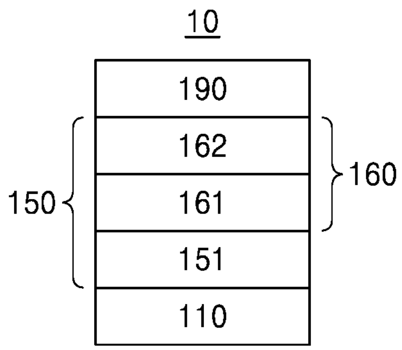
FIG. 1 is a schematic cross-sectional view of a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

According to embodiments, a light-emitting device may include a first electrode, a second electrode facing the first electrode, and an interlayer including: an emission layer between the first electrode and the second electrode; and an electron transport region between the emission layer and the second electrode.

The electron transport region may include an electron transport layer, and an electron injection layer between the electron transport layer and the second electrode.

The electron transport layer may include a first compound and a second compound.

The first material may be a compound represented by Formula 1 or Formula 2:

[Formula 1]

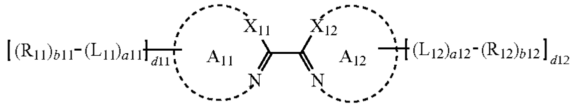

[Formula 2]

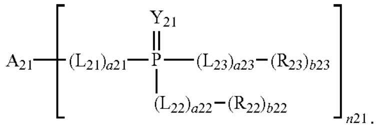

In Formula 1, $X_{11}$ may be N or $C(Z_{11})$, and $X_{12}$ may be N or $C(Z_{12})$. $Z_{11}$ and $Z_{12}$ may respectively be the same as described herein.

In an embodiment, in Formula 1, $X_{11}$ may be $C(Z_{11})$, and $X_{12}$ may be $C(Z_{12})$.

In an embodiment, in Formula 1, $X_{11}$ may be N, and $X_{12}$ may be $C(Z_{12})$.

In Formula 1, $A_{11}$ and $A_{12}$ may each independently be a $C_1$-$C_{60}$ heterocyclic group including at least one N.

In embodiments, in Formula 1, $A_{11}$ and $A_{12}$ may each independently be a pyridine group, a pyrimidine group, a pyridazine group, a pyrazine group, a triazine group, or any combination thereof, but embodiments are not limited thereto.

In Formula 1, d11 and d12 may each independently be an integer from 1 to 10.

In embodiments, in Formula 1, d11 and d12 may each independently be an integer from 1 to 5, but embodiments are not limited thereto.

In Formula 2, $Y_{21}$ may be O, S, or Se.

In an embodiment, in Formula 2, $Y_{21}$ may be O, but embodiments are not limited thereto.

In Formula 2, $A_{21}$ may be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$. $R_{10a}$ may be the same as described herein.

In embodiments, in Formula 2, $A_{21}$ may be represented by one of Formulae 3-1 to 3-7:

3-1

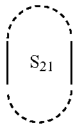

3-2

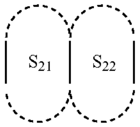

3-3

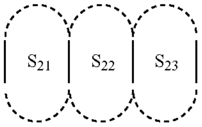

3-4

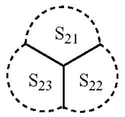

3-5

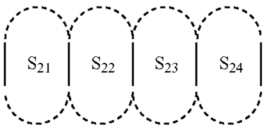

3-6

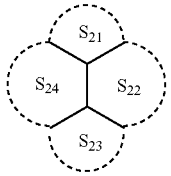

3-7

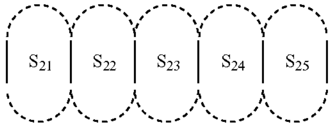

In Formulae 3-1 to 3-7, $S_{21}$ to $S_{25}$ may each independently be a benzene group, a naphthalene group, a phenanthrene group, an anthracene group, a triphenylene group, a cyclopentadiene group, a furan group, a pyrrole group, an imidazole group, a benzoxazole group, a benzothiazole group, a benzoimidazole group, a pyridine group, a pyrazine group, a pyrimidine group, an indole group, a quinoline group, an isoquinoline group, a benzoquinoline group, a phenanthridine group, an acridine group, a phenanthroline group, a triazole group, a tetrazole group, or a triazine group, each unsubstituted or substituted with at least one $R_{10a}$.

In Formula 2, n21 may be an integer from 1 to 3.

In Formulae 1 and 2, $L_{11}$, $L_{12}$, and $L_{21}$ to $L_{23}$ may each independently be a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, in Formulae 1 and 2, $L_{11}$, $L_{12}$, and $L_{21}$ to $L_{23}$ may each independently be:

a single bond; or a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, an indole group, an indene group, a benzosilole group, a benzothiophene group, a benzofuran group, a carbazole group, a fluorene group, a dibenzosilole group, a dibenzothiophene group, a dibenzofuran group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzoimidazole group, a benzooxazole group, a benzothiazole group, a benzooxadiazole group, a benzothiadiazole group, a 5,6,7,8-tetrahydroisoquinoline group, or a 5,6,7,8-tetrahydroquinoline group, each unsubstituted or substituted with at least one $R_{10a}$.

In Formulae 1 and 2, a11, a12, and a21 to a23 may each independently be an integer from 1 to 5.

In Formulae 1 and 2, $R_{11}$, $R_{12}$, $R_{22}$, $R_{23}$, $Z_{11}$, and $Z_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$. $Q_1$ to $Q_3$ may respectively be the same as described herein.

In embodiments, in Formulae 1 and 2, $R_{11}$, $R_{12}$, $R_{22}$, $R_{23}$, $Z_{11}$, and $Z_{12}$ may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof; or —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$.

In Formulae 1 and 2, b11, b12, b22, and b23 may each independently be an integer from 1 to 10.

In embodiments, in Formulae 1 and 2, b11, b12, b22, and b23 may each independently be an integer from 1 to 5.

In Formula 2, $R_{22}$ and $R_{23}$ may optionally be bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$.

In Formula 1, when $X_{11}$ is $C(Z_{11})$, and $X_{12}$ is $C(Z_{12})$, $Z_{11}$ and $Z_{12}$ may optionally be bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$.

In an embodiment, a moiety represented by

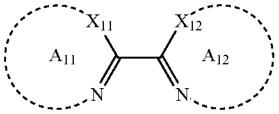

in Formula 1 may be represented by one of Formulae 1-1 to 1-32:

1-1

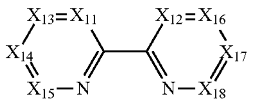

1-2

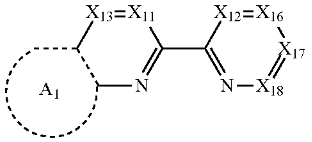

1-3

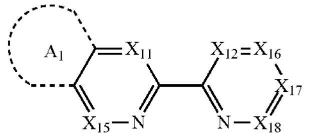

1-4

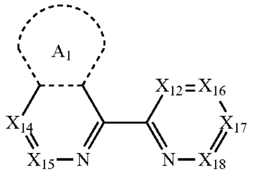

1-5

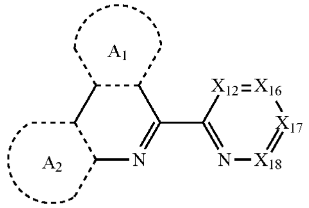

1-6

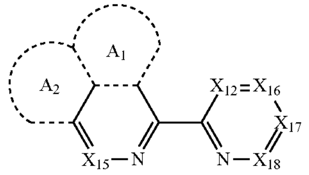

-continued 1-7

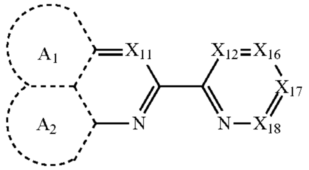

1-8

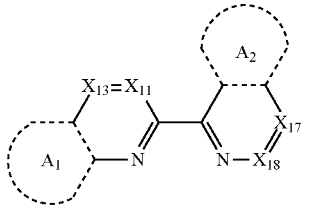

1-9

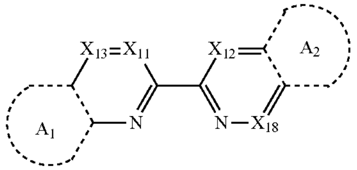

1-10

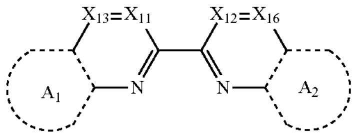

1-11

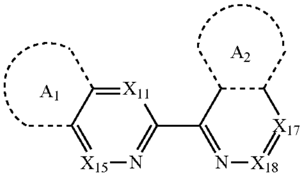

1-12

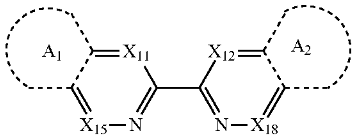

1-13

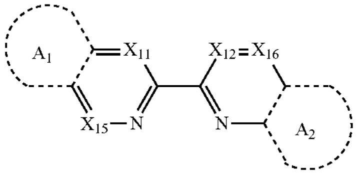

1-14

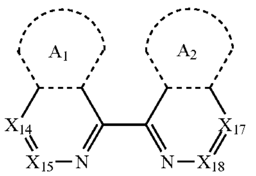

-continued
1-15
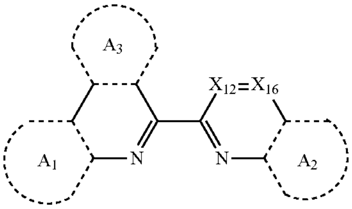
1-16
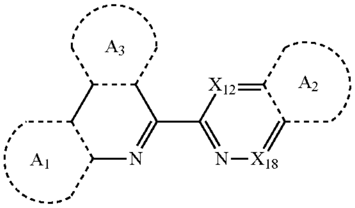
I-17
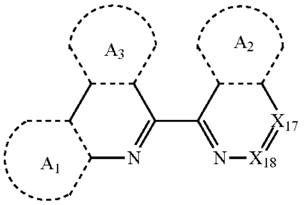
1-18
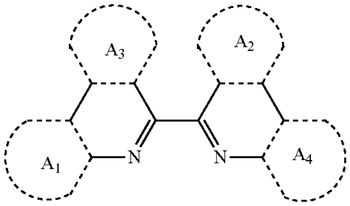
1-19
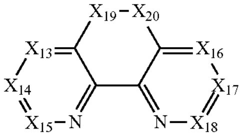
1-20
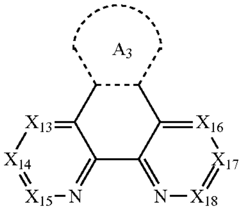
1-21
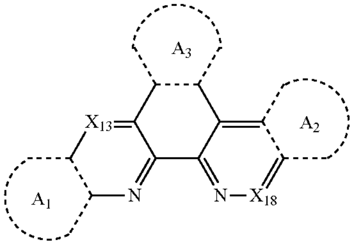
-continued
1-22
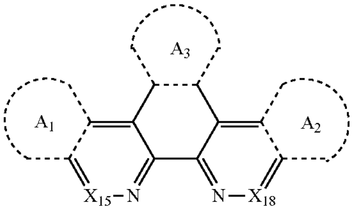
1-23
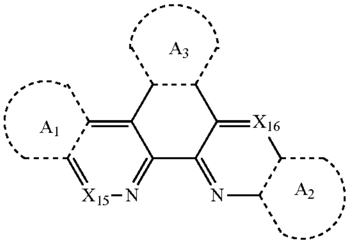
1-24
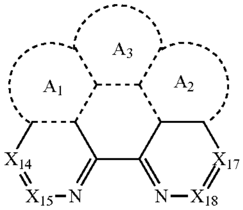
1-25
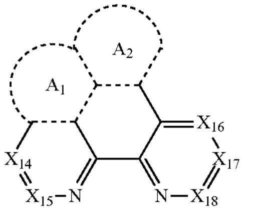
1-26
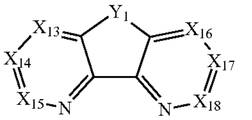
1-27
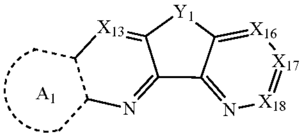
1-28
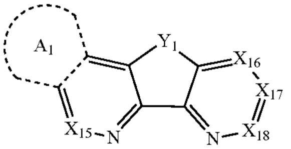
1-29
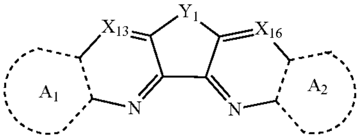

-continued 1-30

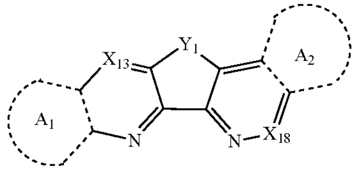

1-31

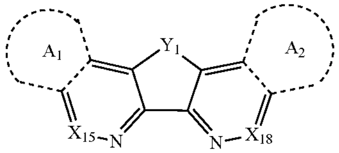

1-32

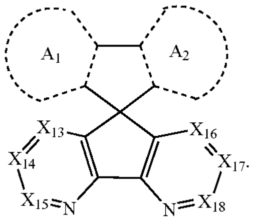

In Formulae 1-1 to 1-32, $X_{11}$ and $X_{12}$ may respectively be the same as described in Formula 1, $X_{13}$ may be N or $C(Z_{13})$,
$X_{14}$ may be N or $C(Z_{14})$,
$X_{15}$ may be N or $C(Z_{15})$,
$X_{16}$ may be N or $C(Z_{16})$,
$X_{17}$ may be N or $C(Z_{17})$,
$X_{18}$ may be N or $C(Z_{18})$,
$X_{19}$ may be N or $C(Z_{19})$, and
$X_{20}$ may be N or $C(Z_{20})$.

In Formulae 1-1 to 1-32, $A_1$ to $A_3$ may each independently be a benzene group, a naphthalene group, an anthracene group, a phenanthrene group, a triphenylene group, a pyrene group, a cyclopentadiene group, a thiophene group, a furan group, an indole group, an indene group, a benzosilole group, a benzogermole group, a benzothiophene group, a benzoselenophene group, a benzofuran group, a carbazole group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzoimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$.

In Formulae 1-1 to 1-32, $Y_1$ may be O, S, $N(Z_{1a})$, or $C(Z_{1a})(Z_{1b})$, $Z_{13}$ to $Z_{20}$, $Z_{1a}$, and $Z_{1b}$ may each independently be the same as described in connection with $R_{11}$ in Formula 1, and $Z_{13}$ to $Z_{20}$, $Z_{1a}$, and $Z_{1b}$ may optionally be bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$. $R_{10a}$ may be the same as described herein.

In an embodiment, the compound represented by Formula 1 may be represented by one of Formulae 2-1 to 2-4:

[Formula 2-1]

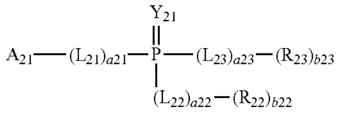

[Formula 2-2]

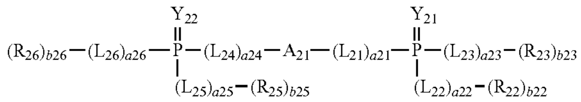

[Formula 2-3]

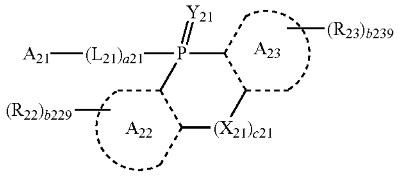

[Formula 2-4]

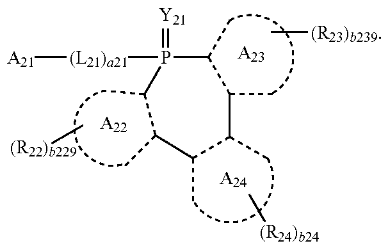

In Formulae 2-1 to 2-4, $Y_{21}$, $A_{21}$, $L_{21}$ to $L_{23}$, a21 to a23, $R_{22}$, and $R_{23}$ may respectively be the same as described in Formula 2, $X_{21}$ may be a single bond, O, S, $N(Z_{21a})$, or $C(Z_{21a})(Z_{21b})$, c21 may be 0 or 1, $Z_{21a}$ and $Z_{21b}$ may each independently be the same as described in connection with $R_{22}$ in Formula 2, $Y_{22}$ may be the same as described in connection with $Y_{21}$ in Formula 2, $L_{24}$ to $L_{26}$ may each independently be the same as described in connection with $L_{21}$ in Formula 2, a24 to a26 may each independently be an integer from 1 to 5, b229 and b239 may each independently be an integer from 1 to 9, $R_{24}$ to $R_{26}$ may each independently be the same as described in connection with $R_{22}$ in Formula 2, b24 to b26 may each independently be an integer from 1 to 10, and $A_{22}$ to $A_{24}$ may each independently be a $C_5$-$C_{60}$ carbocyclic group or a $C_2$-$C_{30}$ heterocyclic group.

In an embodiment, the first material may be one of Compounds 1-1 to 1-18 and 2-1 to 2-78, but embodiments are not limited thereto:

-continued
1-1
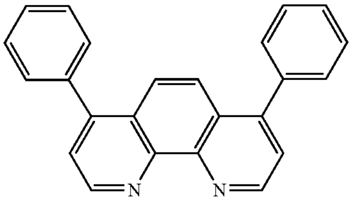
1-2
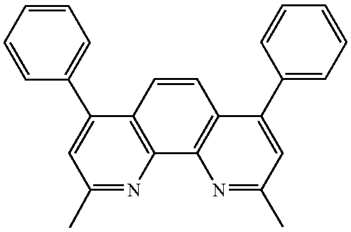
1-3
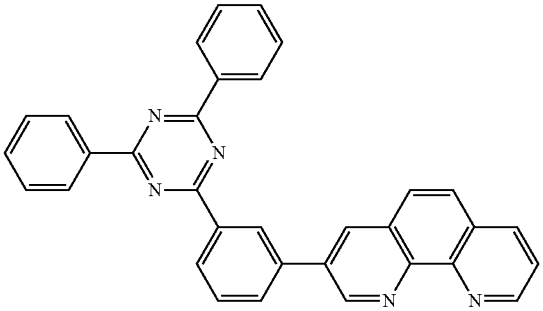
1-4
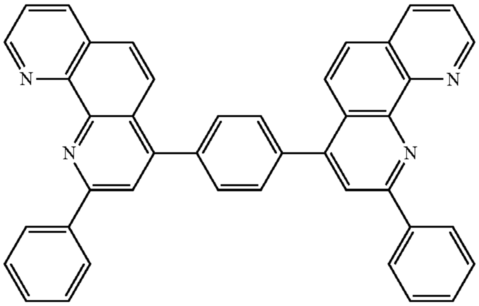
1-5
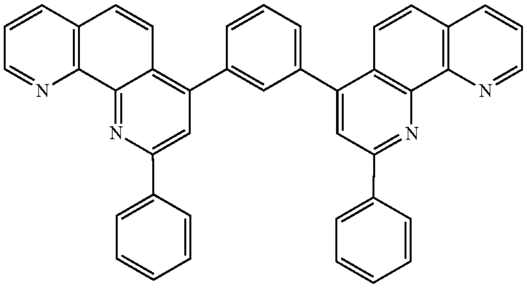
1-6
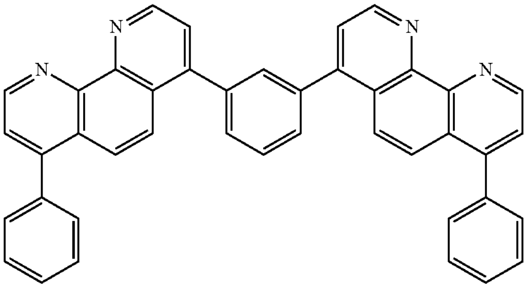
1-7
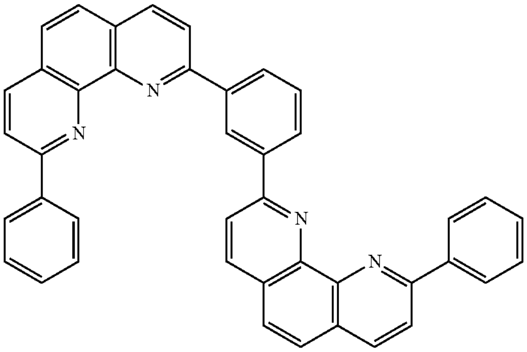
1-8
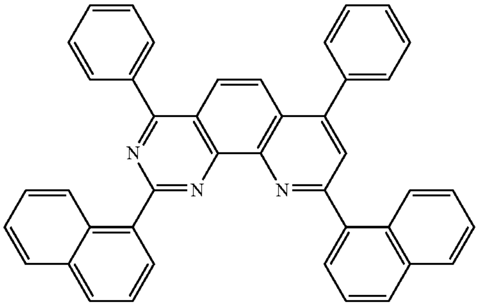
1-9
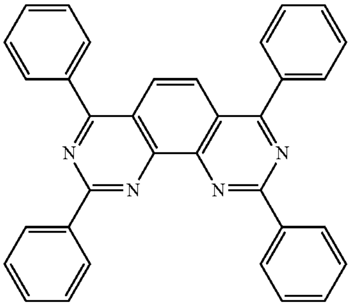
1-10
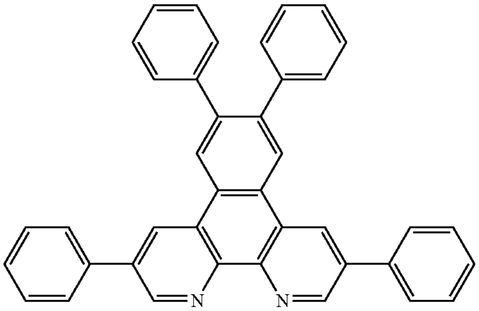

-continued
1-11
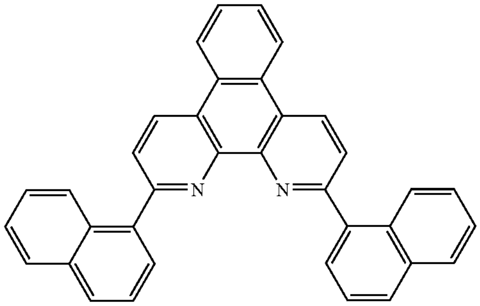
1-12
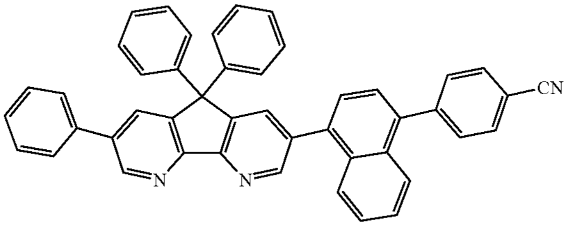
1-13
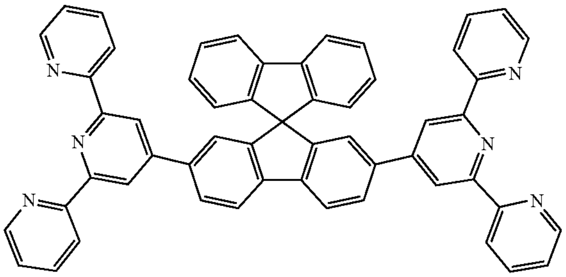
1-14
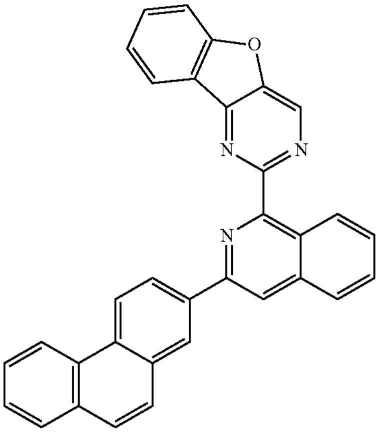
1-15
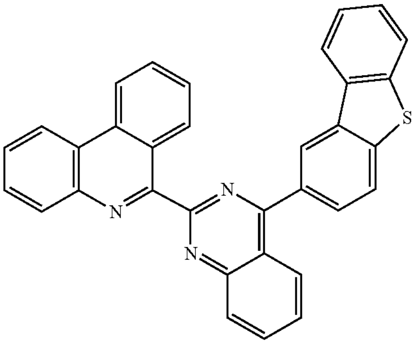
-continued
1-16
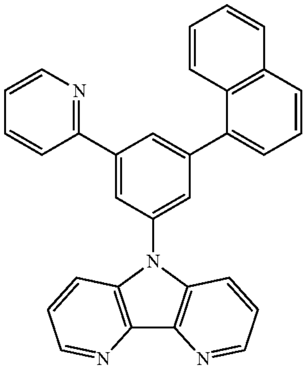
1-17
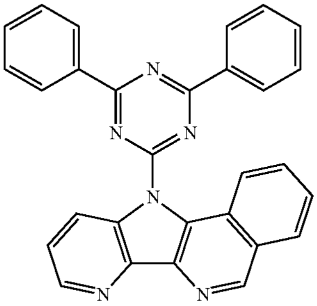
1-18
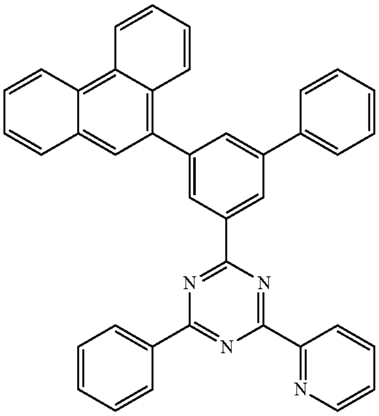
2-1
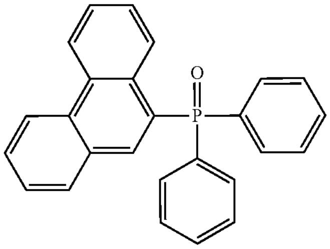
2-2
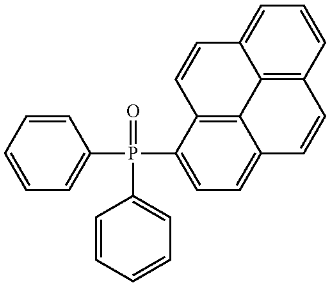

-continued
2-3
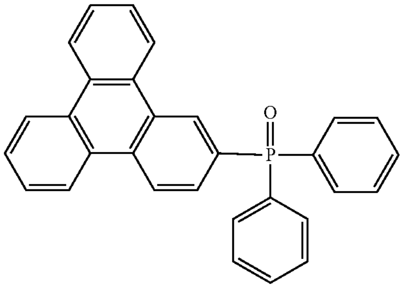
2-4
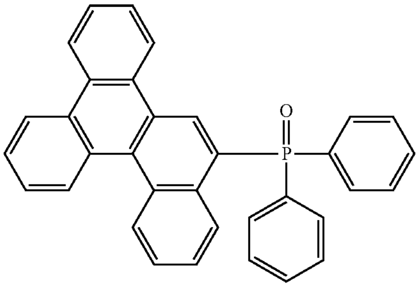
2-5
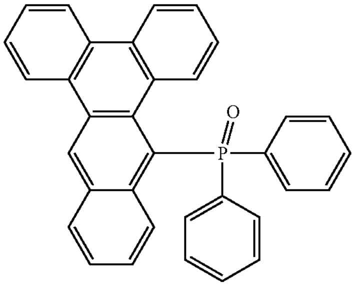
2-6
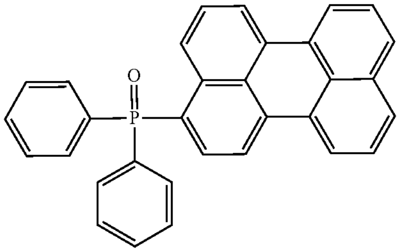
2-7
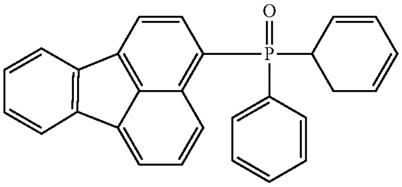
2-8
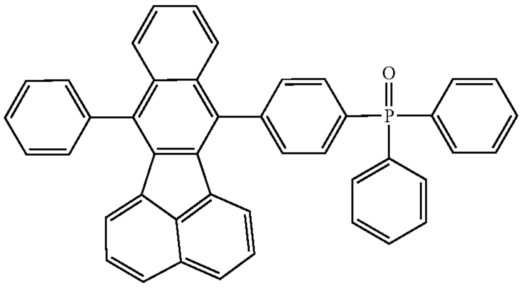
-continued
2-9
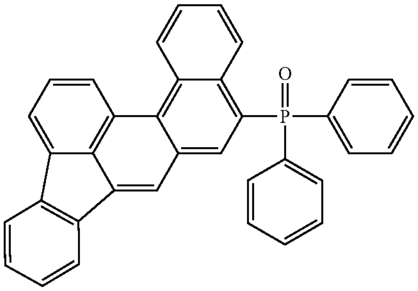
2-10
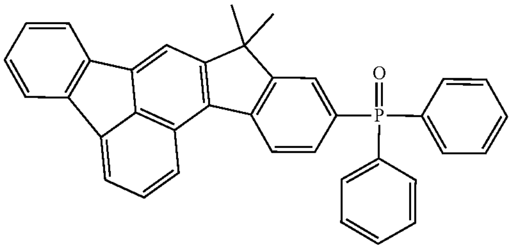
2-11
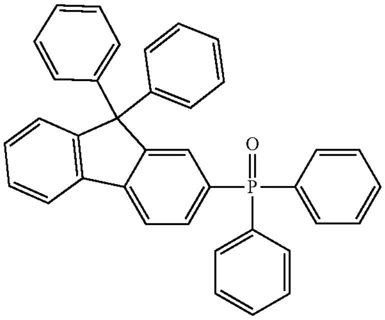
2-12
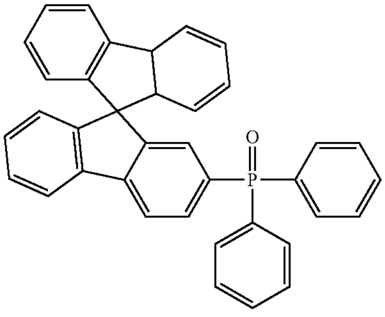
2-13
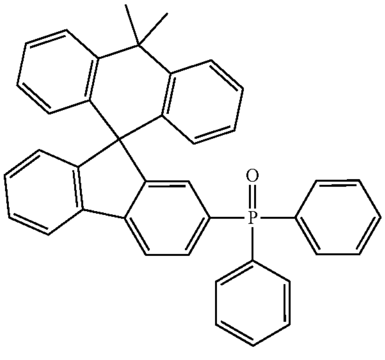

-continued
2-14
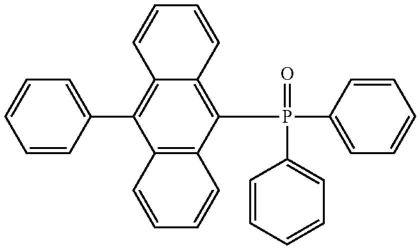
2-15
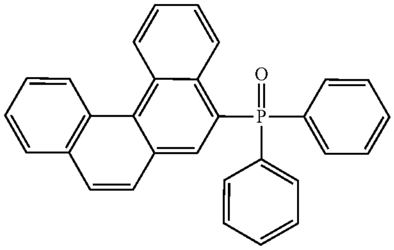
2-16
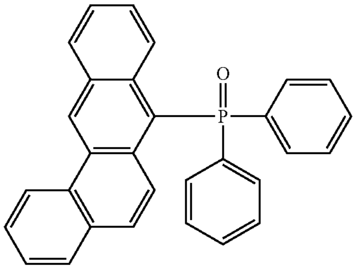
2-17
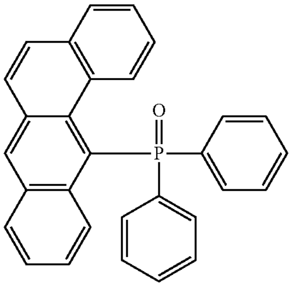
2-18
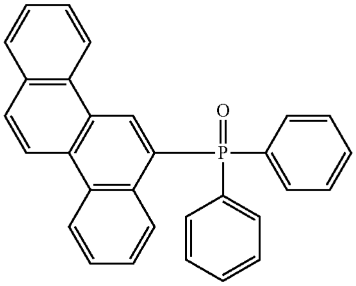
-continued
2-19
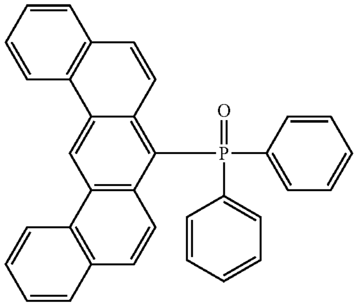
2-20
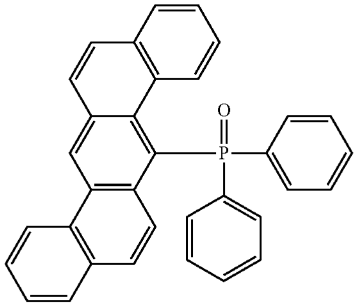
2-21
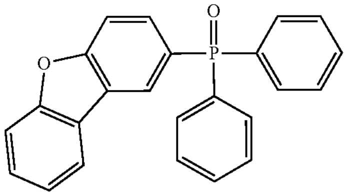
2-22
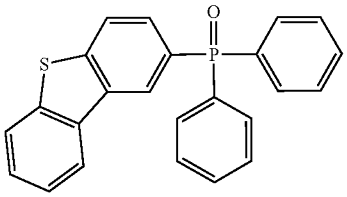
2-23
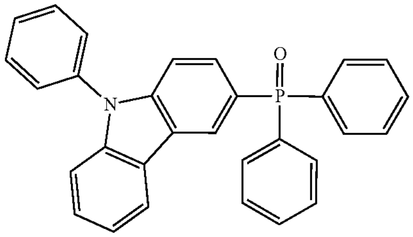
2-24
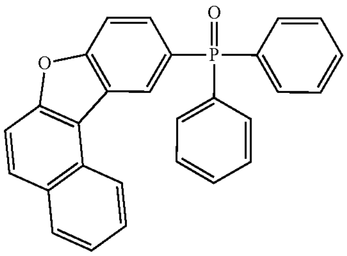

-continued
2-25
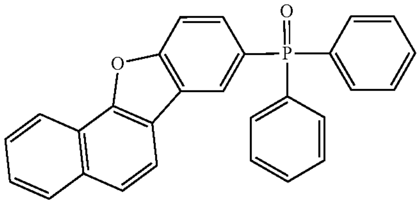
2-26
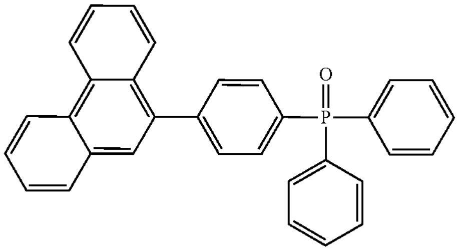
2-27
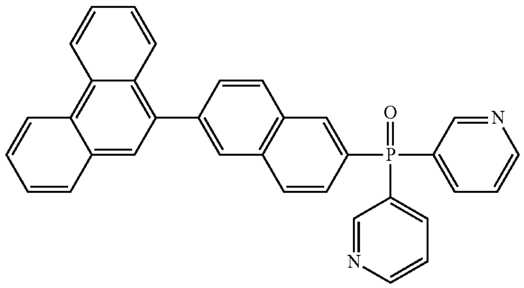
2-28
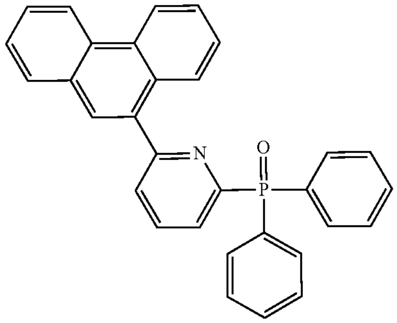
2-29
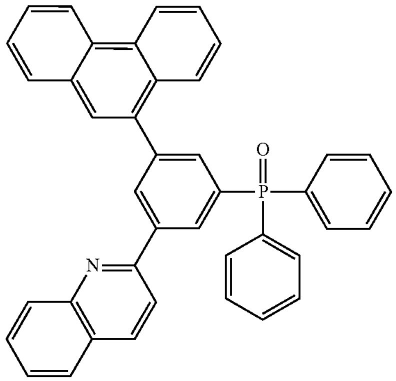
-continued
2-30
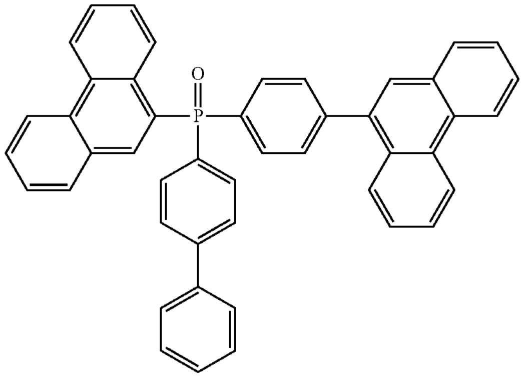
2-31
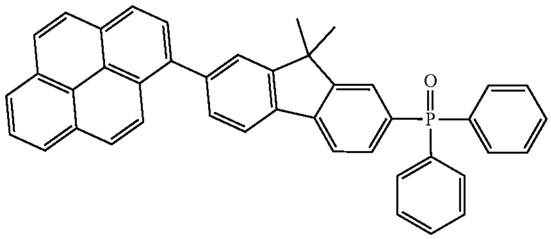
2-32
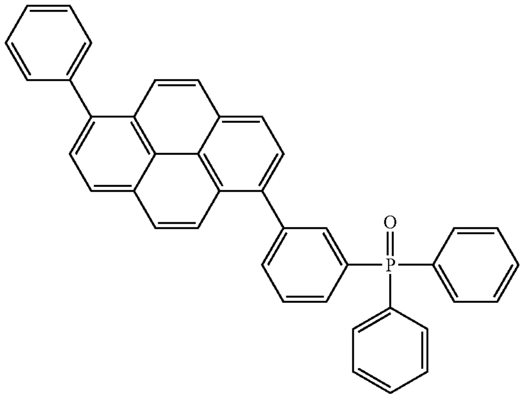
2-33
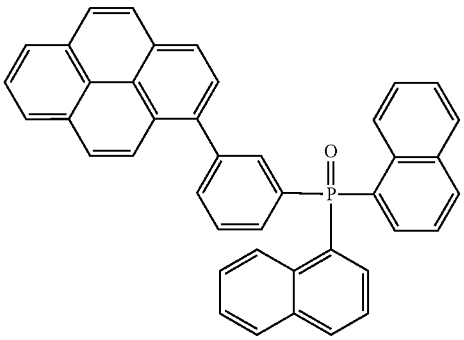

2-34
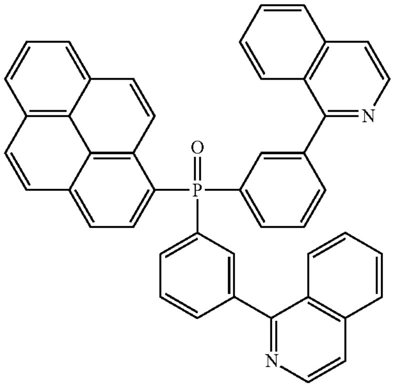
2-35
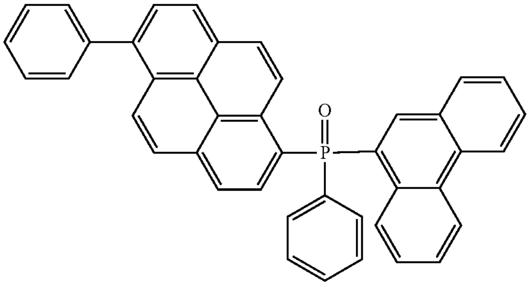
2-36
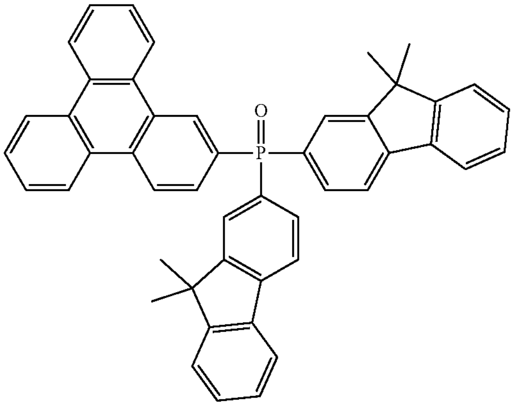
2-37
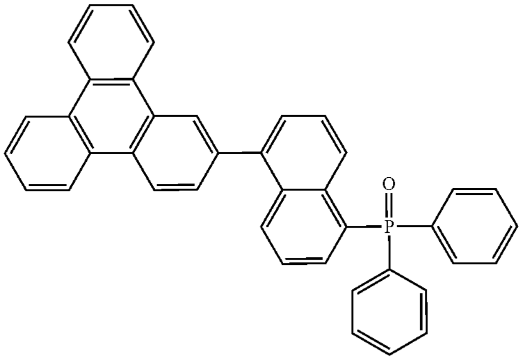
2-38
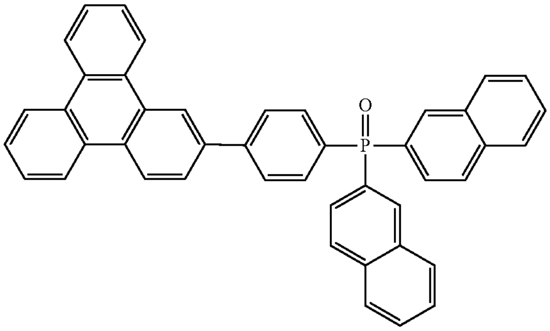
2-39
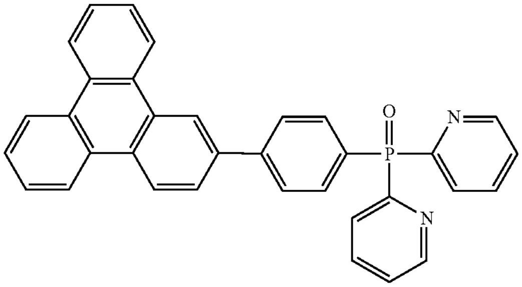
2-40
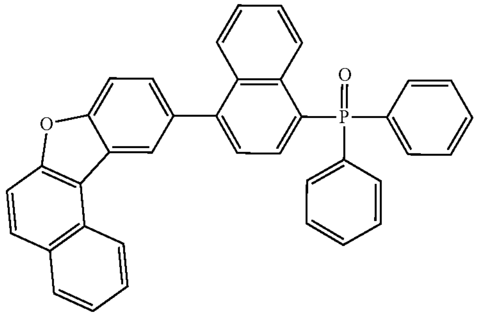
2-41
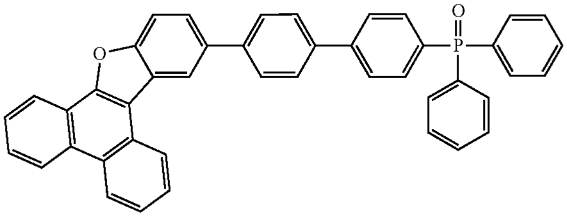
2-42
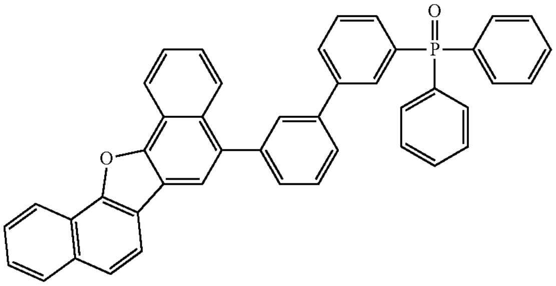

-continued
2-43
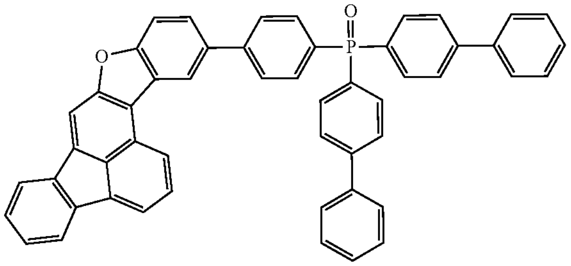
2-44
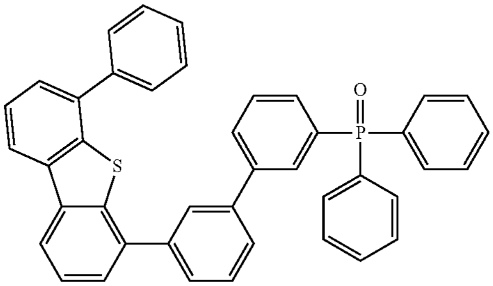
2-45
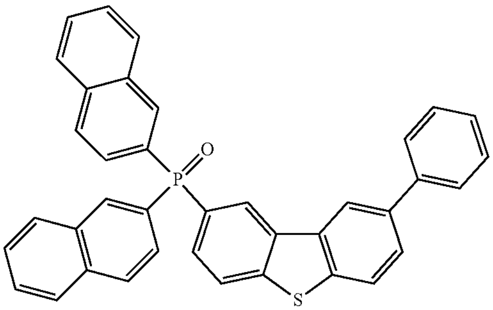
2-46
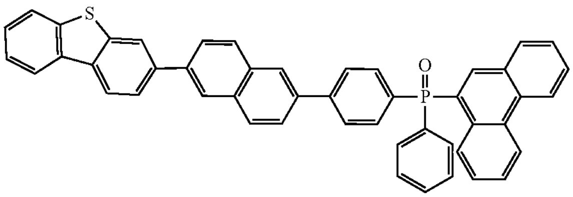
2-47
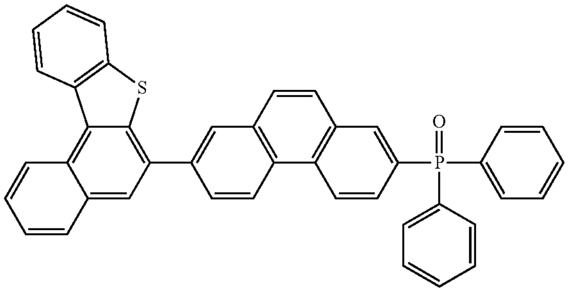
-continued
2-48
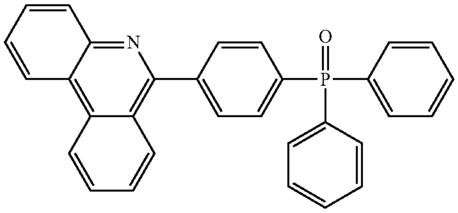
2-49
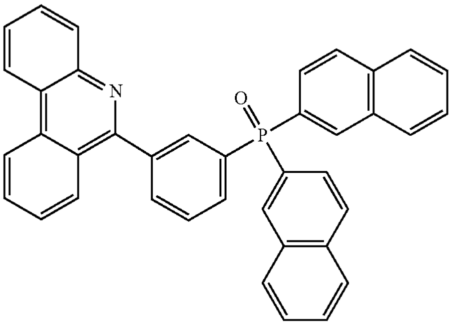
2-50
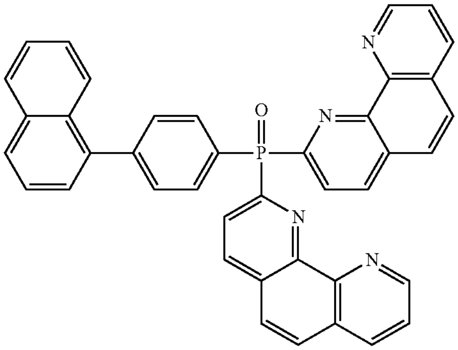
2-51
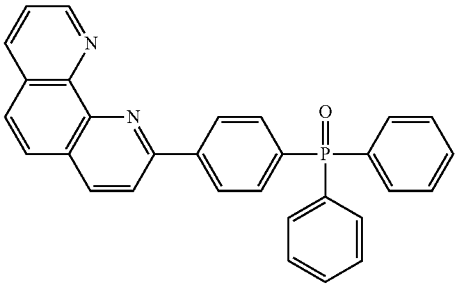
2-52
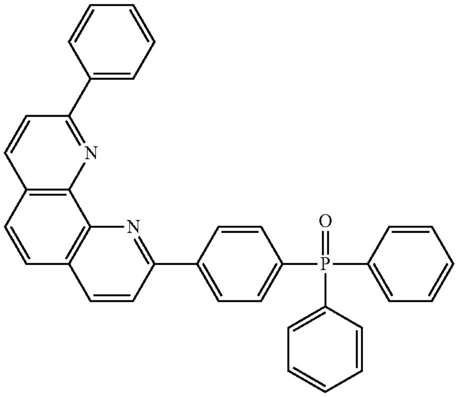

-continued
2-53
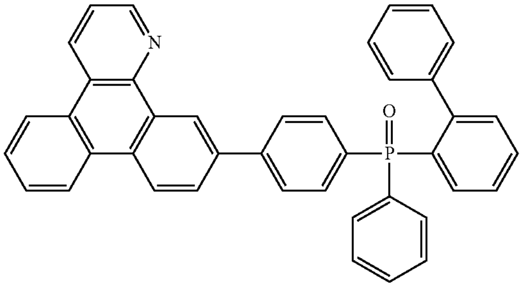
2-54
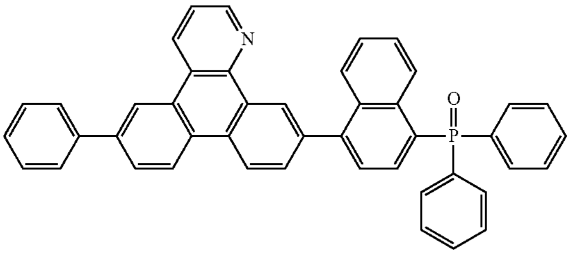
2-55
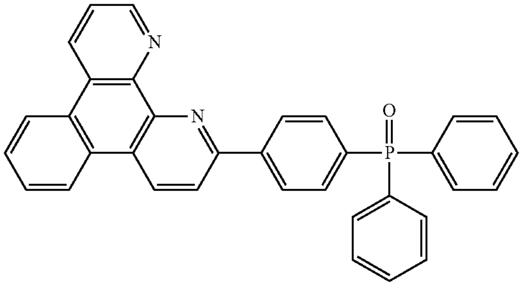
2-56
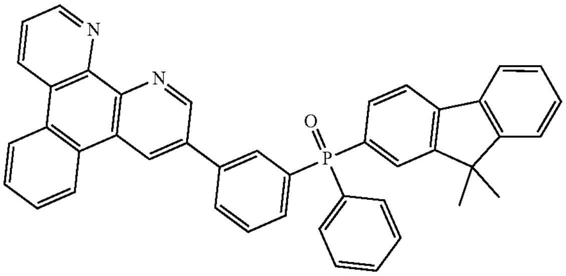
2-57
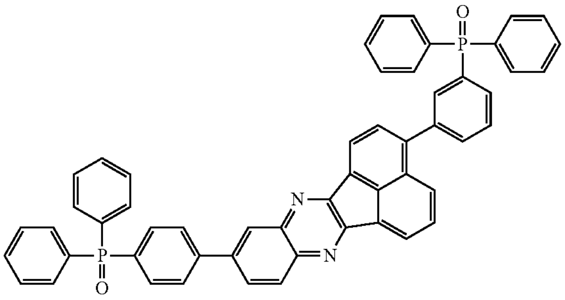
-continued
2-58
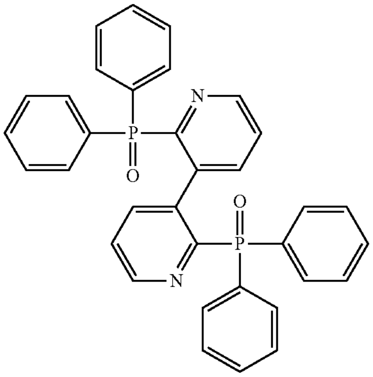
2-59
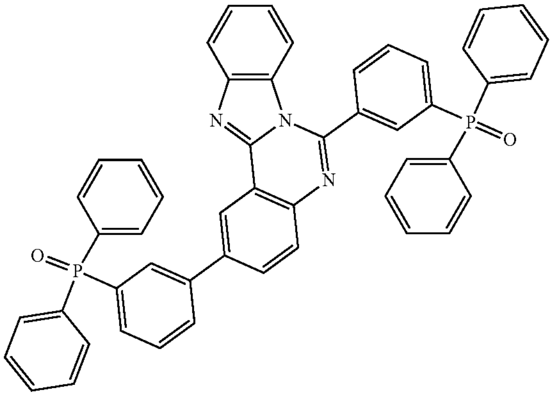
2-60
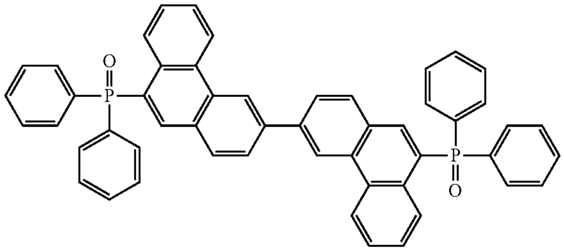
2-61
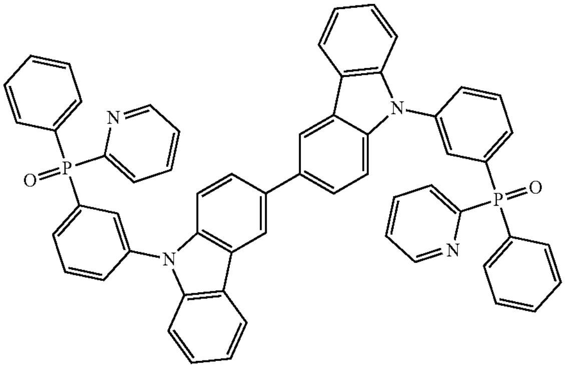

-continued
2-62
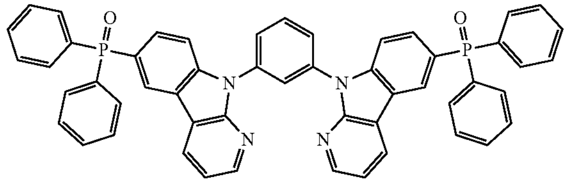
2-63
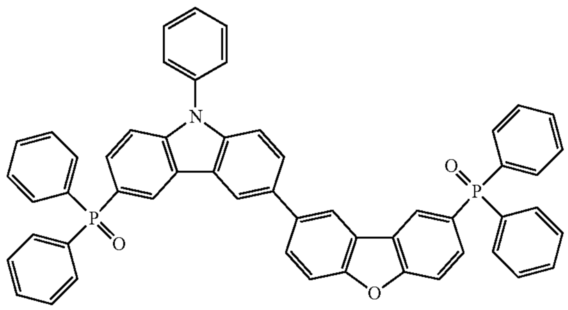
2-64
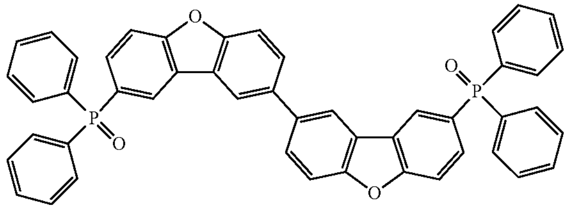
2-65
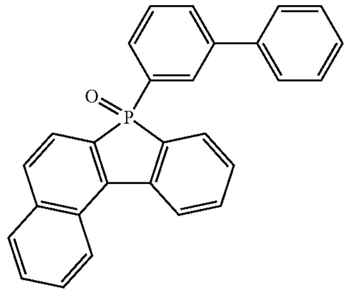
2-66
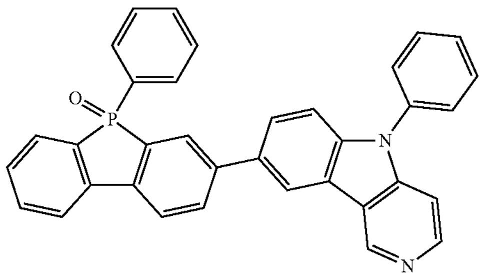
-continued
2-67
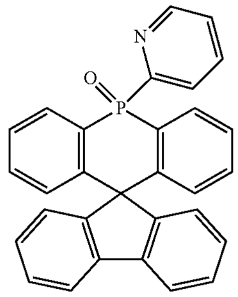
2-68
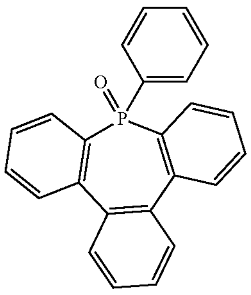
2-69
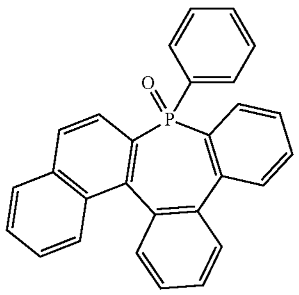
2-70
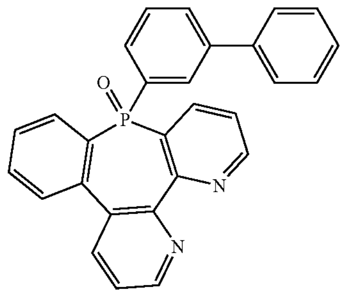
2-71
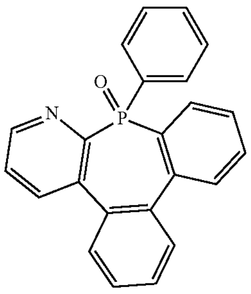

-continued 2-72

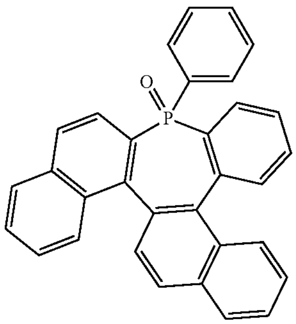

2-73

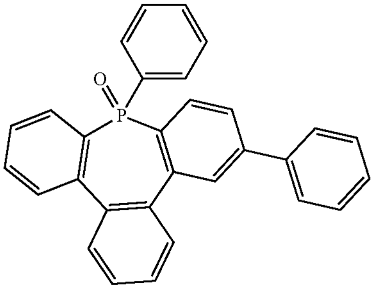

2-74

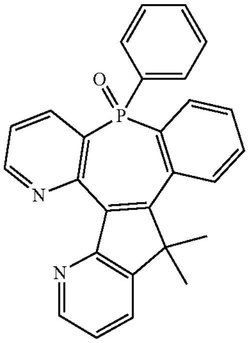

2-75

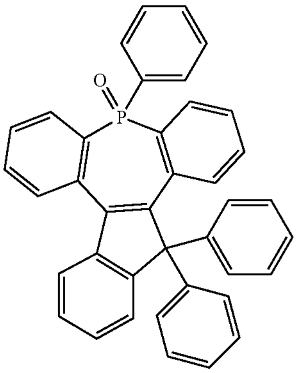

-continued 2-76

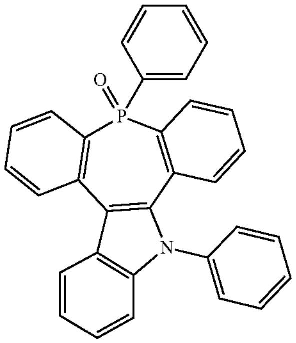

2-77

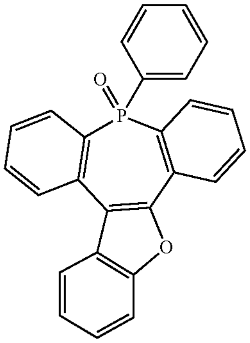

2-78

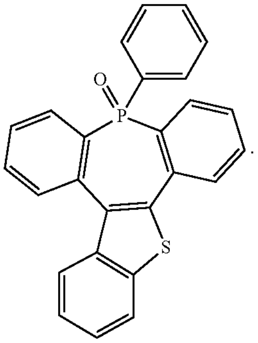

In an embodiment, the second material of the electron transport layer may include a first metal, a halide of the first metal, a complex including the first metal, or a combination thereof.

The electron injection layer may include a third material and a fourth material.

In an embodiment, the third material may include a second metal, a halide of the second metal, a complex including the second metal, or a combination thereof, and the fourth material may include a third metal, a halide of the third metal, a complex including the third metal, or a combination thereof.

In an embodiment, the first metal included in the second material, the second metal included in the third material, and the third metal included in the fourth material may each independently be an alkali metal, an alkaline earth metal, a rare earth metal, a third row transition metal of the periodic table, or any combination thereof. The expression "the first metal included in the second material", "the second metal included in the third material," and "the third metal included in the fourth material" may respectively include not only "the first metal", "the second metal," and "the third metal", but also "the halide of the first metal and the first metal of the complex including the first metal", "the halide of the second metal and the second metal of the complex including the second metal," and "the halide of the third metal and the third metal of the complex including the third metal."

In an embodiment, the first metal included in the second material, the second metal included in the third material, and the third metal included in the fourth material may each independently be lithium (Li), sodium (Na), potassium (K), rubidium (Rb), cesium (Cs), beryllium (Be), magnesium (Mg), calcium (Ca), strontium (Sr), barium (Ba), radium (Ra), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or any combination thereof.

In an embodiment, the second material may be the first metal, the third material may be the halide of the second metal, and the fourth material may be the third metal, but embodiments are not limited thereto.

In an embodiment, the halide of the first metal included in the second material, the halide of the second metal included in the third material, and the halide of the first metal included in the second metal may each independently include a fluoride of the first metal to the third metal, a chloride of the first metal to the third metal, a bromide of the first metal to the third metal, an iodide of the first metal to the third metal, or a combination thereof.

In embodiments, the halide of the first metal included in the second material, the halide of the second metal included in the third material, and the halide of the first metal included in the second metal may each independently include LiF, NaF, KF, RbF, CsF, LiCl, NaCl, KCl, RbCl, CsCl, LiBr, NaBr, KBr, RbBr, CsBr, LiI, NaI, KI, RbI, CsI, $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, YbF, $YbF_2$, $YbF_3$, $SmF_3$, YbCl, $YbCl_2$, $YbCl_3SmCl_3$, YbBr, $YbBr_2$, $YbBr_3SmBr_3$, YbI, $YbI_2$, $YbI_3$, $SmI_3$, $ScF_3$, $GdF_3$, $TbF_3$, $YbI_3$, $ScI_3$, $TbI_3$, or any combination thereof.

In an embodiment, the complex including the first metal, the complex including the second metal, and the complex including the third metal may each independently further include n ligands bonded to the first metal, to the second metal, or to the third metal, wherein n may be an integer from 1 to 6, and at least one of the n ligand(s) may be a group represented by Formula 4-1 or Formula 4-2:

4-1

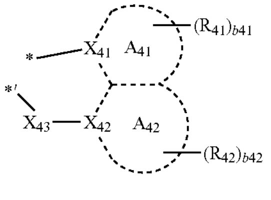

4-2

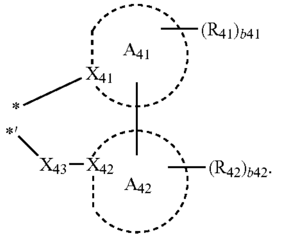

In Formulae 4-1 and 4-2, $X_{41}$ and $X_{42}$ may each independently be C or N, $X_{43}$ may be O or S, $A_{41}$ and $A_{42}$ may each independently be a $C_5$-$C_{60}$ carbocyclic group or a $C_3$-$C_{60}$ heterocyclic group, $R_{41}$ and $R_{42}$ may each be the same as described in connection with $R_{11}$ in Formula 1, b41 and b42 may each independently be an integer from 0 to 20, and

* and *' each indicate a binding site to the first metal.

For example, in Formulae 4-1 and 4-2, ring $CY_{11}$ and ring $CY_{12}$ may each independently be a benzene group, a naphthalene group, a pyridine group, a pyrimidine group, a benzoimidazole group, a benzoxazole group, or a benzothiazole group.

In embodiments, at least one of the n ligands may be a hydroxyquinoline, a hydroxyisoquinoline, a hydroxybenzoquinoline, a hydroxyacridine, a hydroxyphenantridine group, a hydroxyphenyloxazole, a hydroxyphenylthiazole, a hydroxyphenyloxadiazole, a hydroxyphenylthiadiazole group, a hydroxyphenylpyridine, a hydroxyphenylbenzoimidazole, a hydroxyphenylbenzothiazole, a bipyridine, a phenanthroline, or a cyclopentadiene.

In an embodiment, the complex including the first metal, the complex including the second metal, and the complex including the third metal may each independently be one of Compounds M1-1 to M1-4:

M1-1

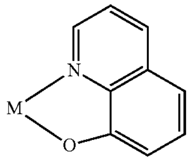

M1-2

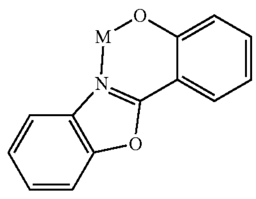

M1-3

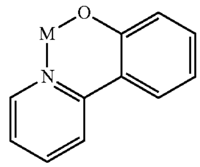

M1-4

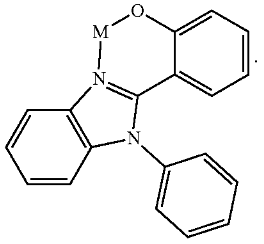

In Compounds M1-1 to M1-4, M may be an alkali metal (for example, Li, Na, K, Rb, and the like).

In an embodiment, the first metal, the second metal, and the third metal may be identical to or different from each other. In embodiments, the first metal, the second metal, and the third metal may be different from each other; the first metal may be different from the second metal, but may be identical to the third metal, but embodiments are not limited thereto.

In an embodiment, an amount of the second material included in the electron transport layer may be, based on a total of 100 parts by weight of the electron transport layer, in a range of about 0 part by weight to about 50 parts by weight, but embodiments are not limited thereto.

In embodiments, an amount of the second material included in the electron transport layer may be, based on a total of 100 parts by weight of the electron transport layer, in a range of about 0 part by weight to about 10 parts by weight, but embodiments are not limited thereto.

In an embodiment, an amount of the third material may be in a range of about 50 parts by weight to about 99 parts by weight, based on a total of 100 parts by weight of the electron injection layer.

In embodiments, an amount of the third material may be, based on a total of 100 parts by weight of the electron injection layer, in a range of about 80 parts by weight to about 99 parts by weight.

In the light-emitting device according to embodiments, the electron transport layer may include the first material and the second material, and the electron injection layer may include the third material and the fourth material, thereby having excellent electron transport and injection properties. When the electron transport layer includes the first material and the second material, due to the metal-binding characteristics of the first material, a phenomenon of degrading stability of the light-emitting device caused by migration of the second material into another layer may be prevented. For example, an unshared electron pair of N in Formula 1 in the case where the first material is represented by Formula 1 or an unshared electron pair of $Y_{21}$ (for example, when $Y_{21}$ is O) in Formula 2 in the case where the first material is represented by Formula 2 may be bonded to the first metal of the second material (for example, the first metal, the halide of the first metal, or the complex including the first metal).

When the electron injection layer includes the third material and the fourth material, an amount of the third material may be, based on total 100 parts by weight of the electron injection layer, in a range of about 50 parts by weight to about 99 parts by weight. In this regard, the metal binding between the second metal of the third material (i.e., the second metal, the halide of the second metal, or the second metal of the complex including the second metal) and a metal component of the second electrode (for example, Ag) may prevent island formation due to the agglutinability of the metal component of the second electrode, thereby improving the stability of the light-emitting device. When the electron injection layer includes the third material and the fourth material, the optical efficiency of the light-emitting device may be improved by improving the film transparency compared to an electron injection consisting of the fourth material only (for example, a light-emitting device of Comparative Example 1).

Thus, the light-emitting device, for example, an organic light-emitting device, may have low driving voltage, high luminescence efficiency, and a long lifespan.

In an embodiment, the first electrode of the light-emitting device may be an anode, the second electrode of the light-emitting device may be a cathode, the interlayer may further include a hole transport region between the emission layer and the first electrode, the hole transport region may include a hole injection layer, a hole transport layer, an emission auxiliary layer, an electron blocking layer, or any combination thereof, and the electron transport region may include a buffer layer, a hole blocking layer, an electron control layer, or any combination thereof.

In embodiments, the light-emitting device may further include a first capping layer disposed outside the first electrode of the light-emitting device, a second capping layer disposed outside the second electrode of the light-emitting device, or the first capping layer and the second capping layer.

For example, the second capping layer may include an amine group-containing compound. The first capping layer and/or the second capping layer may be the same as described herein.

In an embodiment, in the light-emitting device, the emission layer and the electron transport layer may directly contact each other.

In an embodiment, in the light-emitting device, the electron transport layer and the electron injection layer may directly contact each other.

In an embodiment, in the light-emitting device, the electron injection layer and the second electrode may directly contact each other.

In an embodiment, the second electrode of the light-emitting device may include Ag.

In an embodiment, an amount of Ag in the second electrode of the light-emitting device may be equal to or greater than about 95 parts by weight, based on 100 parts by weight of the total amount of the second electrode.

In an embodiment, the emission layer of the light-emitting device may include a dopant.

In an embodiment, the dopant may serve as a phosphorescent dopant to emit phosphorescence from the emission layer.

For example, in an embodiment, the dopant may emit blue light having a maximum emission wavelength in a range of about 450 nm to about 490 nm.

For example, in an embodiment, the dopant may include a boron-containing compound, a pyrene-based compound, or an anthracene-based compound.

In an embodiment, the electron transport layer of the light-emitting device may be formed by co-depositing the first material and the second material.

In an embodiment, the electron injection layer of the light-emitting device may be formed by co-depositing the third material and the fourth material.

In an embodiment, the first electrode of the light-emitting device may be patterned for each of a first subpixel, a second subpixel, and a third subpixel, and the emission layer may include a first emission layer formed on the first subpixel and emitting first-color light, a second emission layer formed on the second subpixel and emitting second-color light, and a third emission layer formed on the third subpixel and emitting third-color light.

According to another embodiment, a light-emitting device may include:

a first electrode;

a second electrode facing the first electrode;

m emitting units arranged between the first electrode and the second electrode; and m−1 charge generation layers arranged between two neighboring emitting units among the m emitting units and including an n-type charge generation layer and a p-type charge generation layer, wherein m may be an integer of 2 or more, each of the m emission layers may include an emission layer, at least one of the m emitting units may further include an electron transport region, the electron transport region may include an electron transport layer and an electron injection layer that are sequentially arranged, the electron transport layer may include the first material and the second material, the electron injection layer may include the third material and the fourth material, and an amount of the third material may be in a range of about 50 parts by weight to about 99 parts by weight, based on a total of 100 parts by weight of the electron injection layer.

A number, m, of the emitting units, may vary according to the purpose, and the upper limit of the number is not particularly limited. In an embodiment, the light-emitting device may include 2, 3, 4, 5, or 6 emitting units. The emitting unit as described herein is not particularly limited as long as the emitting unit has a function capable of emitting light. For example, the emitting unit may include one or more emission layers. When necessary, the emitting unit may further include an organic layer other than the emission layer.

The emission layers included in the m emitting units may each independently emit red light, green light, blue light, and/or white light. For example, among the m emitting units, the emission layers included in a emitting units may emit blue light, the emission layers included in b emitting units may emit red light, the emission layers included in c emitting units may emit green light, and the emission layers included in d emitting units may emit white light, wherein a, b, c, and d may each independently be an integer equal to or greater than 0, and the sum of a, b, c, and d is m. For example, the emission layers included in the a emitting units among the m emitting units may each independently emit blue light, wherein the blue light may each independently have a maximum emission wavelength in a range of about 400 nm to about 490 nm based on a wavelength of a front peak. For example, at least one of the emission layers included in the a emitting units may emit blue light, wherein the blue light may have a maximum emission wavelength in a range of about 450 nm to about 490 nm.

In an embodiment, a maximum emission wavelength of light emitted from at least one of the m emitting units may be different from a maximum emission wavelength of light emitted from at least one of the remaining emitting units. In an embodiment, in a light-emitting device in which a first emitting unit and a second emitting unit are stacked, a maximum emission wavelength of light emitted from the first emitting unit may be different from a maximum emission wavelength of light emitted from the second emitting unit. For example, an emission layer of the first emitting unit and an emission layer of the second emitting unit may each independently have a structure consisting of a layer consisting of a single material, a structure consisting of a layer consisting of different materials, or a structure having multiple layers consisting of different materials. Accordingly, light emitted from the first emitting unit or the second emitting unit may be single-color light or mixed-color light. In embodiments, in a light-emitting device in which a first emitting unit, a second emitting unit, and a third emitting unit are stacked, a maximum emission wavelength of light emitted from the first emitting unit may be the same as a maximum emission wavelength of light emitted from the second emitting unit, but may be different from a maximum emission wavelength of light emitted from the third emitting unit. In embodiments, the maximum emission wavelength of light emitted from the first emitting unit, the maximum emission wavelength of light emitted from the second light-emitting unit, and the maximum emission wavelength of light emitted from the third light-emitting unit may be different from one another.

In embodiments, when m is 4, a light-emitting device may include a first emitting unit, a second emitting unit, a third emitting unit, and a fourth emitting unit that are stacked in this stated order, wherein the first emitting unit to the third emitting unit may each emit blue fluorescence, and the fourth emitting unit may emit green phosphorescence. In embodiments, at least one of the m emitting units may include a first emission layer and a second emission layer.

In an embodiment, the m emission layers included in the m emitting units may each independently include a phosphorescent dopant, a fluorescent dopant, a delayed fluorescence material, or any combination thereof.

In embodiments, the m emission layers may each include a phosphorescent dopant, a fluorescent dopant, or a delayed fluorescence material.

In embodiments, at least one of the m emission layers may include a phosphorescent dopant and the remaining emission layers may each independently include a fluorescent dopant. In embodiments, at least one of the m emission layers may include a phosphorescent dopant and the remaining emission layers may each independently include a delayed fluorescence material. In embodiments, at least one of the m emission layers may include a fluorescent dopant and the remaining emission layers may each independently include a delayed fluorescence material.

In embodiments, at least one of the m emission layers may include a phosphorescent dopant, at least one of the remaining emission layers may include a fluorescent dopant, and the remaining emission layers may each independently include a delayed fluorescence material.

In an embodiment, based on the sum of a fluorescence component and a delayed fluorescence component among the total luminescent components extracted during transient electroluminescence (EL) measurement of the light emitting device, a component ratio of the delayed fluorescence component may be equal to or greater than about 30%.

A device for measuring the delayed fluorescence component may be collectively referred to as transient EL (hereinafter, referred to as Tr. EL). The Tr. EL may consist of: an oscilloscope that converts optical signals to electrical signals or vice versa; a pulse generator for applying a square-wave pulse; a power supply that convers AC voltage to DC voltage; a chamber that acts as a dark room; and a photomultiplier tube that detects emitted light.

When using the Tr. EL, a frequency and a pulse width are fixed for the device to measure under the same conditions, and a negative voltage is applied to exclude a trap charge existing inside the device, so as to analyze pure delayed fluorescence components. The analyzed signals are collected by a PC, and a damping behavior phenomenon is modeled for application. When fitting the measured delayed fluorescence components to 1/sqrt, a phenomenon of linear decay may be observed, and the delayed fluorescence ratio may be extracted by extracting the corresponding intercept. In the case of an organic light-emitting device, when the pulse being applied is turned off, the residual trap charge remains in the device, and light is emitted again by recombination. In this regard, the trap charge is excluded from the EL signal, and the section except this excluded section is fitted to 1/sqrt to secure the time of linear decay time for clear fitting.

The charge generation layer may be included between two neighboring emitting units among the m emitting units. Here, the term "neighboring" refers to the location relationship of the closest layers or units among the layers or units described as being "neighboring." In an embodiment, the term "two neighboring emitting units" refers to the location relationship of two emitting units arranged closest to each other among multiple emitting units. The "neighboring" may refer to a case where two layers or units are physically in contact with each other, and a case where another layer or unit, not mentioned, may be arranged between the two layers or units. For example, the "emitting unit neighboring to the second electrode" refers to the emitting unit arranged closest to the second electrode. The second electrode and the neighboring emitting unit thereto may be in physical contact with each other. In an embodiment, however, other layers or units other than the emitting unit may be arranged between the second electrode and the neighboring emitting unit thereto. In an embodiment, an electron transport layer may be arranged between the second electrode and the neighboring emitting unit thereto. However, the charge generation layer may be arranged between two neighboring emitting units.

The "charge generation layer" may generate electrons with respect to one emitting unit of two neighboring emitting units and thus serves as a cathode, and may generate holes with respect to the other emitting unit and thus serves as an anode. The charge generation layer is not directly connected to an electrode, and may separate neighboring emitting units. A light-emitting device including m emitting units may include m−1 charge generation layers.

Each of the m−1 charge generation layers may include an n-type charge generation layer and a p-type charge generation layer. The n-type charge generation layer and the p-type charge generation layer may directly contact each other to form an NP junction. By the NP junction, electrons and holes may be simultaneously generated between the n-type charge generation layer and the p-type charge generation layer. The generated electrons may be transferred to one of the two neighboring emitting units through the n-type charge generation layer. The generated holes may be transferred to the other one of the two neighboring emitting units through the p-type charge generation layer. Since each of the m−1 charge generation layers may include one n-type charge generation layer and one p-type charge generation layer, the light-emitting device including the m−1 charge generation layers may include m−1 n-type charge generation layers and m−1 p-type charge generation layers.

The n-type refers to n-type semiconductor characteristics, for example, the characteristics of injecting or transporting electrons. The p-type refers to p-type semiconductor characteristics, for example, the characteristics of injecting or transporting holes.

At least one of the m emitting units may further include an electron transport region. For example, among the m emitting units, the a emitting units may each further include an electron transport region, and the b emitting units may each not include an electron transport region, wherein a may be an integer equal to or greater than 1, and b may be an integer equal to or greater than 0, and the sum of a and b may be m.

At least one of the electron transport regions included in the a emitting units may include an electron transport layer and an electron injection layer that are sequentially arranged. For example, the electron transport region included in 1 emitting unit among the a emitting units may include an electron transport layer and an electron injection layer, and the electron transport region included in the a−1 emitting units may include an electron transport layer or an electron injection layer or may not include an electron transport layer and an electron injection layer. For example, the electron transport regions included in the a emitting units may each include an electron transport layer and an electron injection layer.

The electron transport region may include a buffer layer, a hole blocking layer, an electron control layer, or any combination thereof. For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituent layers of each structure may be stacked from the emission layer in its respective stated order, but the structure of the electron transport region is not limited thereto. The descriptions of the electron transport region are the same as provided herein.

At least one of the electron transport regions may include the electron transport layer including the first material and the second material as described herein. When two or more electron transport regions each include the electron transport layer, the first materials included in the two or more electron transport layers may be identical to or different from each other. In this regard, the second materials included in the two or more electron transport layers may be identical to or different from each other.

At least one of the electron transport regions may include the electron injection layer including the third material and the fourth material as described herein. When two or more electron transport regions each include the electron injection layer, the third materials included in the two or more electron injection layers may be identical to or different from each other. In this regard, the fourth materials included in the two or more electron injection layers may be identical to or different from each other. The descriptions of the first material to the fourth material are the same as provided herein.

In an embodiment, at least one of the m emitting units may further include a hole transport region. When each of the m emitting units includes a hole transport region, an emission layer, and an electron transport region together, the hole transport region, the emission layer, and the electron transport region may be arranged in this stated order. The descriptions of the hole transport region are the same as provided herein.

According to another embodiment, a light-emitting device may include:

first electrodes arranged for each of a first subpixel, a second subpixel, and a third subpixel;

a second electrode facing the first electrodes;

m emitting units between the second electrode and one of the first electrodes; and m−1 charge generation layers, each arranged between two neighboring emitting units of the m emitting units and including an n-type charge generation layer and a p-type charge generation layer, wherein m may be an integer of 2 or more, each of the m emitting units may include an emission layer and an electron transport region that are sequentially arranged, at least one of the m emission layers may include a first emission layer arranged on the first subpixel and emitting first-color light, a second emission layer arranged on the second subpixel and emitting second-color light, and a third emission layer arranged on the third subpixel and emitting third-color light, the first-color light may be red light, the second-color light may be green light, and the third-color light may be blue light, at least one of the m electron transport regions may include an electron transport layer and an electron injection layer that are sequentially arranged, the electron transport layer may include the first material and the second material, the electron injection layer may include the third material and the fourth material, and an amount of the third material may be in a range of about 50 parts by weight to about 99 parts by weight, based on a total of 100 parts by weight of the electron injection layer. The descriptions of the m emitting units, the m−1 charge generation layers, the emission layer, the electron transport region, the electron transport layer, and the electron injection layer are the same as provided herein.

In an embodiment, each of the m emission layers may include the first emission layer to the third emission layer. In embodiments, each of the m electron transport regions may include the electron transport layer including the first material and the second material and the electron injection layer including the third material and the fourth material.

At least one of the m emitting units may include the emission layer including the first emission layer to the third emission layer, and the electron transport region arranged thereon may be in the form of a common layer with respect to the first emission layer to the third emission layer.

In an embodiment, at least one of the m emitting units may further include a hole transport region, and the hole transport region may be arranged in the form of a common layer between the emission layer including the first emission layer to the third emission layer and one of the first electrodes.

In an embodiment, the first electrode of the light-emitting device may be an anode, and the second electrode of the light-emitting device may be a cathode.

In embodiments, the light-emitting device may include a capping layer arranged outside the first electrode or outside the second electrode. The descriptions of the capping layer are the same as provided herein.

The term "interlayer" as used herein refers to a single layer and/or all layers arranged between the first electrode and the second electrode of the light-emitting device.

According to another embodiment, an electronic apparatus may include the light-emitting device. The electronic apparatus may further include a thin-film transistor. In an embodiment, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details for the electronic apparatus are the same as described herein.

Methods of synthesizing the first material to the fourth material may be readily understood to those of ordinary skill in the art by referring to Synthesis Examples and/or Examples described herein.

[Description of FIG. 1]

FIG. 1 is a schematic cross-sectional view of a light-emitting device 10 according to an embodiment. The light-emitting device 10 includes a first electrode 110, an interlayer 150, an emission layer 151, an electron transport region 160, an electron transport layer 161, an electron injection layer 162, and a second electrode 190.

Hereinafter, the structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or above the second electrode 190. In an embodiment, the substrate may be a glass substrate or a plastic substrate. In embodiments, the substrate may be a flexible substrate, and for example, may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layered structure of ITO/Ag/ITO.

[Interlayer 150]

The interlayer 150 is arranged on the first electrode 110. The interlayer 150 may include an emission layer 151.

The interlayer 150 may further include a hole transport region arranged between the first electrode 110 and the emission layer 151 and an electron transport region 160 arranged between the emission layer 151 and the second electrode 190.

The interlayer 150 may further include, in addition to various organic materials, a metal-containing compound such as an organometallic compound, an inorganic material such as a quantum dot, and the like.

In an embodiment, the interlayer 150 may include two or more emitting units sequentially stacked between the first electrode 110 and the second electrode 190, and at least one charge generation layer arranged between the two or more emitting units. When the interlayer 150 includes the two or more emitting units and the at least one charge generation layer as described above, the light-emitting device 10 may be a tandem light-emitting device.

[Hole Transport Region in Interlayer 150]

The hole transport region may have a structure consisting of a layer consisting of a single material, a structure consisting of a layer consisting of different materials, or a structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the constituent layers of each structure are stacked from the first electrode 110 in its respective stated order, but the structure of the hole transport region is not limited thereto.

The hole transport region may include a compound represented by Formula 201, a compound represented by Formula 202, or any combination thereof:

[Formula 201]

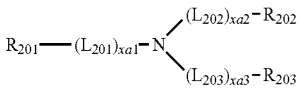

[Formula 202]

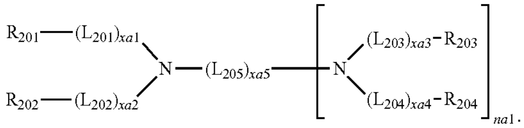

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

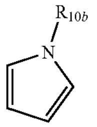

CY202

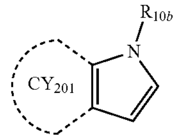

CY203

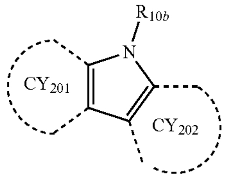

CY204

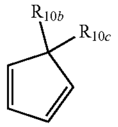

CY205

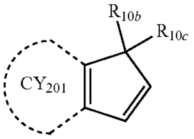

CY206

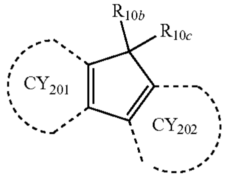

CY207

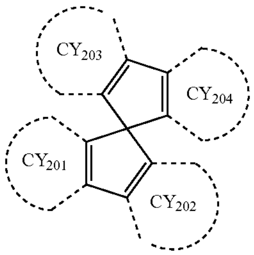

CY208

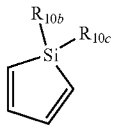

CY209

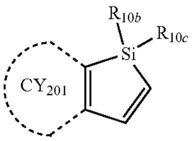

-continued

CY210

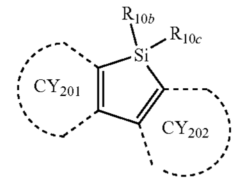

CY211

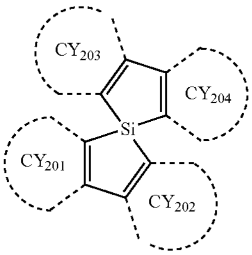

CY212

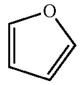

CY213

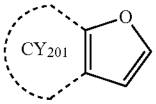

CY214

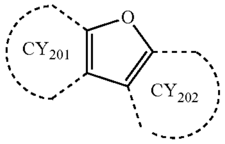

CY215

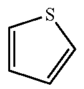

CY216

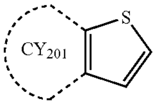

-continued

CY217

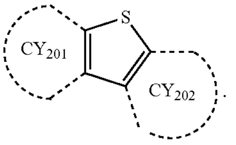

In Formulae CY201 to CY217, $R_{10b}$ and $R_{10c}$ may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring CY201 to ring CY204 in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include groups represented by Formulae CY201 to CY203.

In embodiments, each of Formulae 201 and 202 may not include groups represented by Formulae CY201 to CY203, and may include at least one of groups represented by Formulae CY204 to CY217.

In embodiments, each of Formulae 201 and 202 may not include groups represented by Formulae CY201 to CY217.

For example, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
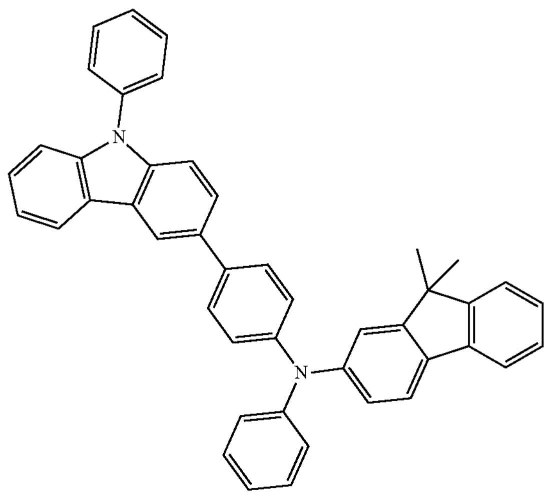
HT2
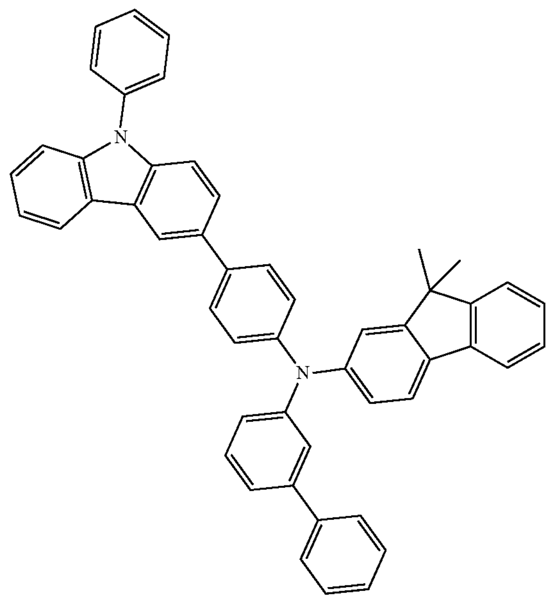
HT3
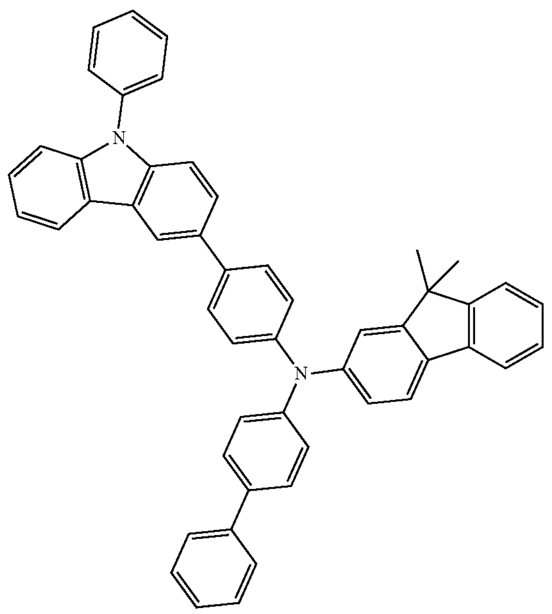
HT4
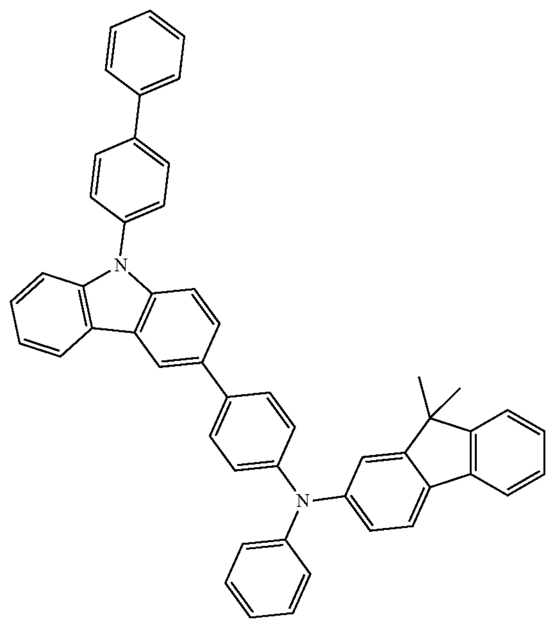

-continued
HT5
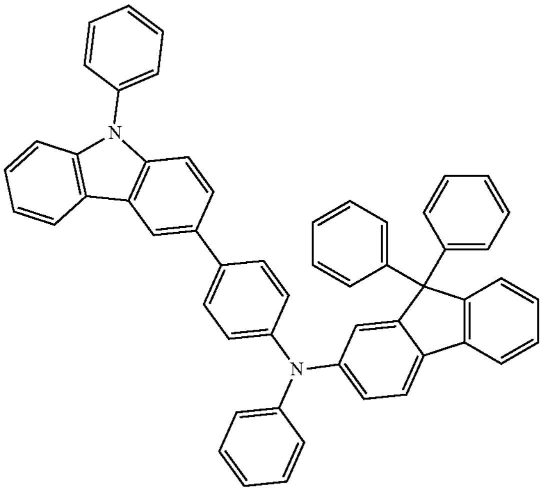
HT6
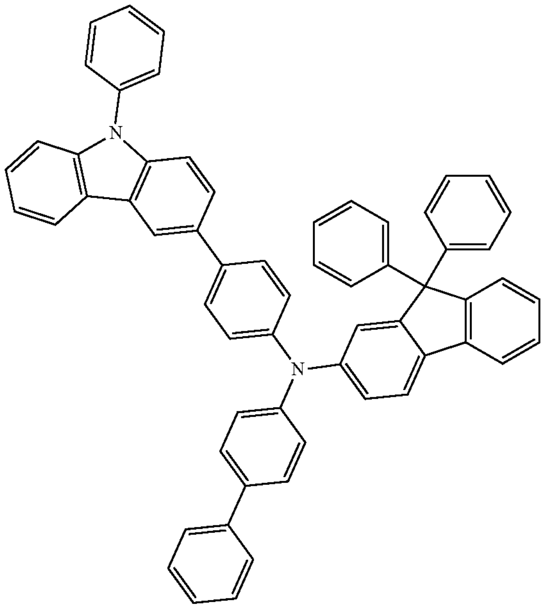
HT7
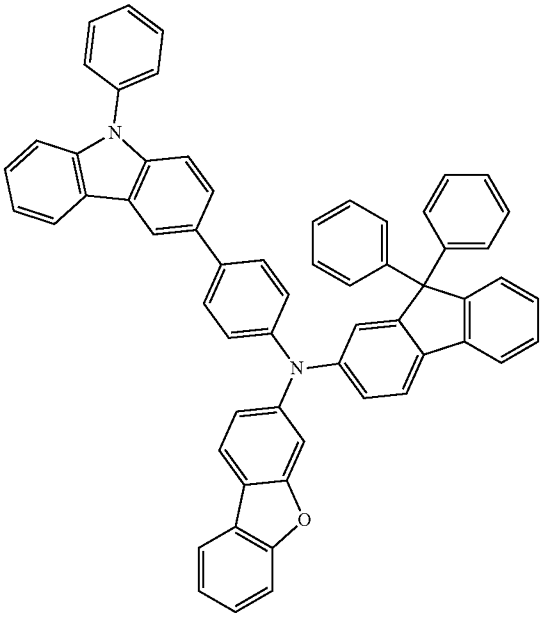
HT8
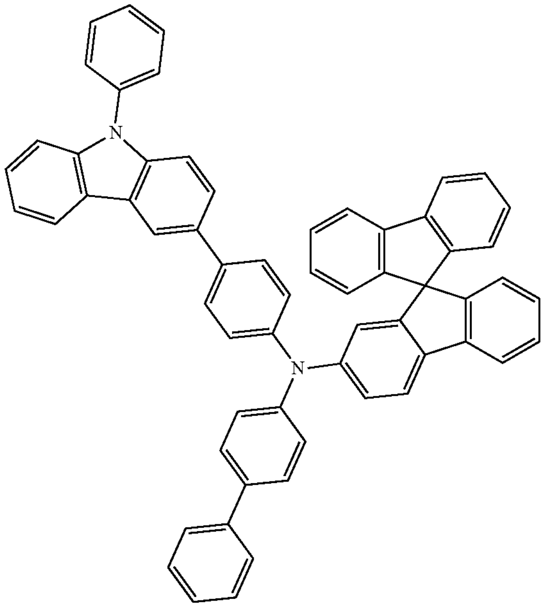

-continued
HT9
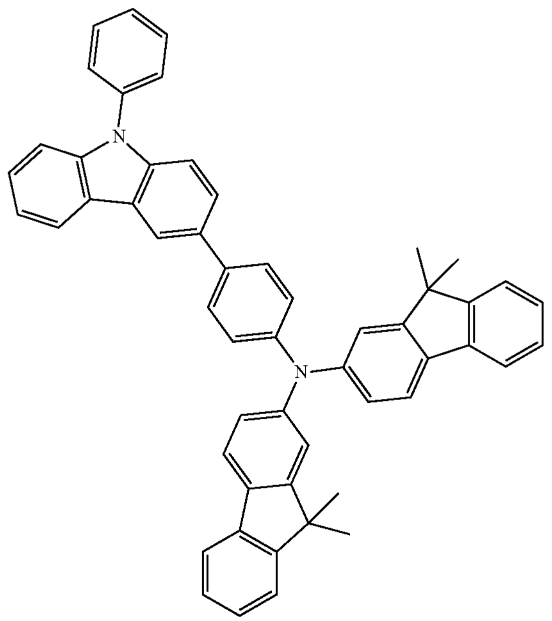
HT10
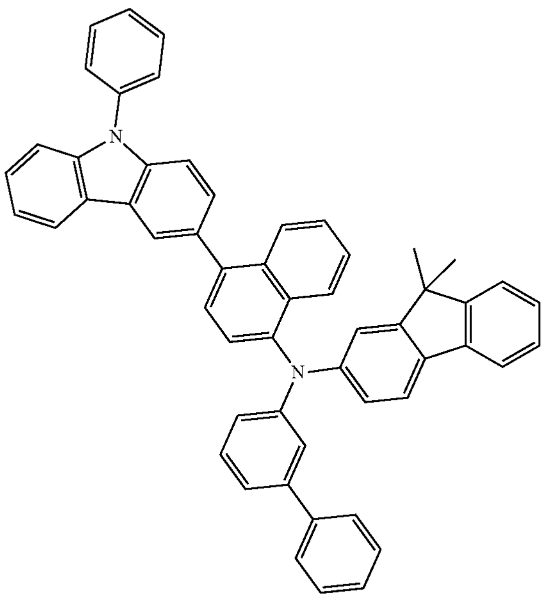
HT11
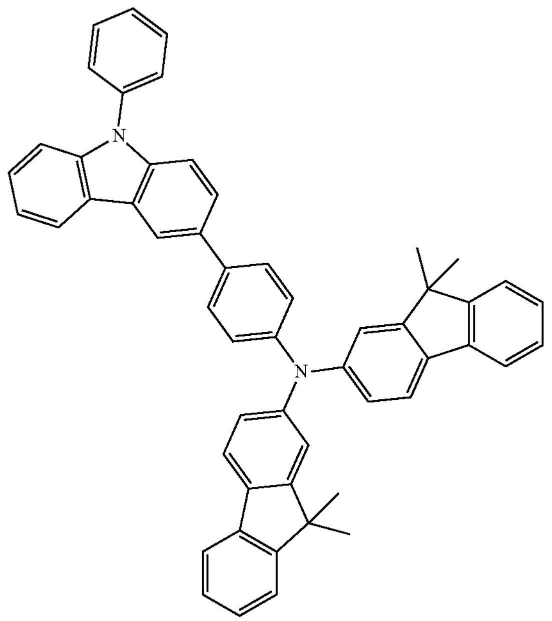
HT12
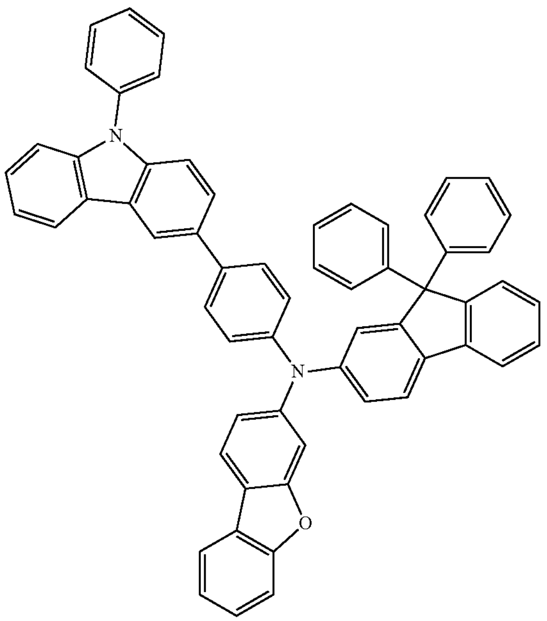

-continued
HT13
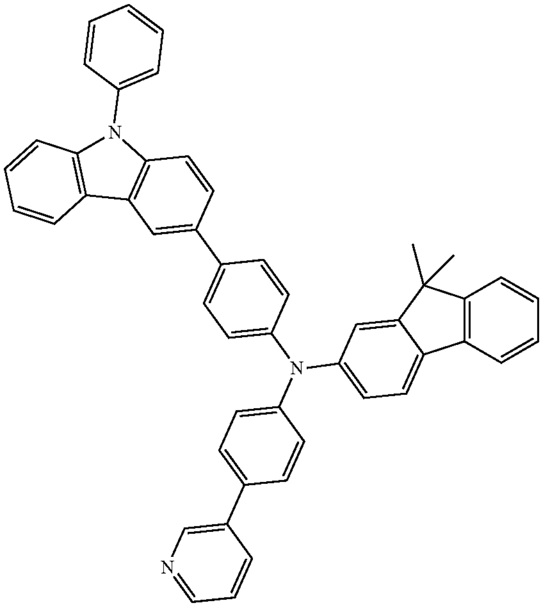
HT14
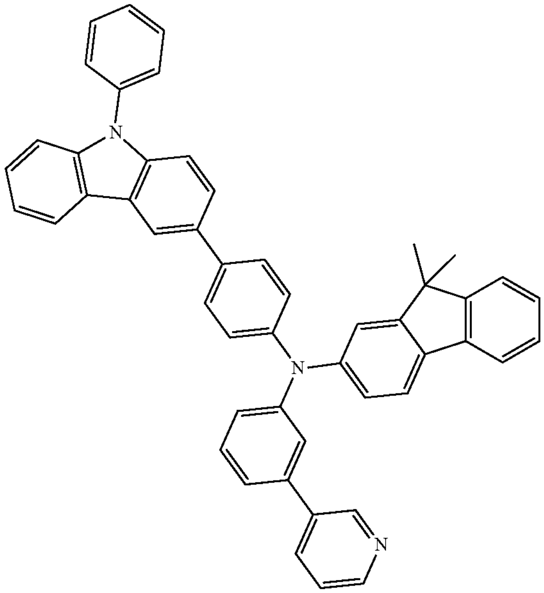
HT15
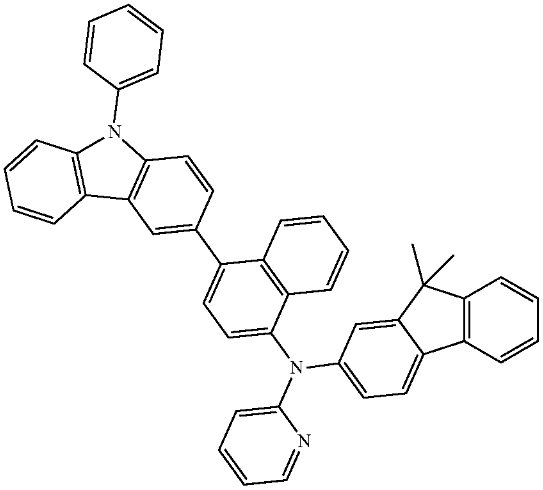
HT16
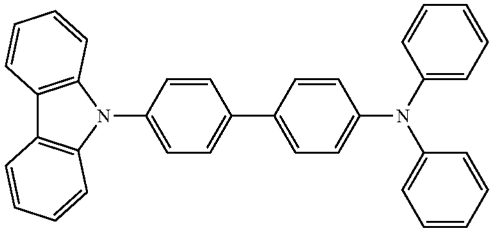
HT17
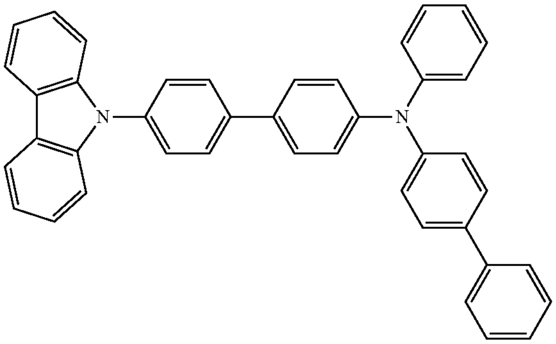
HT18
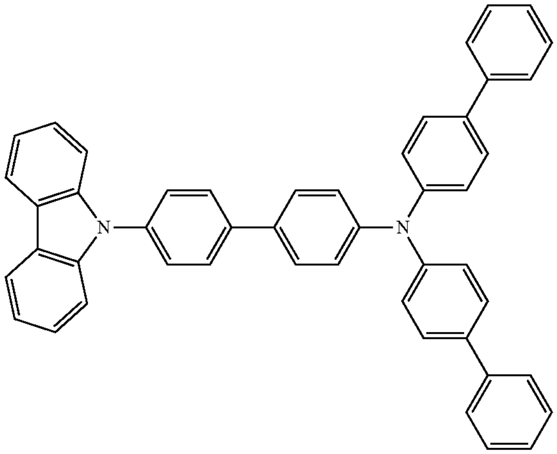

-continued
HT19
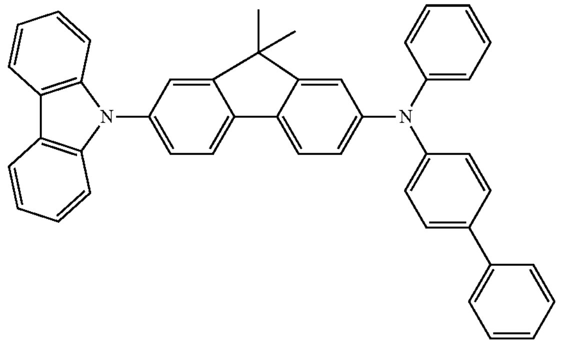
HT20
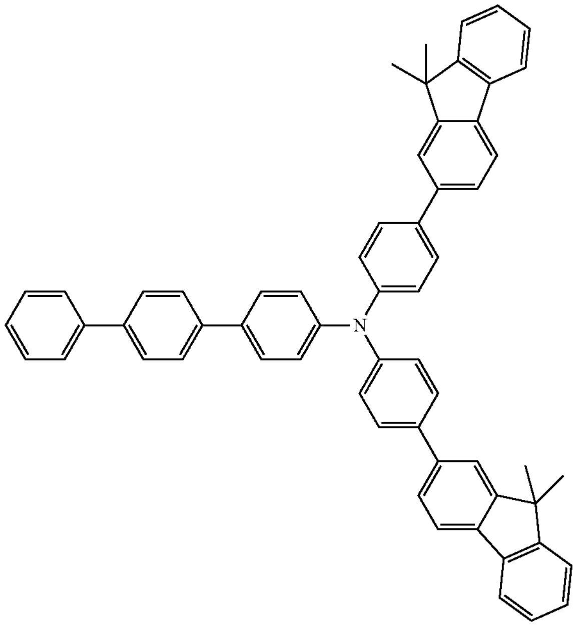
HT21
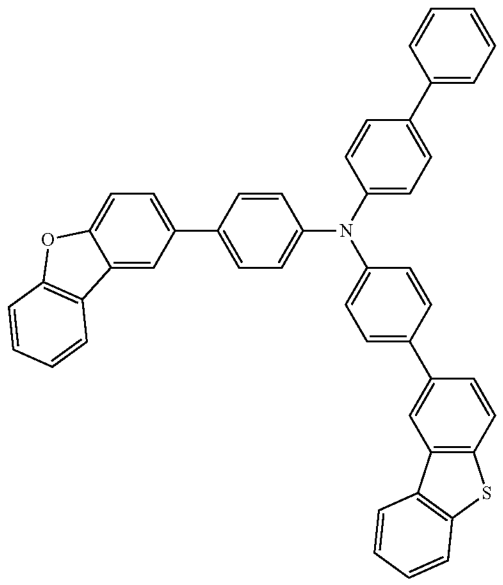
HT22
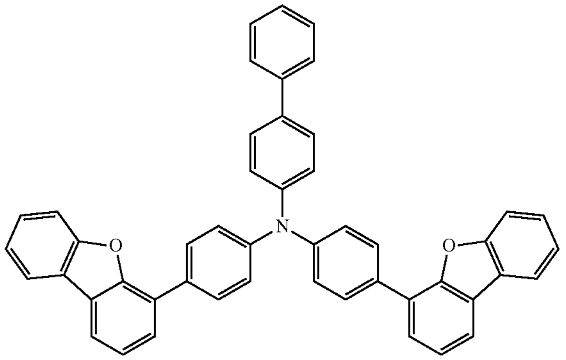

-continued
HT23
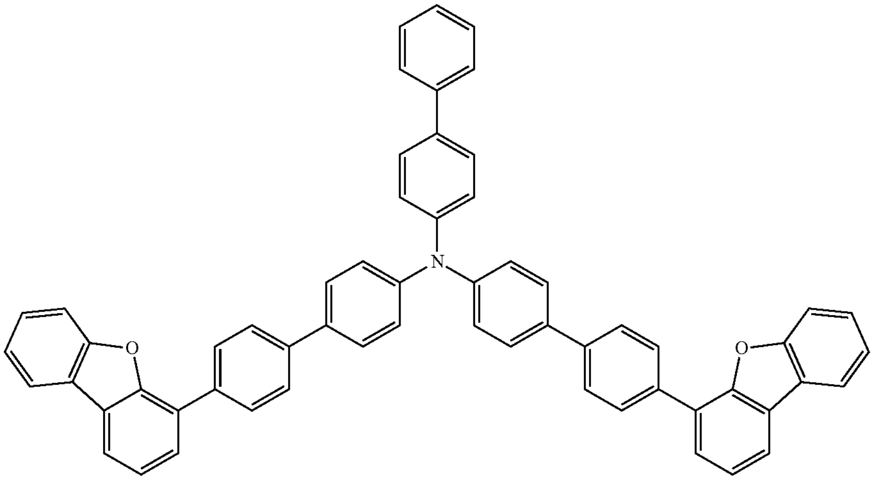
HT24
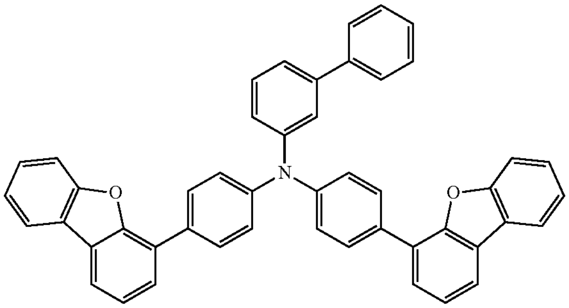
HT25
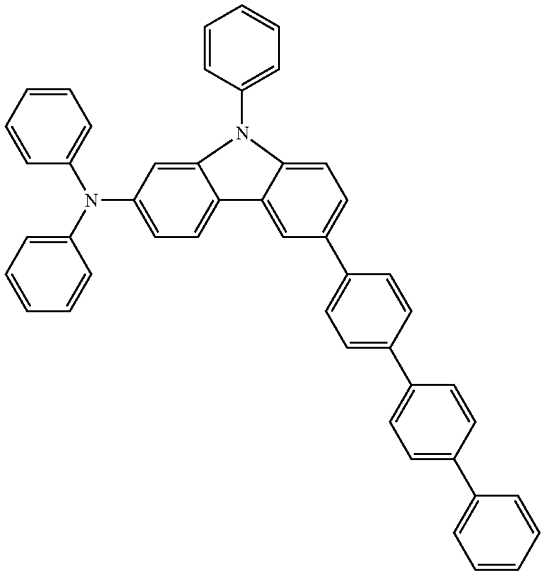
HT26
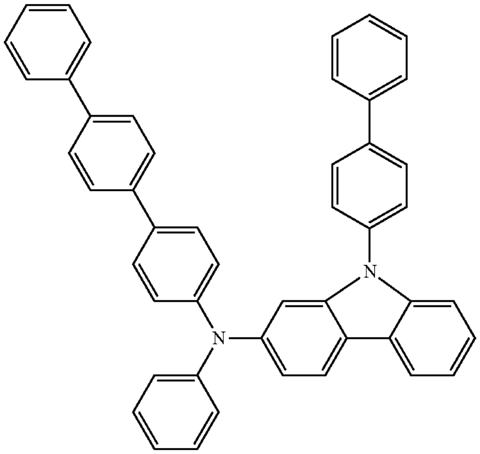
HT27
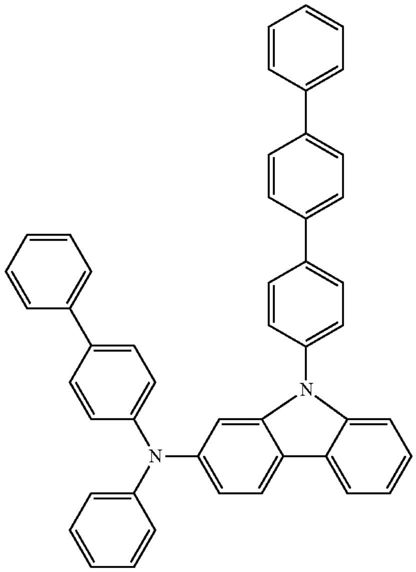

-continued
HT28
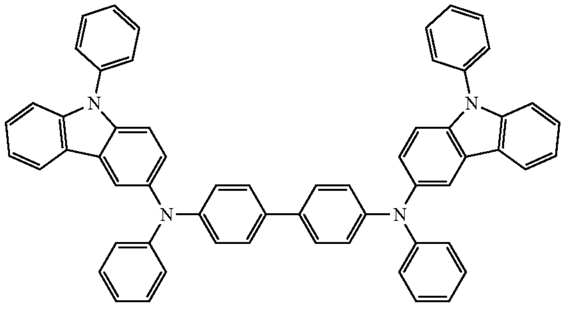
HT29
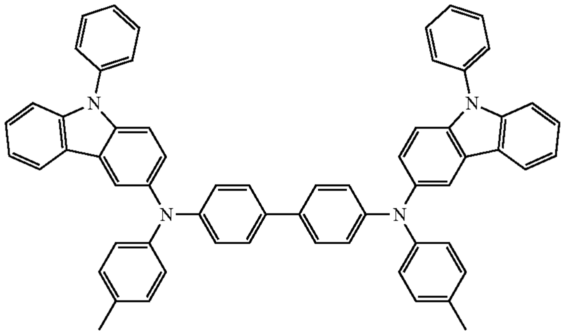
HT30
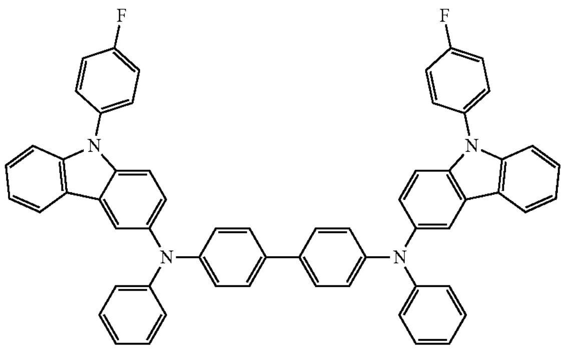
HT31
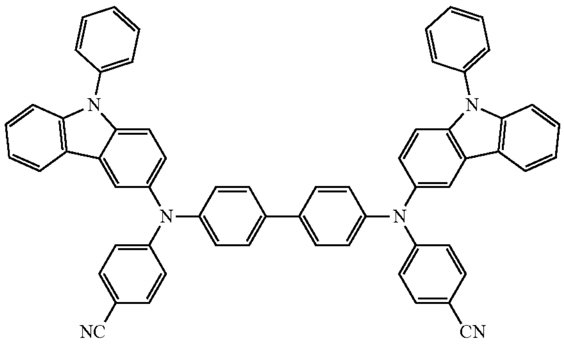
HT32
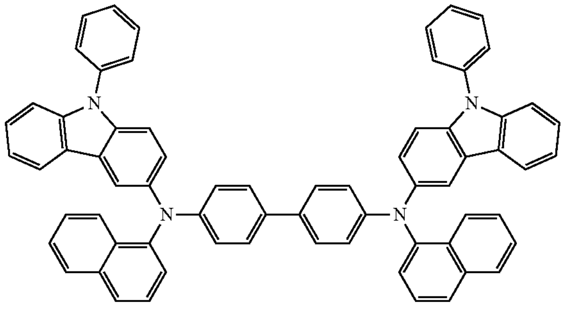
HT33
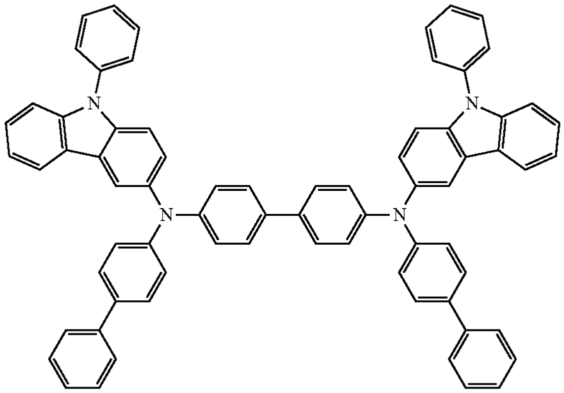

-continued
HT34
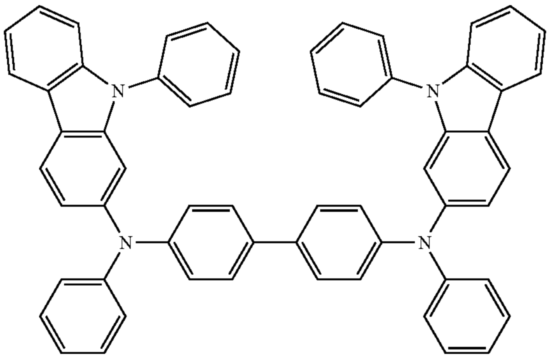
HT35
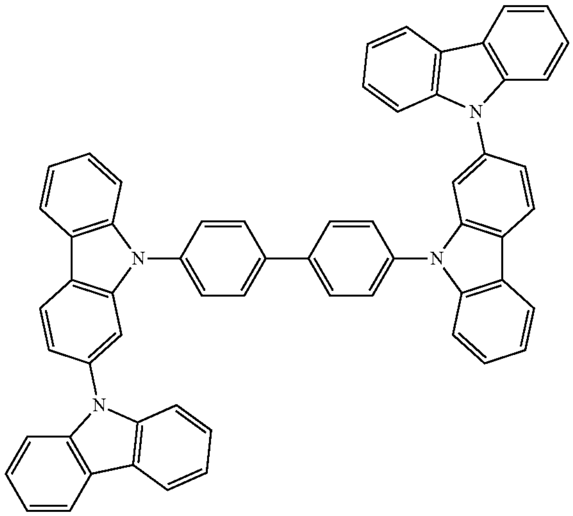
HT36
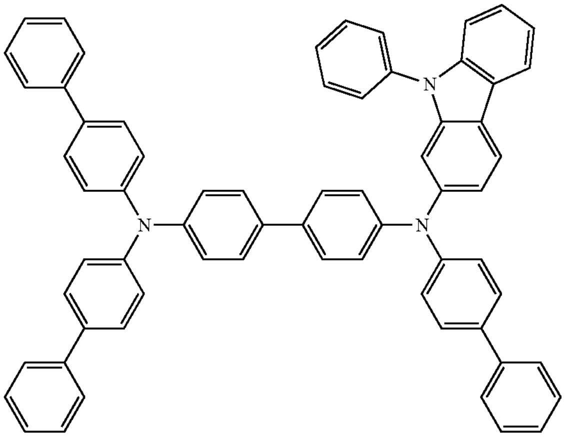
HT37
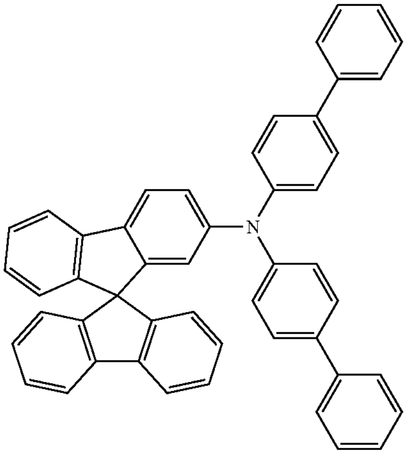
HT38
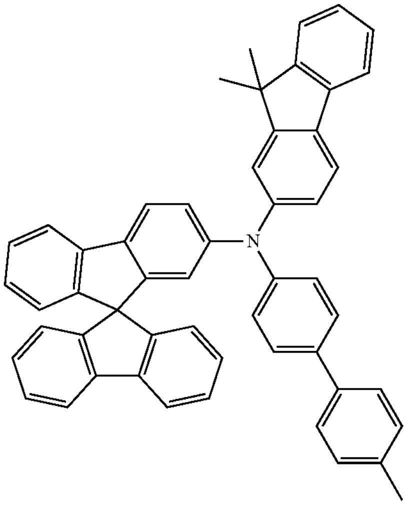
HT39
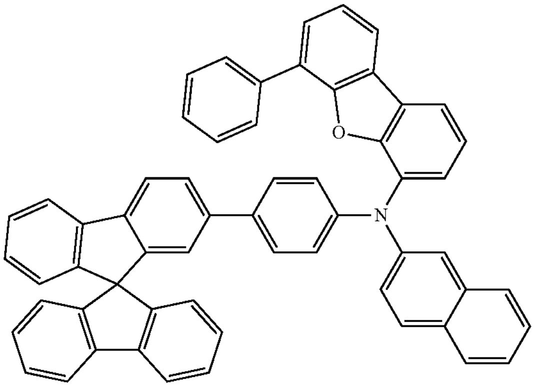

-continued
HT40
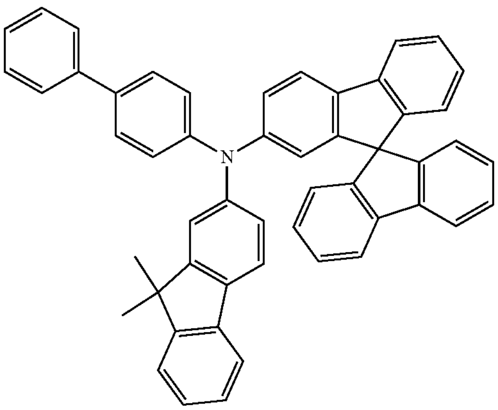
HT41
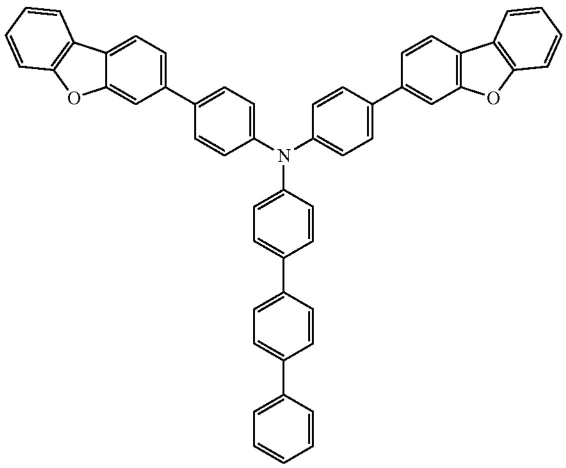
HT42
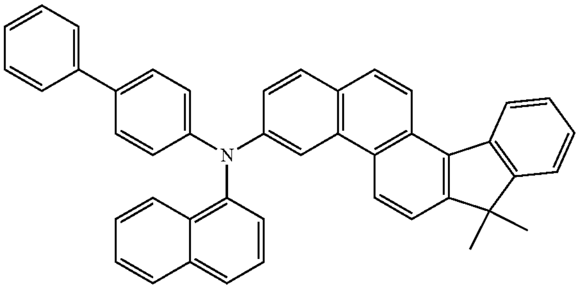
HT43
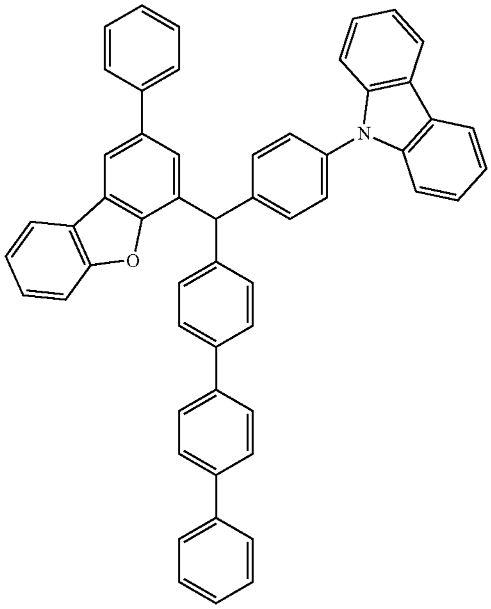
HT44
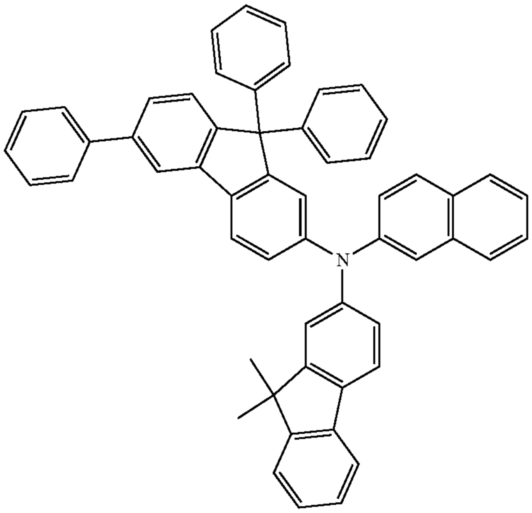
HT45
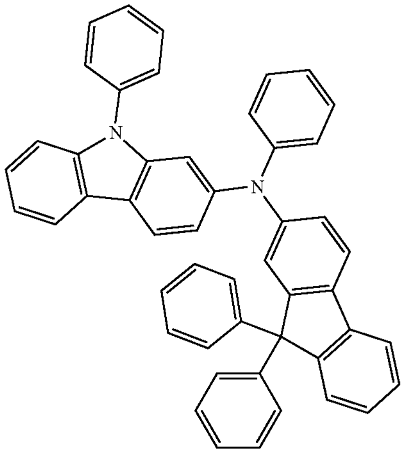

-continued
HT46
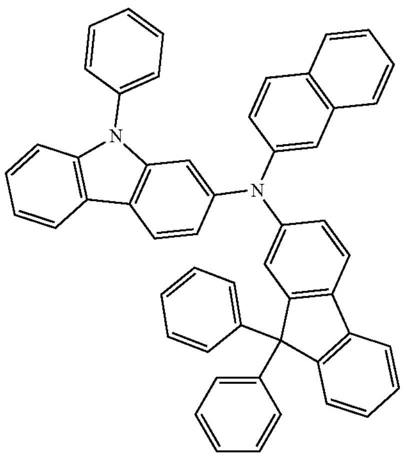
m-MTDATA
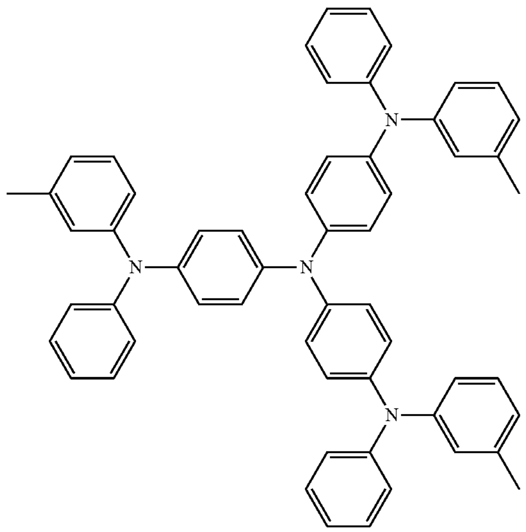
TDATA
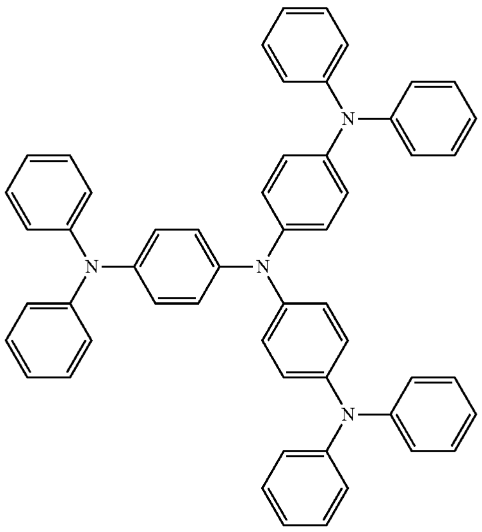
2-TNATA
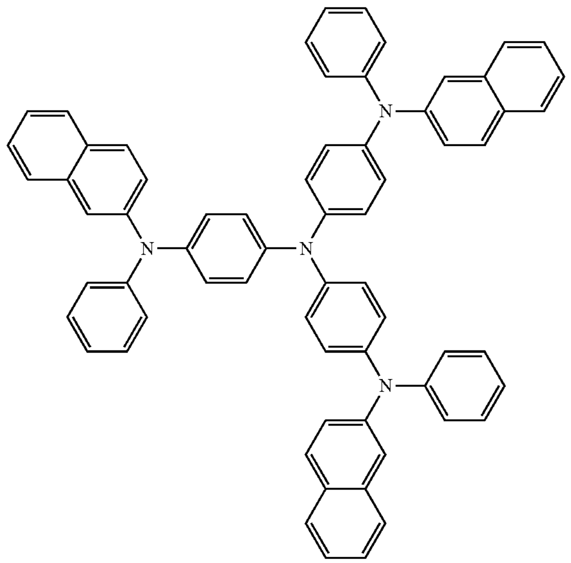
NPB
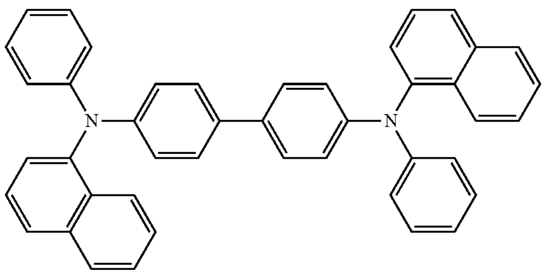
β-NPB
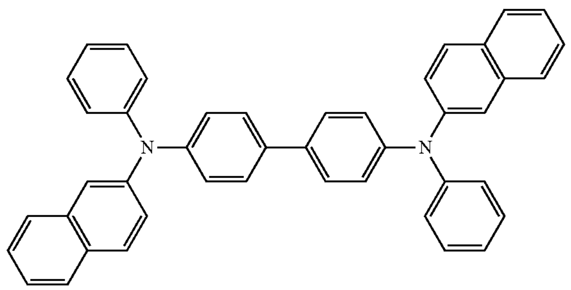

-continued

TPD

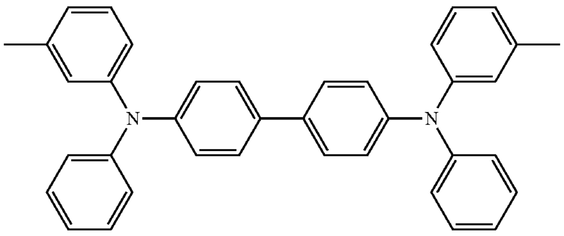

Spiro-TPD

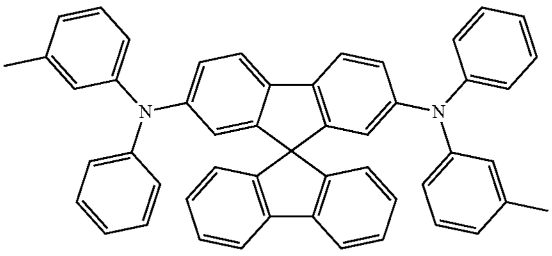

Spiro-NPB

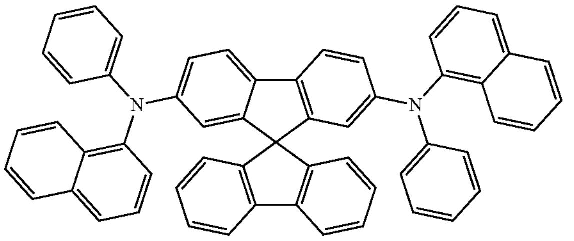

methylated-NPB

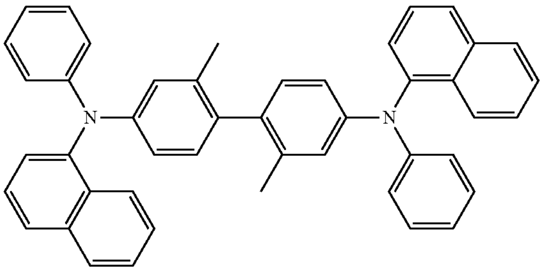

TAPC

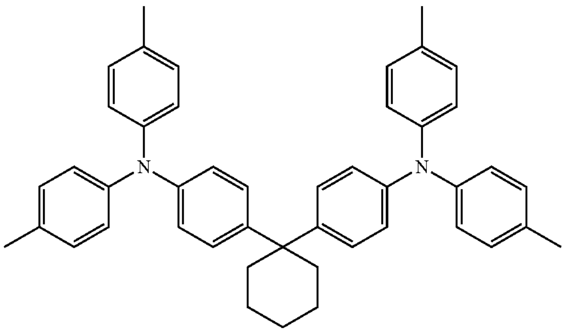

HMTPD

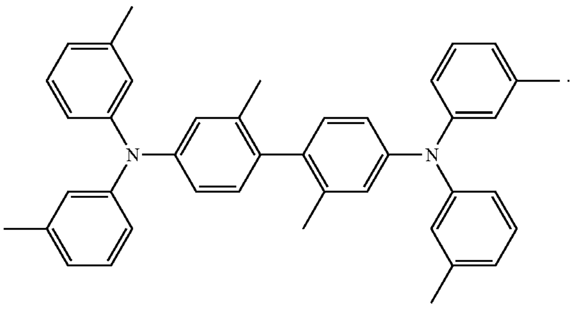

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by the emission layer, and the electron blocking layer may block the leakage of electrons from the emission layer to the hole transport region. Materials that may be included in the hole transport region may be included in the emission auxiliary layer and the electron-blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, a lowest unoccupied molecular orbital (LUMO) energy level of the p-dopant may be equal to or less than about-3.5 eV.

In an embodiment, the p-dopant may include a quinone derivative, a cyano group-containing compound, a compound including element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

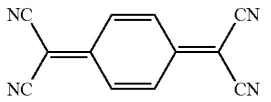

TCNQ

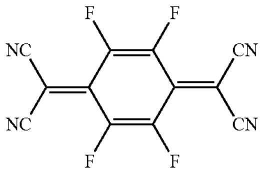

F4-TCNQ

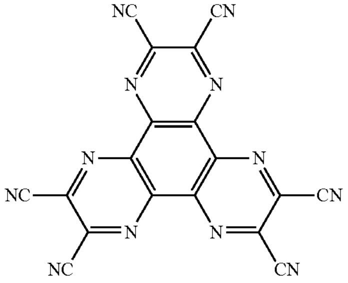

HAT-CN

[Formula 221]

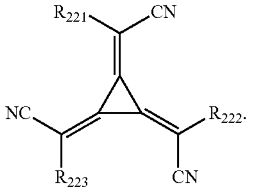

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include an alkali metal (for example, lithium (Li), sodium (Na), potassium (K), rubidium (Rb), cesium (Cs), and the like); an alkaline earth metal (for example, beryllium (Be), magnesium (Mg), calcium (Ca), strontium (Sr), barium (Ba), and the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and the like); a post-transition metal (for example, zinc (Zn), indium (In), tin (Sn), and the like); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and the like); and the like.

Examples of the metalloid may include silicon (Si), antimony (Sb), tellurium (Te), and the like.

Examples of the non-metal may include oxygen (O), a halogen (for example, F, Cl, Br, I, and the like), and the like.

Examples of the compound including element EL1 and element EL2 may include a metal oxide, a metal halide (for example, a metal fluoride, a metal chloride, a metal bromide, a metal iodide, and the like), a metalloid halide (for example, a metalloid fluoride, a metalloid chloride, a metalloid bromide, a metalloid iodide, and the like), a metal telluride, or any combination thereof.

Examples of the metal oxide may include tungsten oxide (for example, WO, $W_2O_3$, $WO_2$, $WO_3$, $W_2O_5$, and the like), vanadium oxide (for example, VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (for example, $ReO_3$ and the like), and the like.

Examples of the metal halide may include an alkali metal halide, an alkaline earth metal halide, a transition metal halide, a post-transition metal halide, a lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include a titanium halide (for example, $TiF_4$, $TiCl_4$, $TiBr_4$, $TiI_4$, and the like), a zirconium halide (for example, $ZrF_4$, $ZrCl_4$, $ZrBr_4$, $ZrI_4$, and the like), a hafnium halide (for example, $HfF_4$, $HfCl_4$, $HfBr_4$, $HfI_4$, and the like), a vanadium halide (for example, $VF_3$, $VCl_3$, $VBr_3$, $VI_3$, and the like), a niobium halide (for example, $NbF_3$, $NbCl_3$, $NbBr_3$, $NbI_3$, and the like), a tantalum halide (for example, $TaF_3$, $TaCl_3$, $TaBr_3$, $TaI_3$, and the like), a chromium halide (for example, $CrF_3$, $CrCl_3$, $CrBr_3$, $CrI_3$, and the like), a molybdenum halide (for example, $MoF_3$, $MoCl_3$, $MoBr_3$, $MoI_3$, and the like), a tungsten halide (for example, $WF_3$, $WCl_3$, $WBr_3$, $WI_3$, and the like), a manganese halide (for example, $MnF_2$, $MnCl_2$, $MnBr_2$, $MnI_2$, and the like), a technetium halide (for example, $TcF_2$, $TcCl_2$, $TcBr_2$, $TcI_2$, and the like), a rhenium halide (for example, $ReF_2$, $ReCl_2$, $ReBr_2$, $ReI_2$, and the like), an iron halide (for example, $FeF_2$, $FeCl_2$, $FeBr_2$, $FeI_2$, and the like), a ruthenium halide (for example, $RuF_2$, $RuCl_2$, $RuBr_2$, $RuI_2$, and the like), an osmium halide (for example, $OsF_2$, $OsCl_2$, $OsBr_2$, $OsI_2$, and the like), a cobalt halide (for example, $CoF_2$, $CoCl_2$, $CoBr_2$, $CoI_2$, and the like), a rhodium halide (for example, $RhF_2$, $RhCl_2$, $RhBr_2$, $RhI_2$, and the like), an iridium halide (for example, $IrF_2$, $IrCl_2$, $IrBr_2$, $IrI_2$, and the like), a nickel halide (for example, $NiF_2$, $NiCl_2$, $NiBr_2$, $NiI_2$, and the like), a palladium halide (for example, $PdF_2$, $PdCl_2$, $PdBr_2$, $PdI_2$, and the like), a platinum halide (for example, $PtF_2$, $PtCl_2$, $PtBr_2$, $PtI_2$, and the like), a copper halide (for example, CuF, CuCl, CuBr, CuI, and the like), a silver halide (for example, AgF, AgCl, AgBr, AgI, and the like), a gold halide (for example, AuF, AuCl, AuBr, AuI, and the like), and the like Examples of the post-transition metal halide may include a zinc halide (for example, $ZnF_2$, $ZnCl_2$, $ZnBr_2$, $ZnI_2$, and the like), an indium halide (for example, $InI_3$ and the like), a tin halide (for example, $SnI_2$ and the like), and the like Examples of the lanthanide metal halide may include YbF, $YbF_2$, $YbF_3$, $SmF_3$, YbCl, $YbCl_2$, $YbCl_3SmCl_3$, YbBr, $YbBr_2$, $YbBr_3SmBr_3$, YbI, $YbI_2$, $YbI_3$, $SmI_3$, and the like.

Examples of the metalloid halide may include an antimony halide (for example, $SbCl_5$ and the like) and the like.

Examples of the metal telluride may include an alkali metal telluride (for example, $Li_2Te$, a $na_2Te$, $K_2Te$, $Rb_2Te$, $Cs_2Te$, and the like), an alkaline earth metal telluride (for example, BeTe, MgTe, CaTe, SrTe, BaTe, and the like), a transition metal telluride (for example, $TiTe_2$, $ZrTe_2$, $HfTe_2$, $V_2Te_3$, $Nb_2Te_3$, $Ta_2Te_3$, $Cr_2Te_3$, $MozTe_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), a post-transition metal telluride (for example, ZnTe, and the like), a lanthanide metal telluride (for example, LaTe, CeTe, PrTe, NdTe, PmTe, EuTe, GdTe, TbTe, DyTe, HoTe, ErTe, TmTe, YbTe, LuTe, and the like), and the like.

[Emission Layer 151 in Interlayer 150]

When the light-emitting device 10 is a full-color light-emitting device, the emission layer 151 may be patterned into a red emission layer, a green emission layer, and/or a blue emission layer, according to a subpixel. In an embodiment, the emission layer 151 may have a stacked structure of two or more layers of a red emission layer, a green emission layer, and a blue emission layer, wherein the two or more layers may contact each other or may be separated from each other. In embodiments, the emission layer 151 may include two or more materials of a red light-emitting material, a green light-emitting material, and a blue light-emitting material, wherein the two or more materials are mixed with each other in a single layer to emit white light.

In an embodiment, the emission layer 151 may include a host and a dopant. The dopant may include a phosphorescent dopant, a fluorescent dopant, or any combination thereof.

In the emission layer 151, an amount of the dopant may be in a range of about 0.01 parts by weight to about 15 parts by weight, based on 100 parts by weight of the host.

In an embodiment, the emission layer 151 may include a quantum dot.

In embodiments, the emission layer 151 may include a delayed fluorescence material. The delayed fluorescence material may serve as a host or as a dopant in the emission layer 151.

A thickness of the emission layer 151 may be in a range of about 100 Å to about 1,000 Å. For example, the thickness of the emission layer 151 may be in a range of about 200 Å to about 600 Å. When the thickness of the emission layer 151 is within these ranges, excellent luminescence characteristics may be obtained without a substantial increase in driving voltage.

[Host]

In an embodiment, the host may include a compound represented by Formula 301:

$$[Ar_{301}]_{xb11}\text{-}[(L_{301})_{xb1}\text{-}R_{301}]_{xb21} \quad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each independently be the same as described in connection with $Q_1$.

For example, when xb11 in Formula 301 is 2 or more, two or more of $Ar_{301}$ may be bonded together via a single bond.

In embodiments, the host may include a compound represented by Formula 301-1, a compound represented by Formula 301-2, or any combination thereof:

[Formula 301-1]

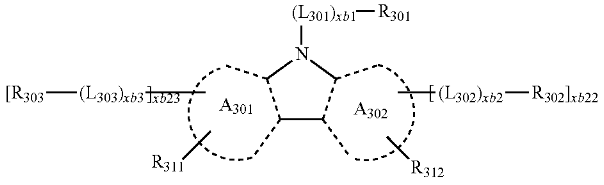

[Formula 301-2]

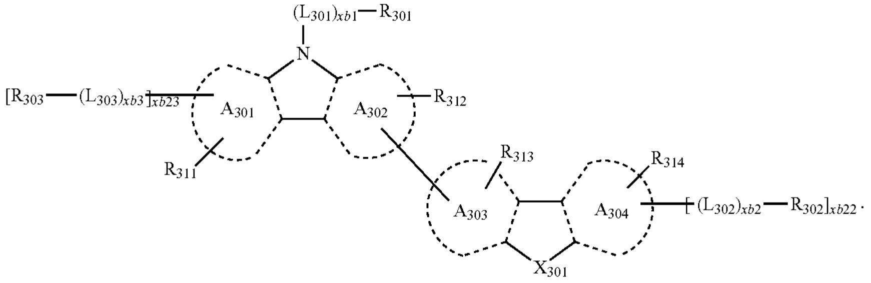

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In embodiments, the host may include an alkali earth metal complex, a post-transition metal complex, or any combination thereof. For example, the host may include a Be complex (for example, Compound H55), an Mg complex, a Zn complex, or any combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri (carbazol-9-yl)benzene (TCP), or any combination thereof:

H1

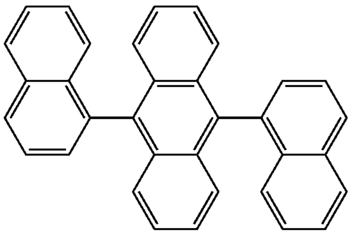

H2

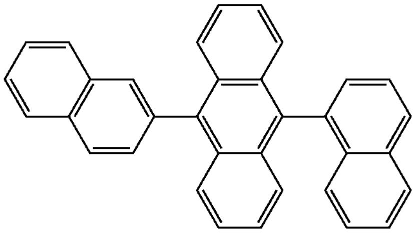

H3

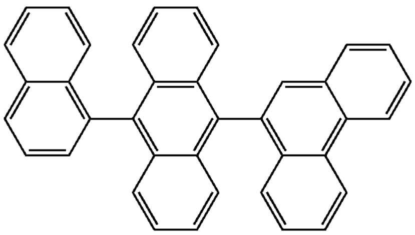

H4

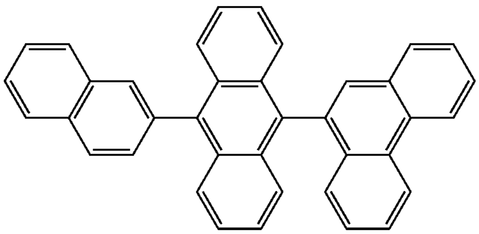

-continued

H5

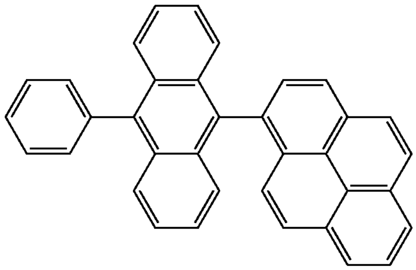

H6

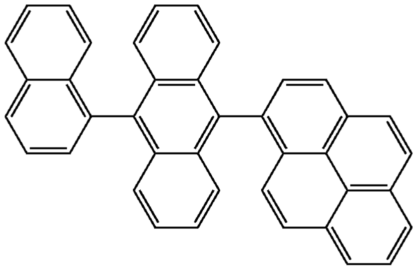

H7

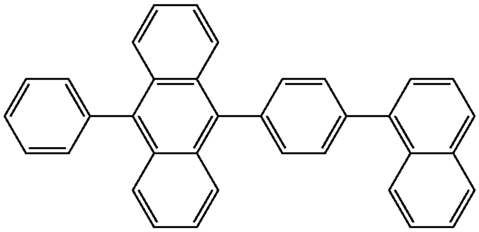

H8

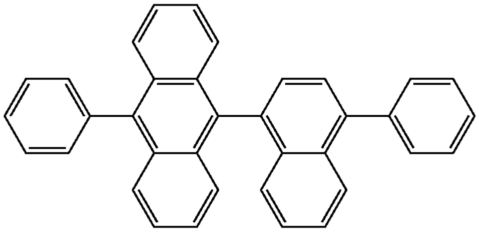

H9

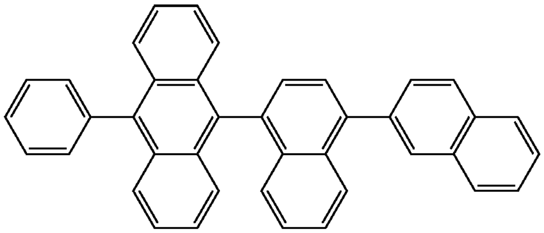

H10

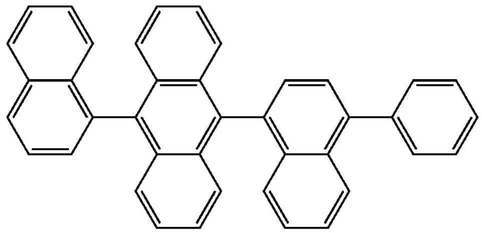

-continued
H11
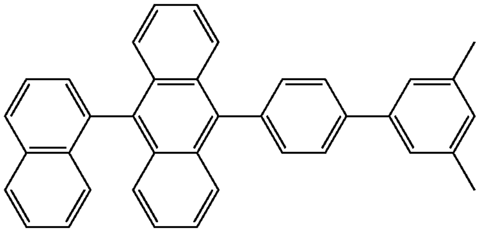
H12
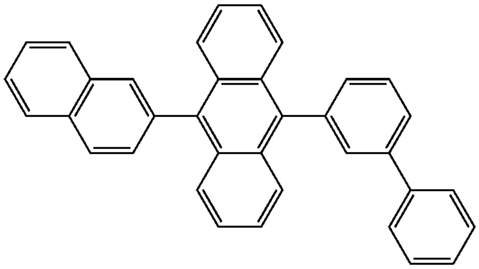
H13
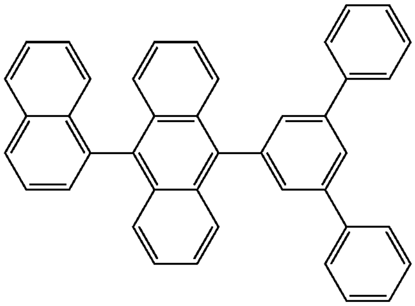
H14
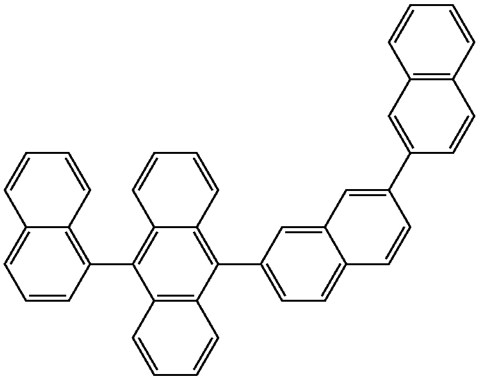
H15
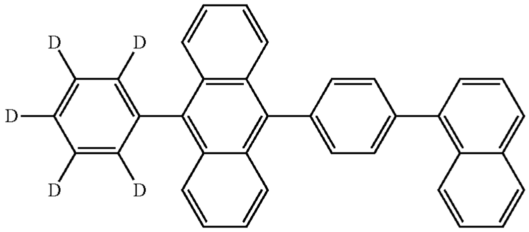
-continued
H16
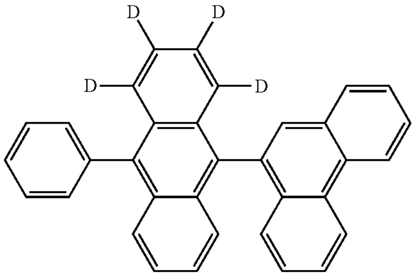
H17
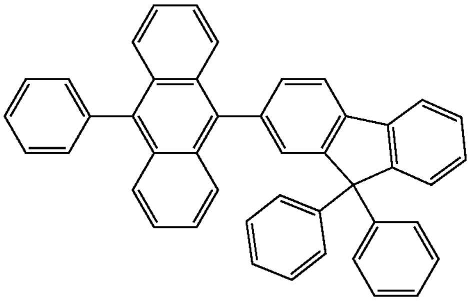
H18
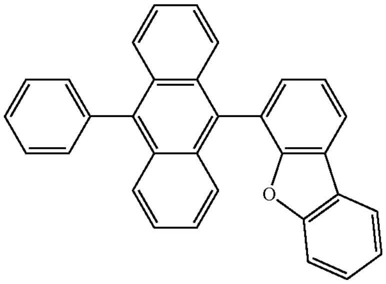
H19
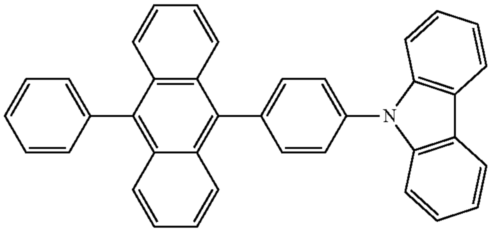
H20
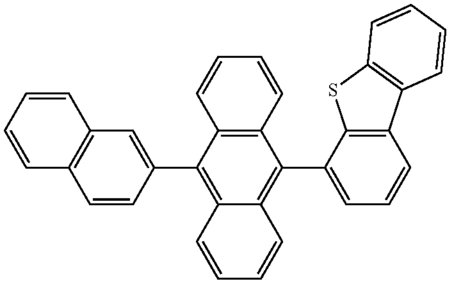

-continued
H21
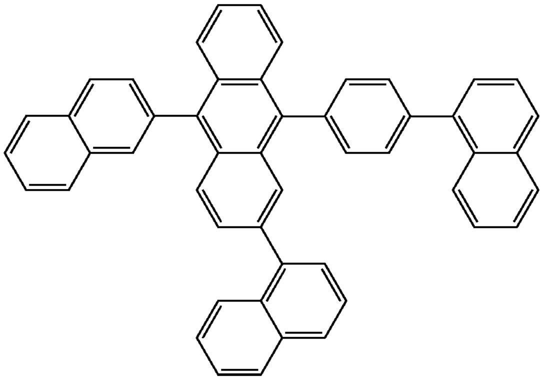
H22
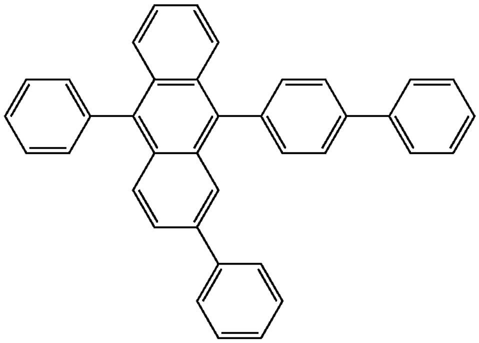
H23
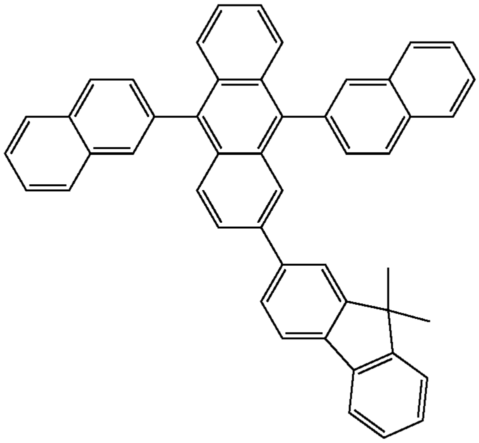
H24
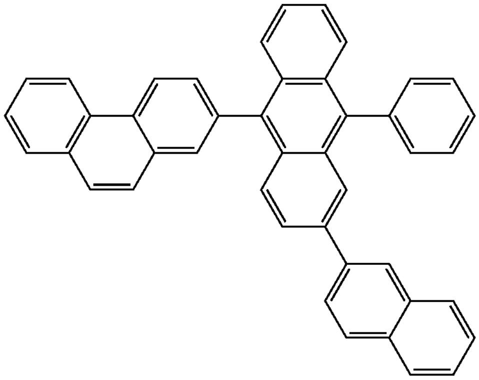
-continued
H25
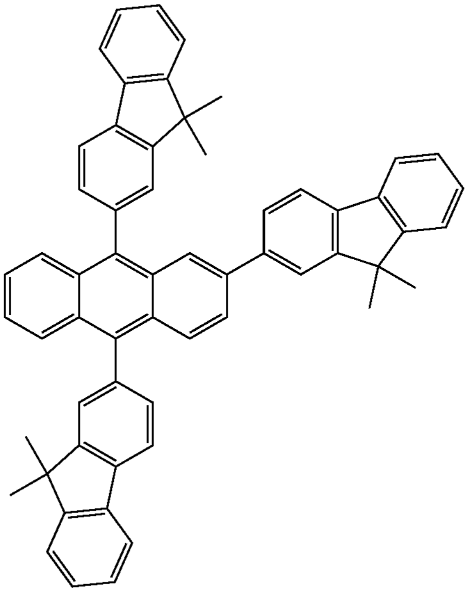
H26
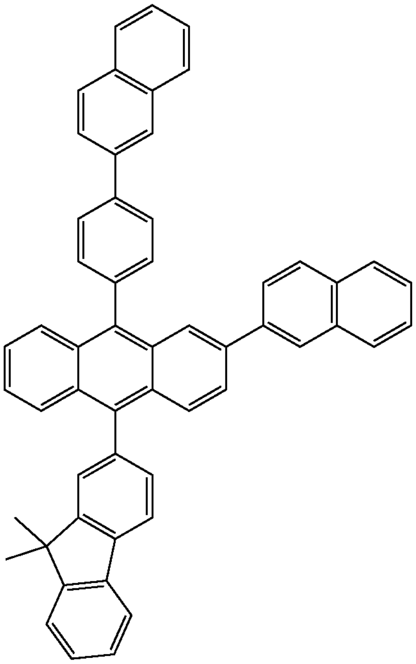

-continued
H27
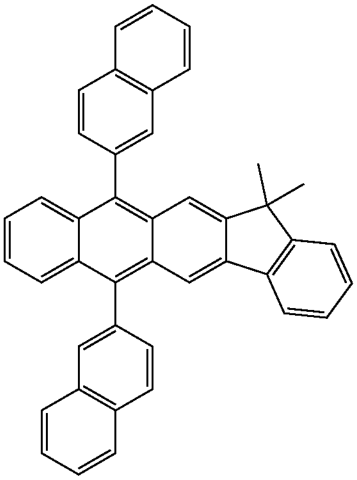
H28
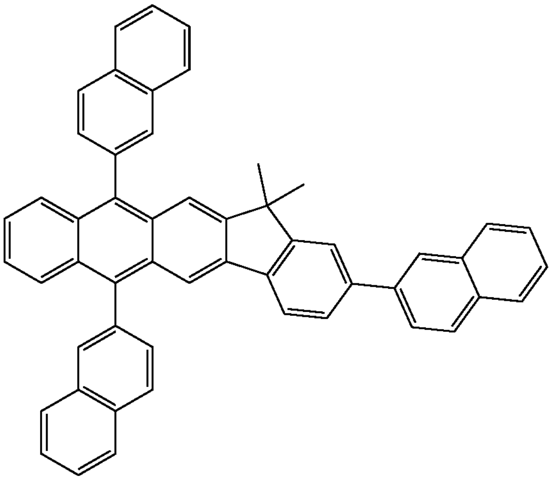
H29
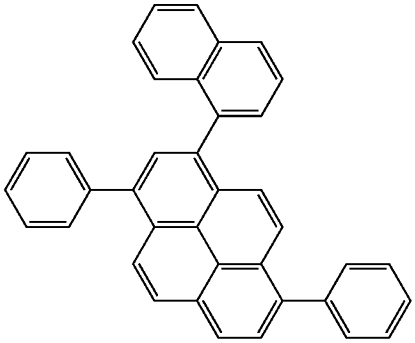
-continued
H30
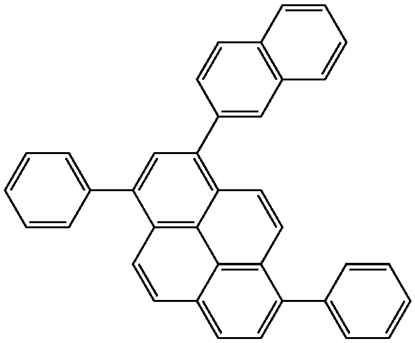
H31
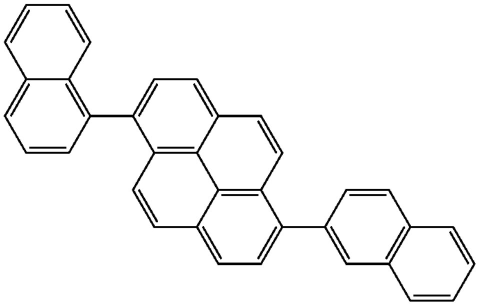
H32
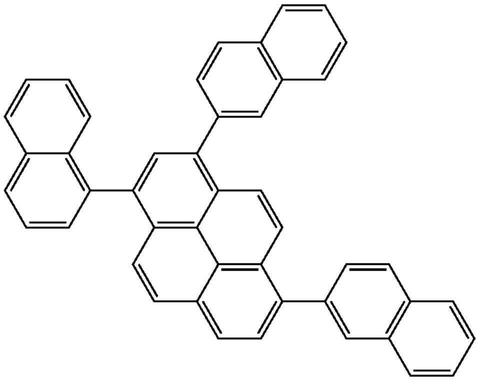
H33
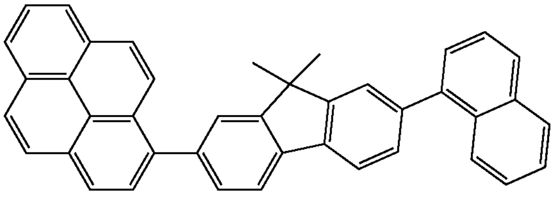
H34
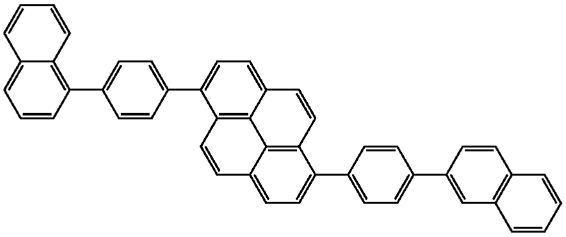

-continued
H35
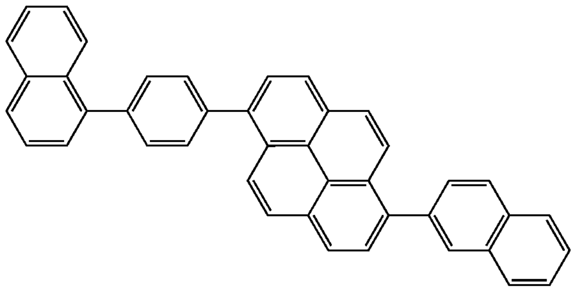
H36
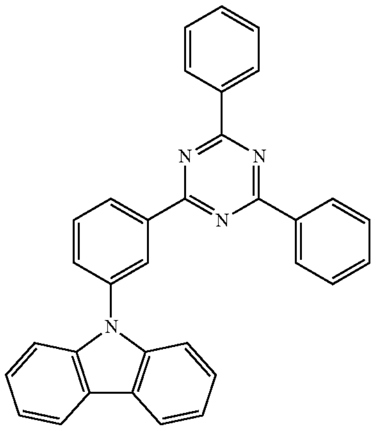
H37
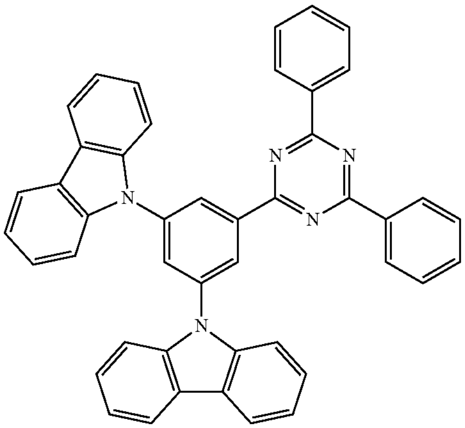
H38
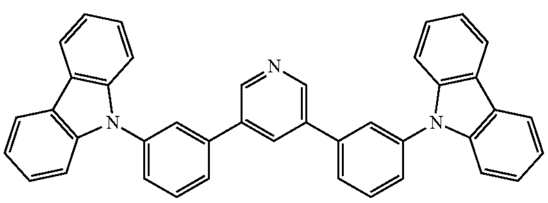
-continued
H39
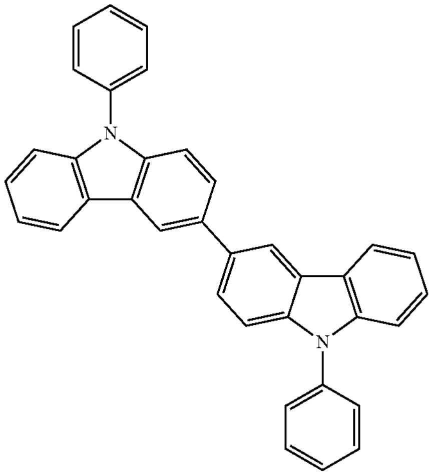
H40
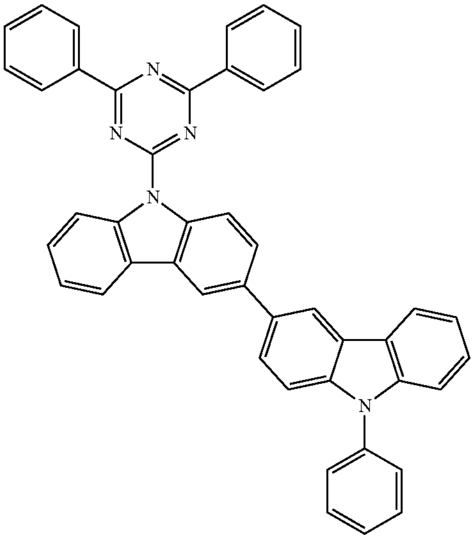
H41
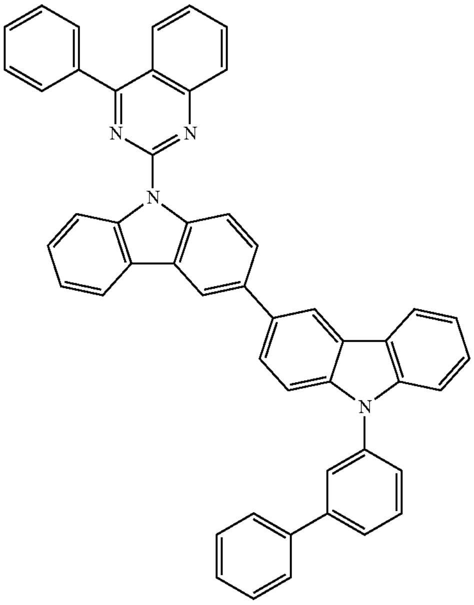

-continued
H42
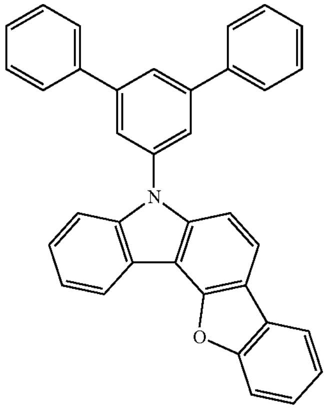
H43
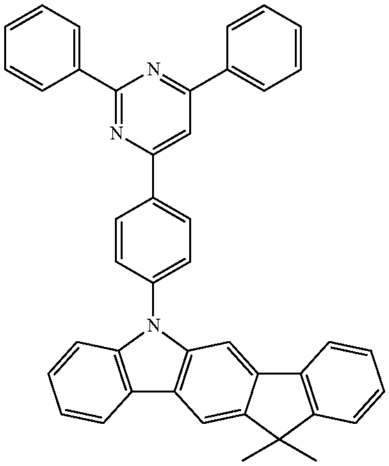
H44
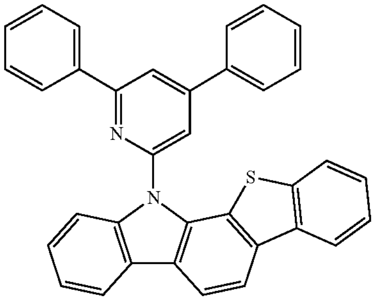
H45
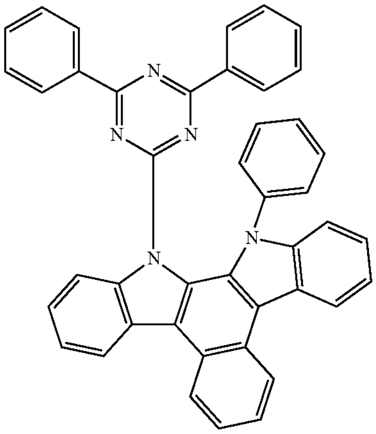
-continued
H46
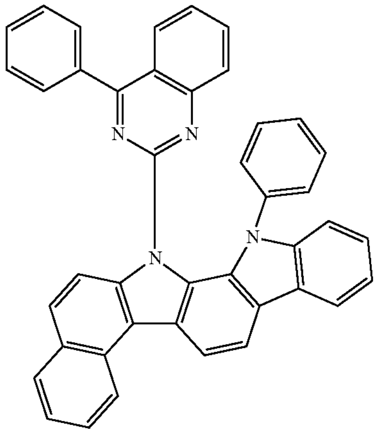
H47
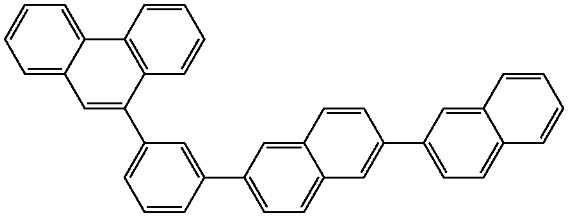
H48
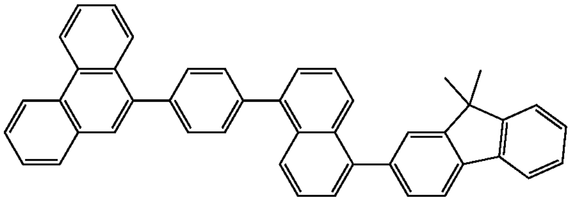
H49
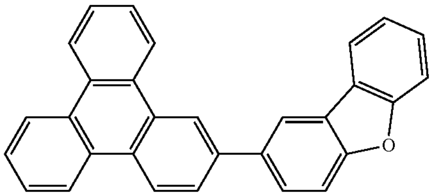
H50
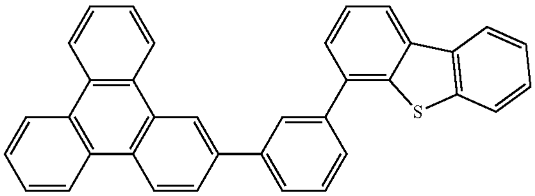
H51
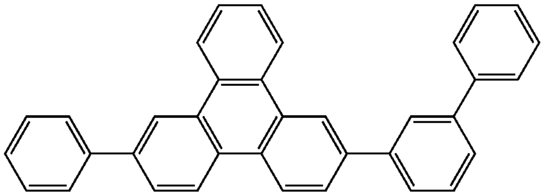

-continued
H52
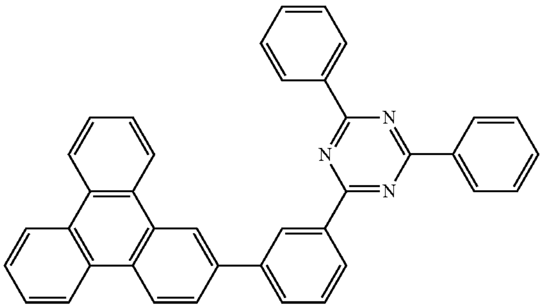
H53
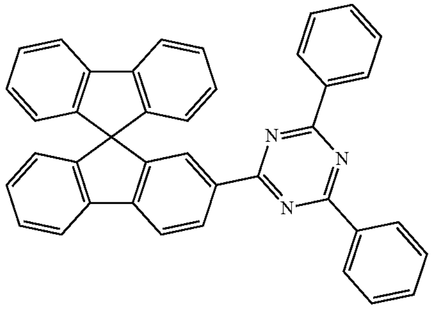
H54
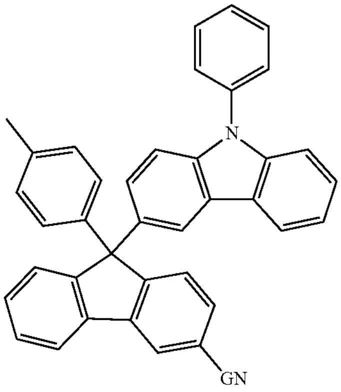
H55
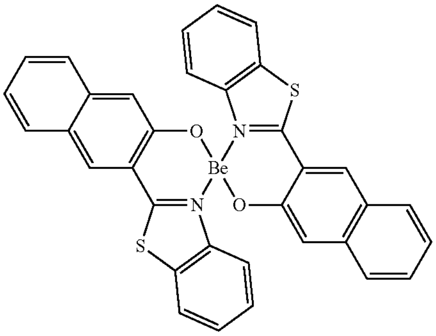
-continued
H56
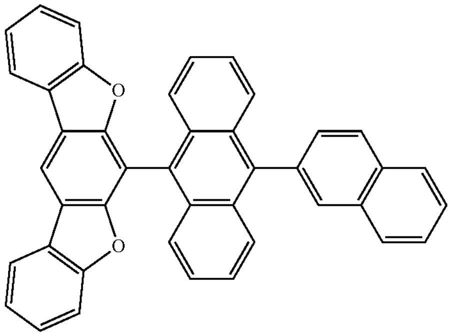
H57
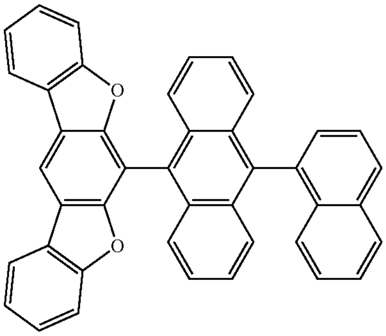
H58
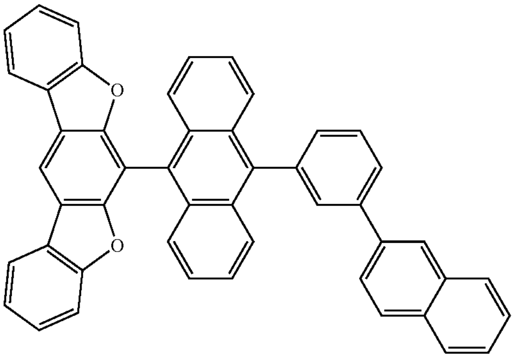
H59
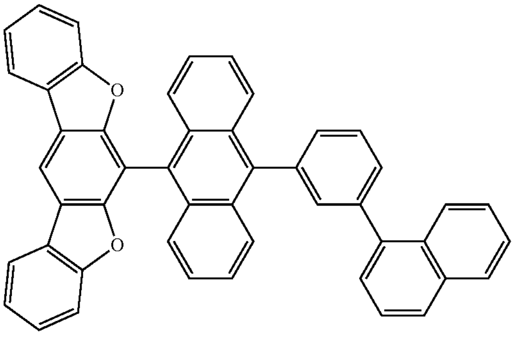

-continued
H60
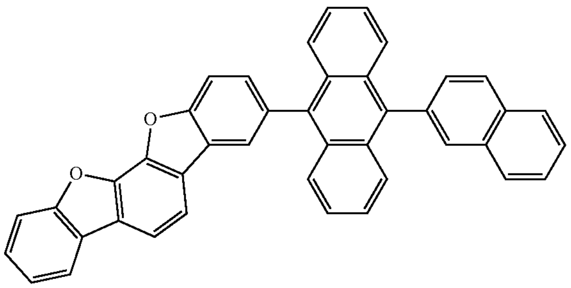
H61
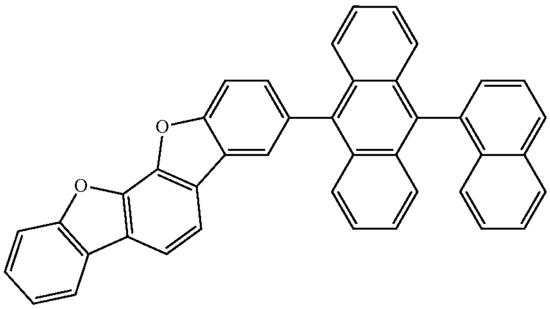
H62
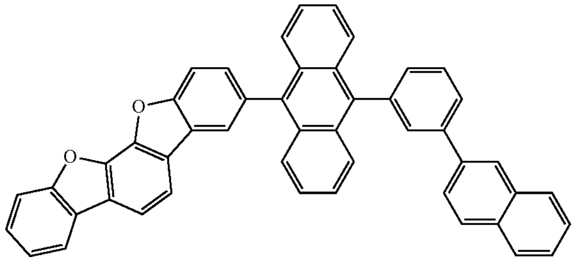
H63
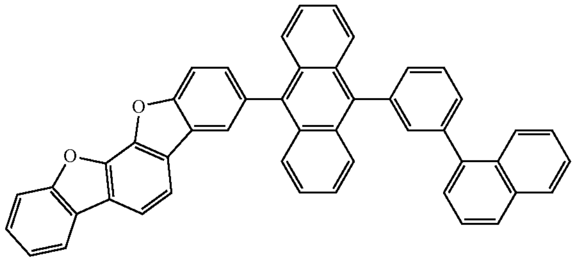
H64
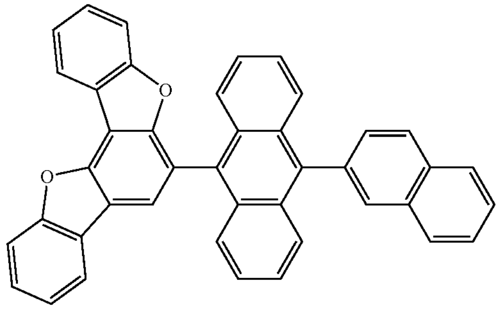
-continued
H65
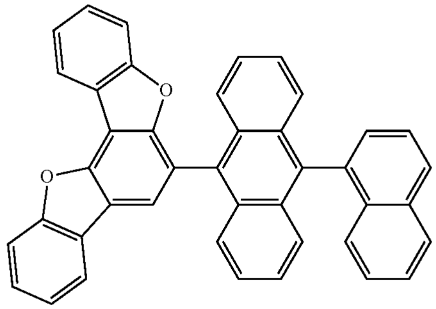
H66
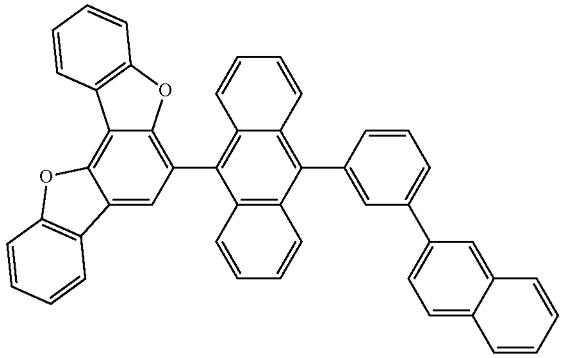
H67
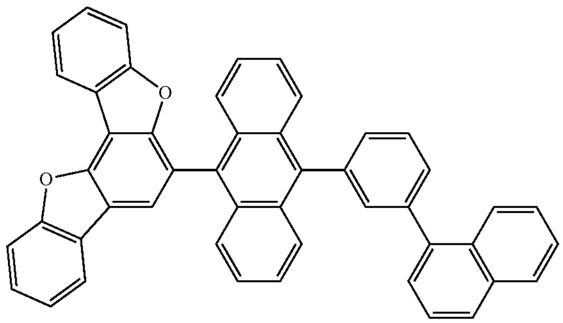
H68
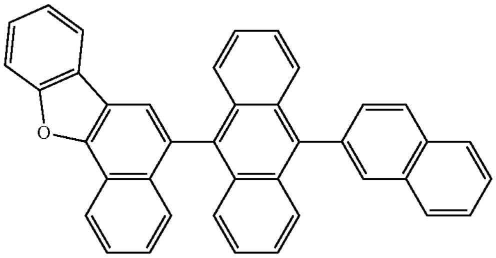
H69
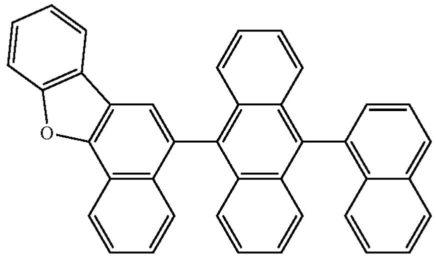

-continued
H70
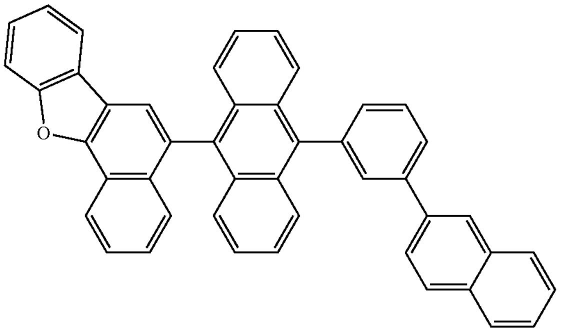
H71
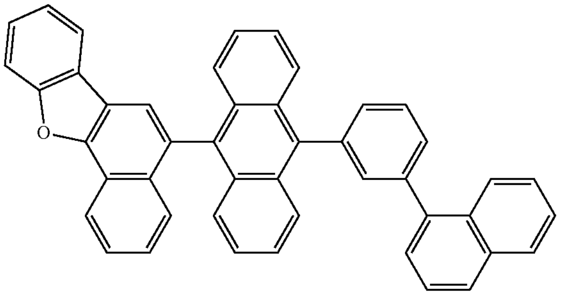
H72
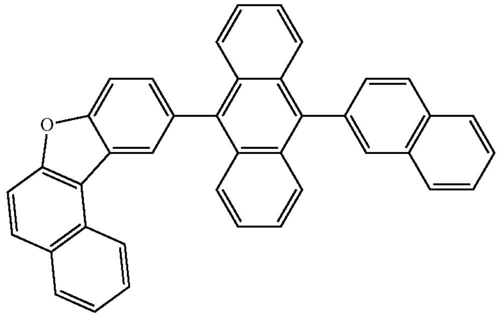
H73
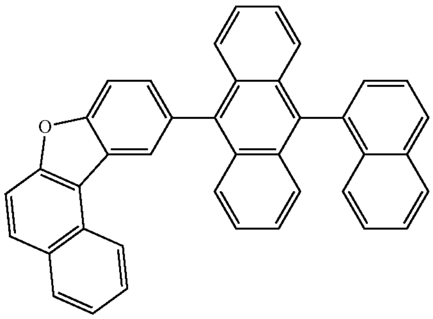
-continued
H74
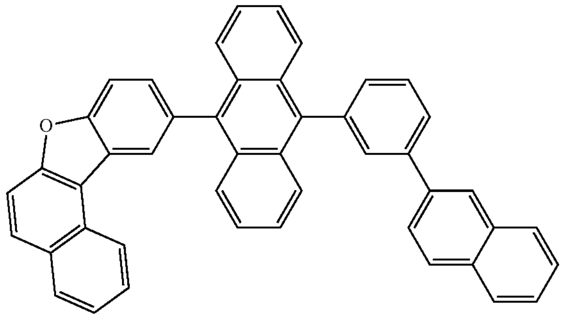
H75
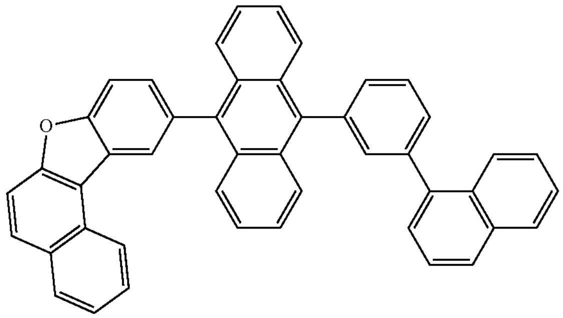
H76
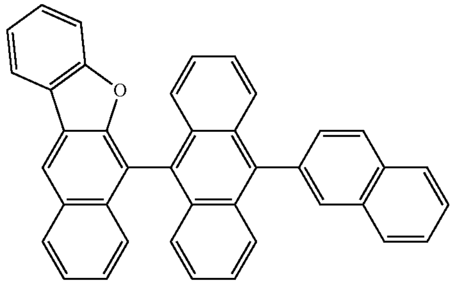
H77
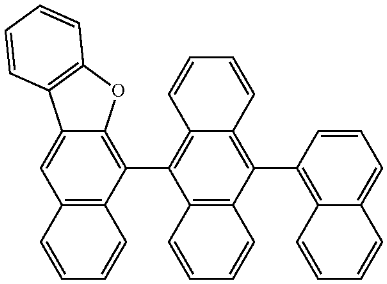
H78
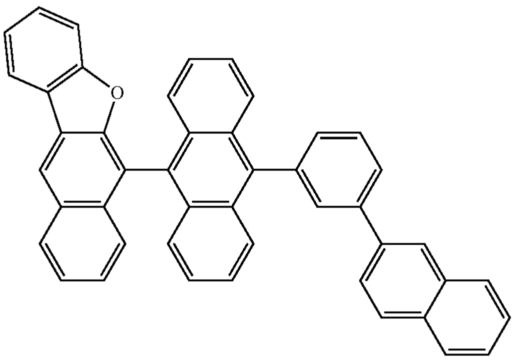

-continued
H79
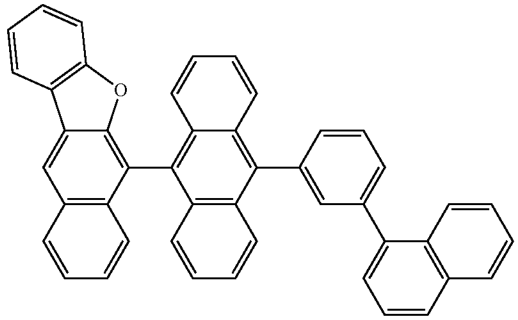
H80
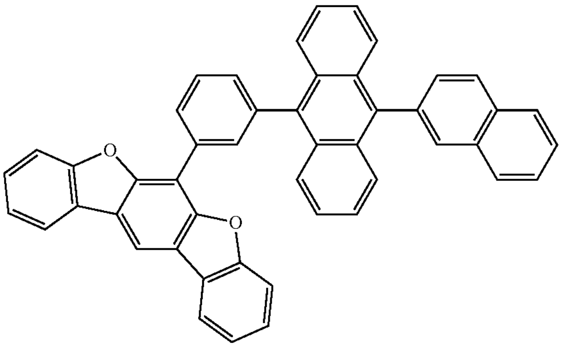
H81
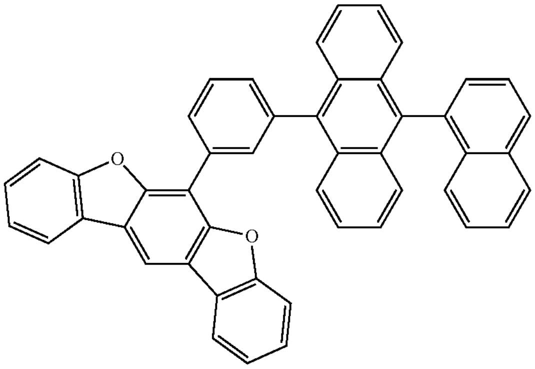
H82
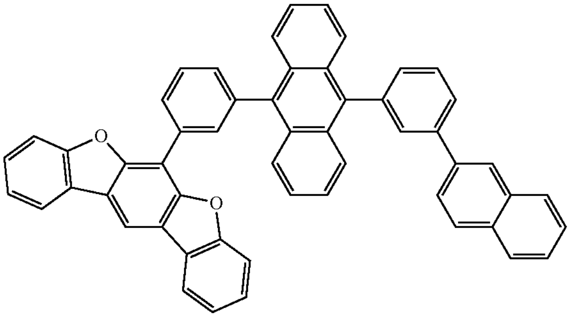
-continued
H83
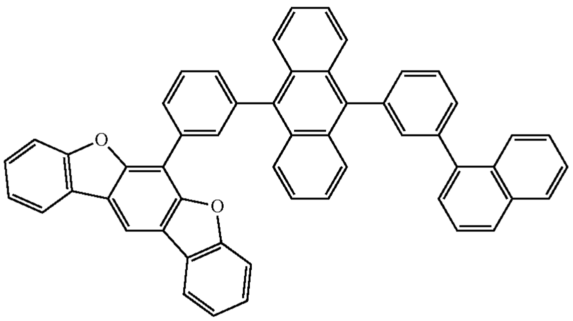
H84
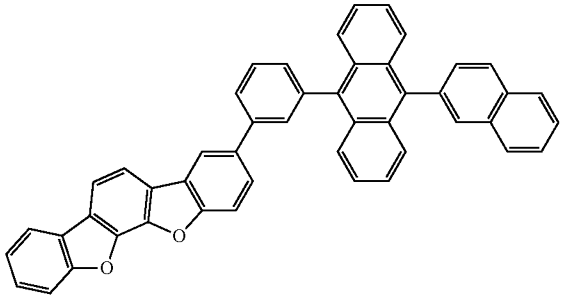
H85
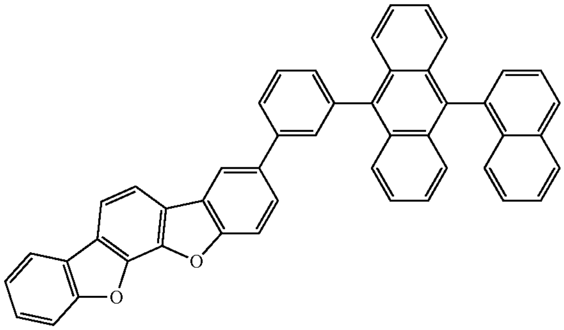
H86
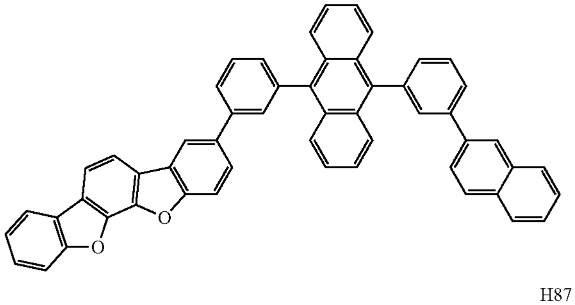
H87
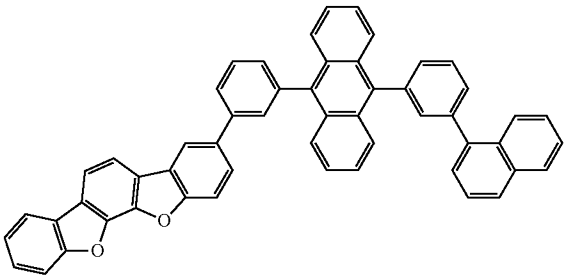

-continued
H88
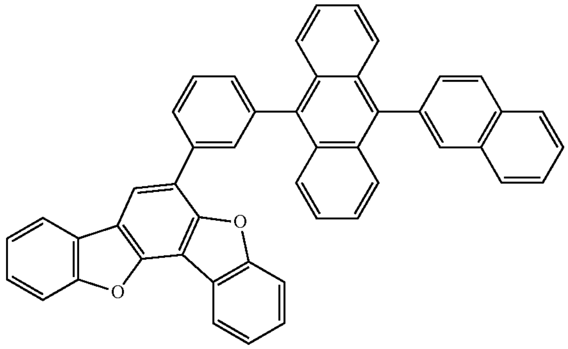
H89
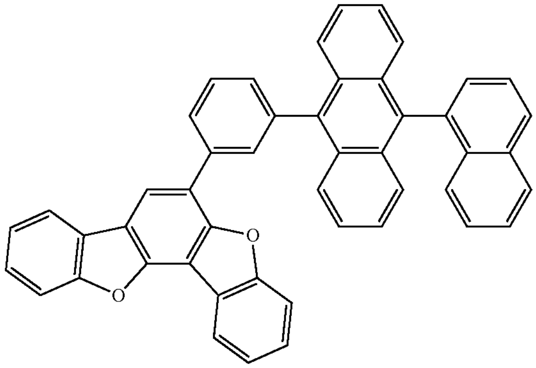
H90
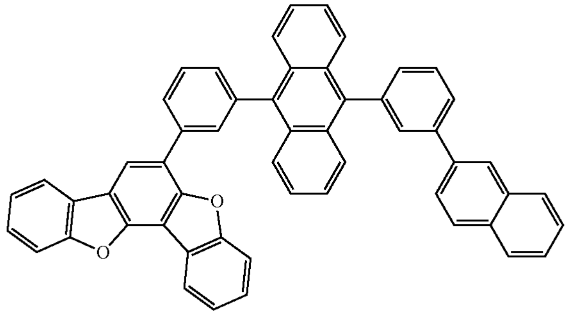
H91
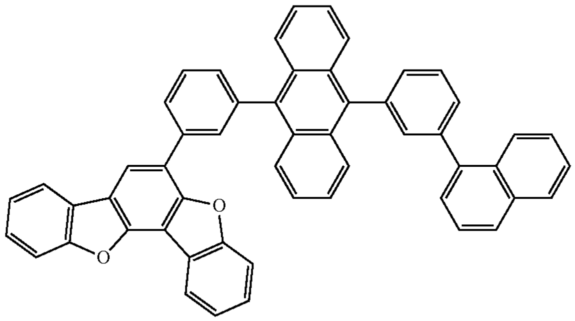
-continued
H92
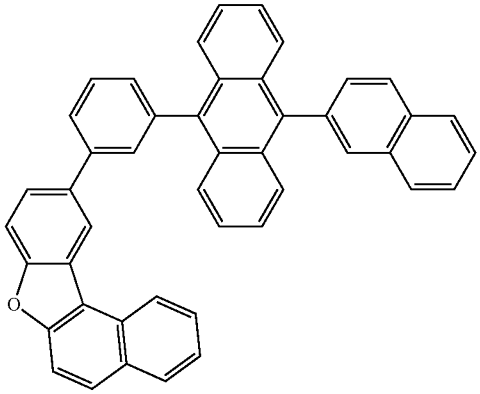
H93
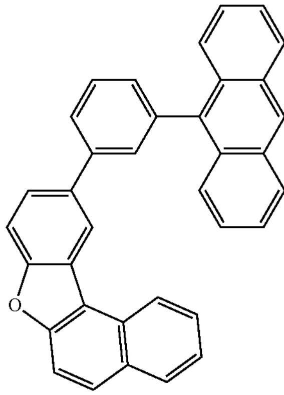
H94
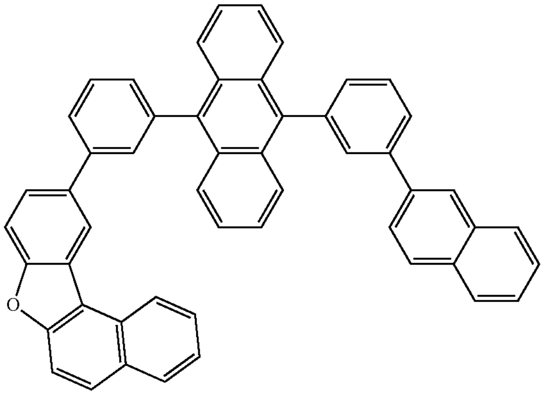
H95
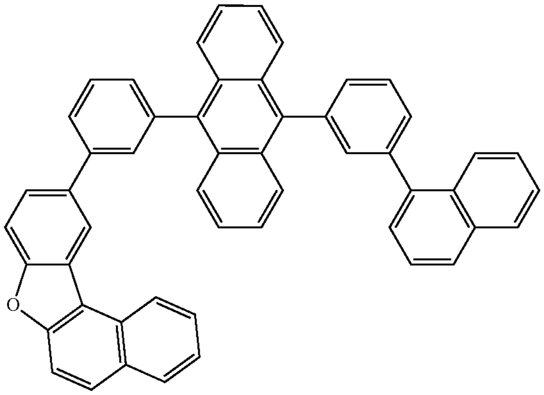

-continued
H96
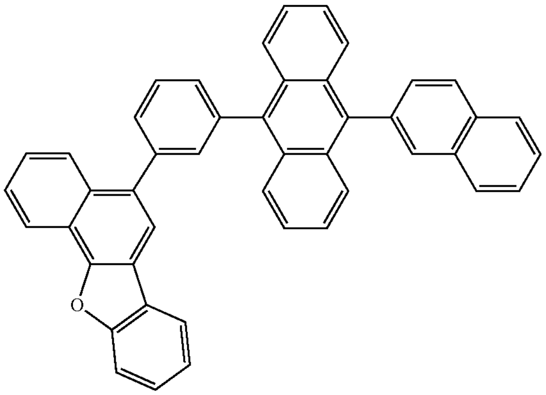
H97
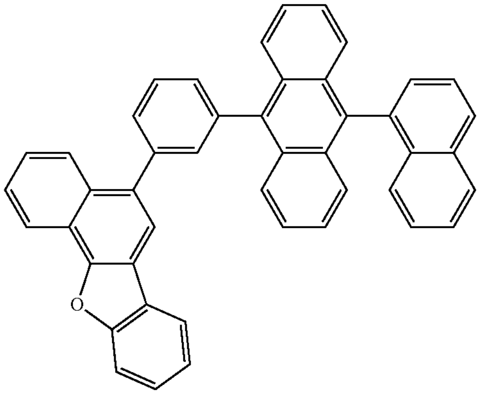
H98
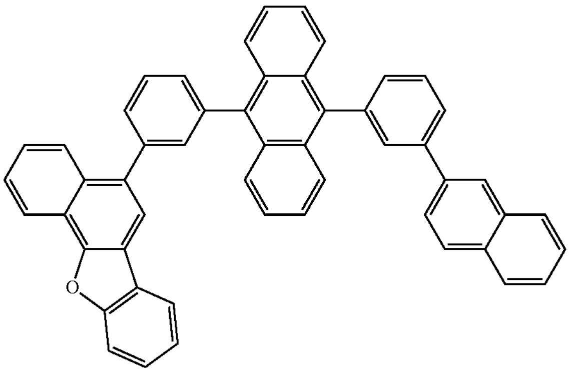
H99
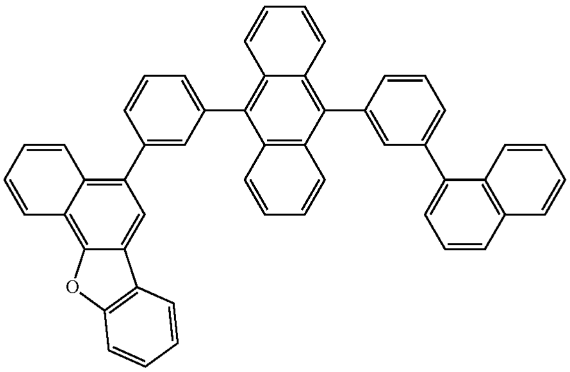
-continued
H100
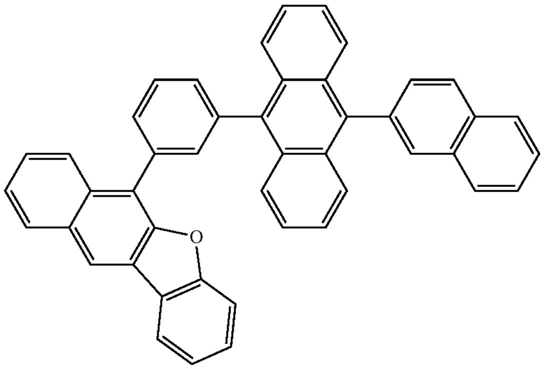
H101
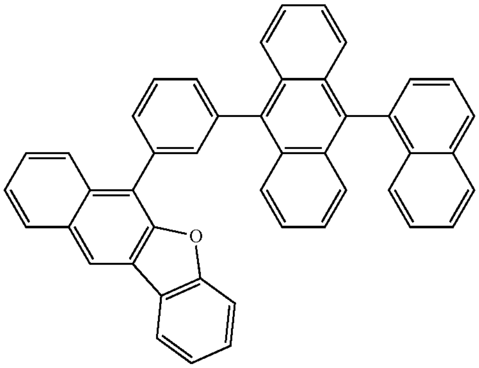
H102
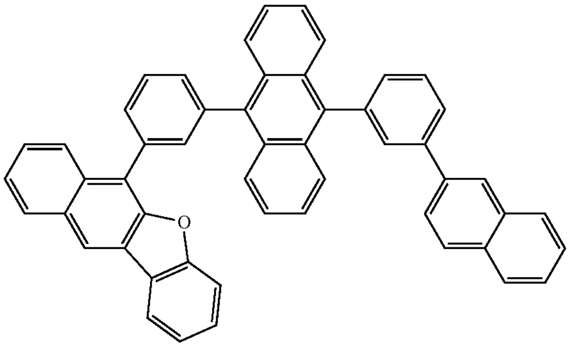
H103
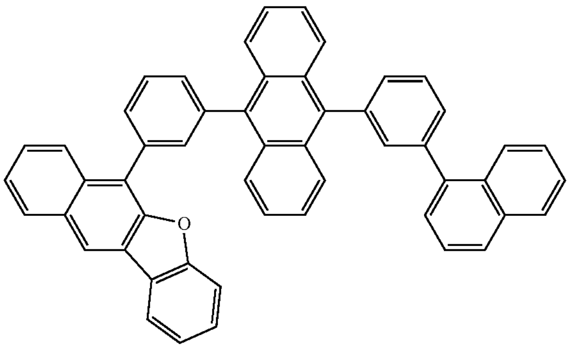

-continued
H104
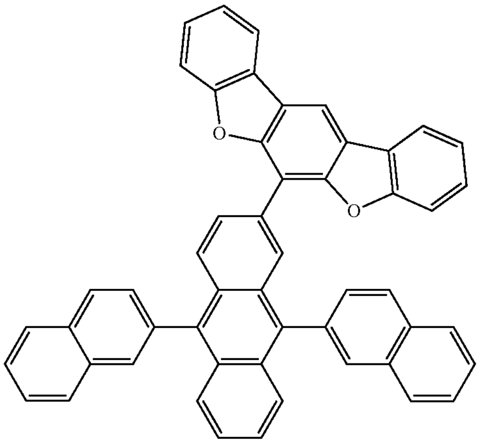
H105
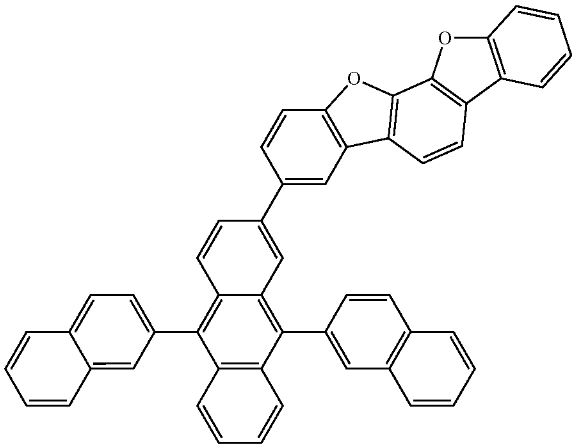
H108
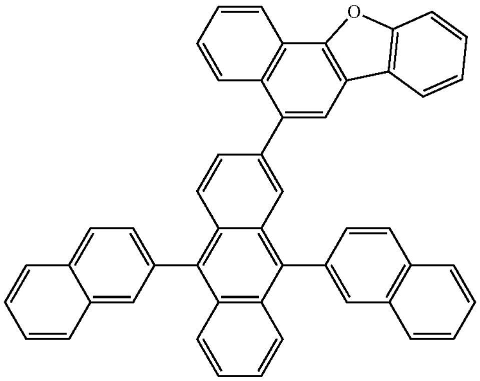
-continued
H106
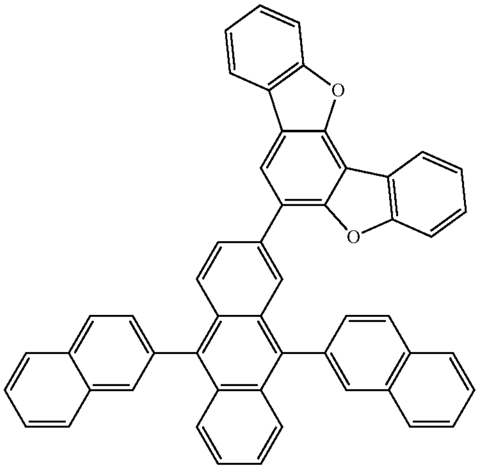
H107
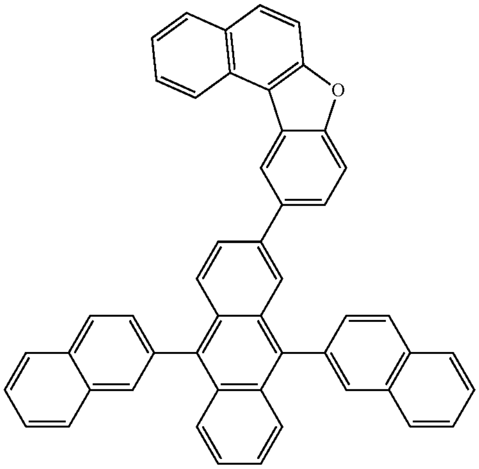
H109
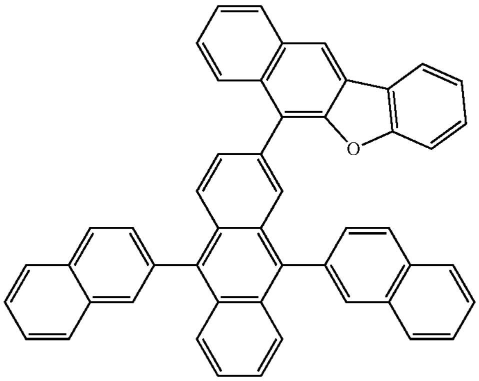

-continued
H110
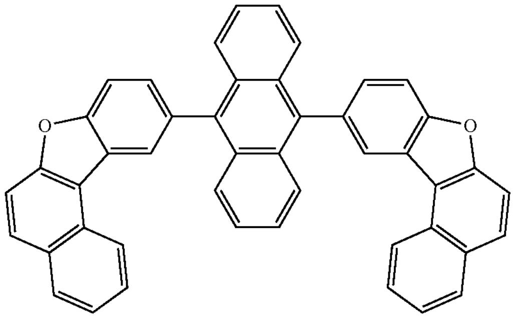
H111
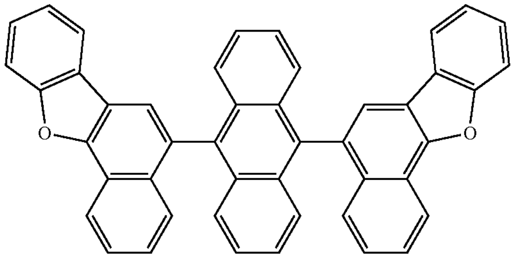
H112
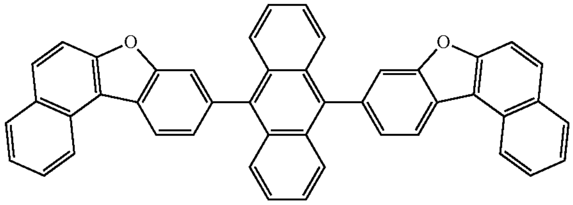
H113
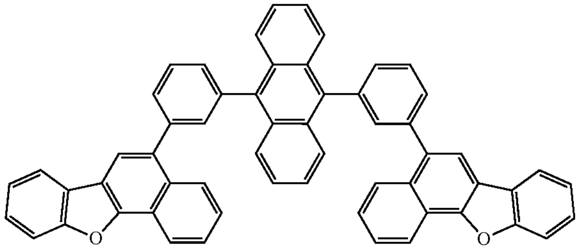
H114
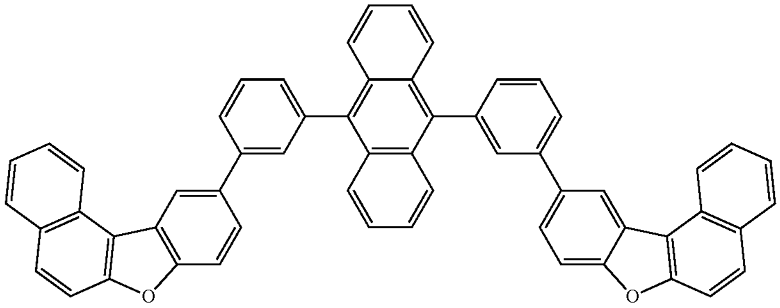
H115
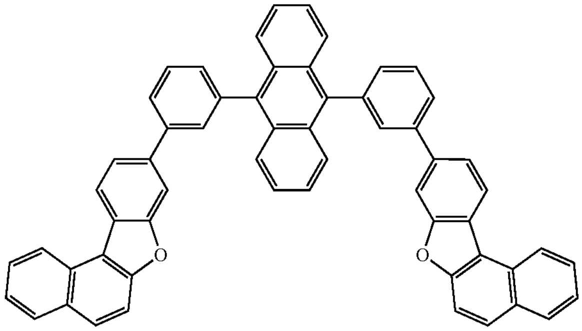
H116
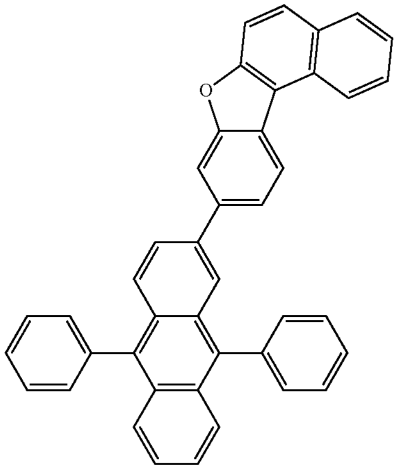

-continued
H117
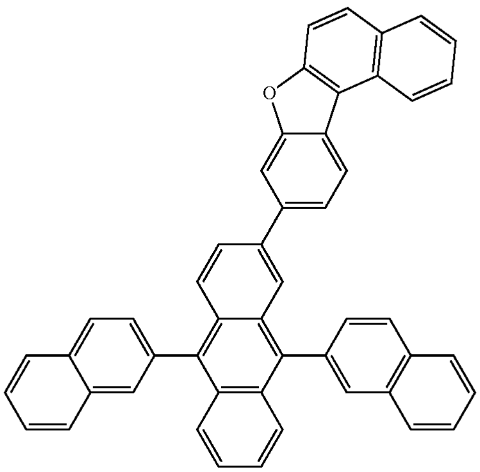
H118
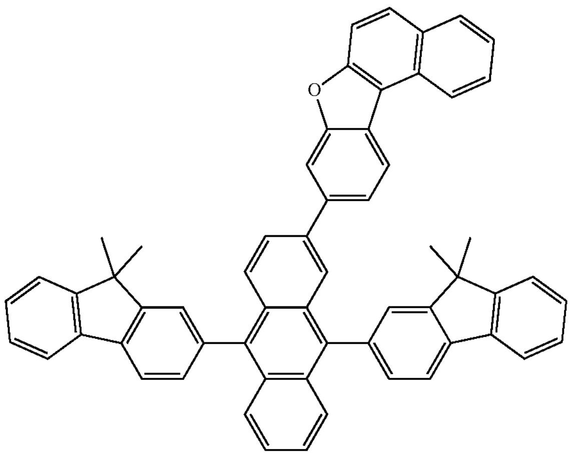
H119
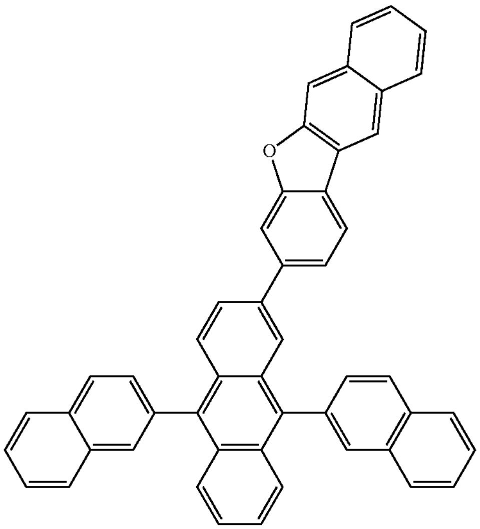
H120
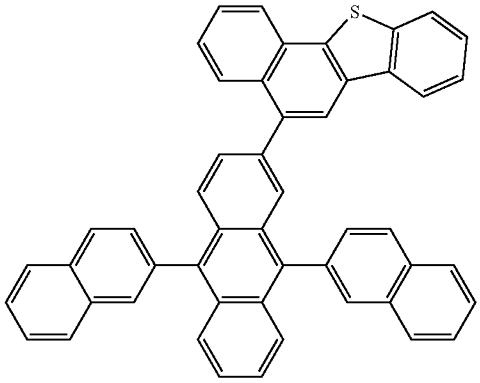
H121
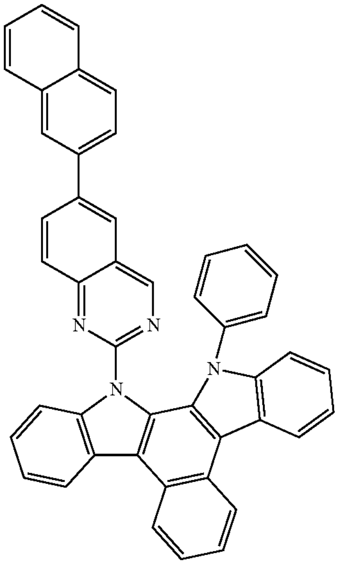
H122
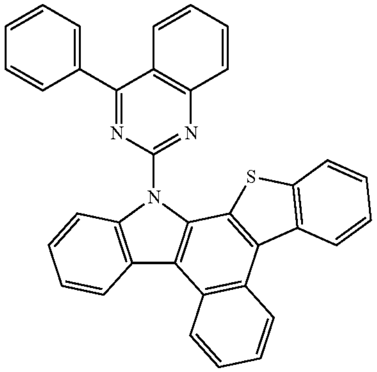

-continued

H123

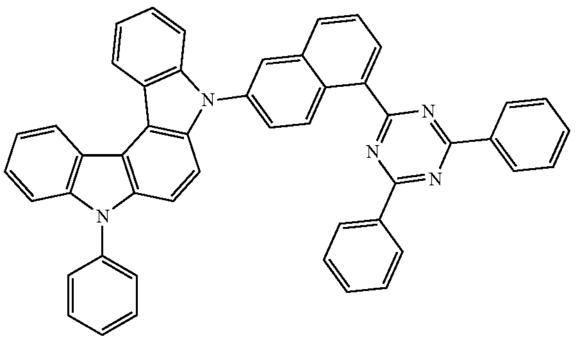

H124

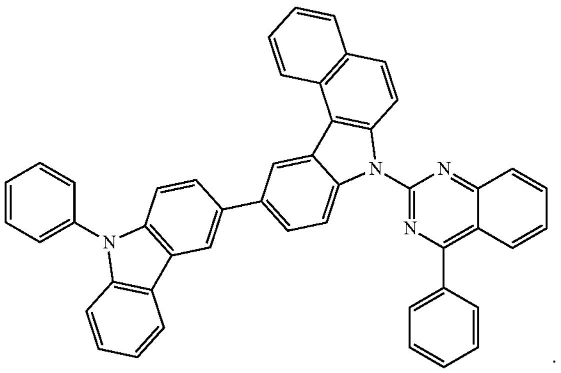

[Phosphorescent Dopant]

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic compound represented by Formula 401:

$M(L_{401})_{xc1}(L_{402})_{xc2}$ [Formula 401]

[Formula 402]

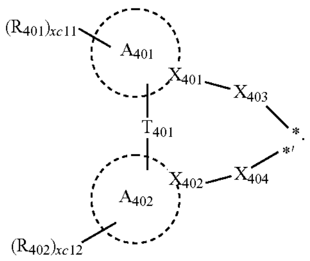

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$ may be identical to or different from each other, $L_{402}$ may be an organic ligand, and xc2 may be 0, 1, 2, 3, or 4, wherein, when xc2 is 2 or more, two or more of $L_{402}$ may be identical to or different from each other, $X_{401}$ and $X_{402}$ may each independently be nitrogen (N) or carbon (C), ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

For example, in Formula 402, $X_{401}$ may be nitrogen and $X_{402}$ may be carbon, or each of $X_{401}$ and $X_{402}$ may be nitrogen.

In an embodiment, when xc1 in Formula 401 is 2 or more, two ring $A_{401}$(s) among two or more of $L_{401}$ may optionally be bonded to each other via $T_{402}$, which is a linking group, and two ring $A_{402}$(s) among two or more of $L_{401}$ may optionally be bonded to each other via $T_{403}$, which is a linking group (see Compounds PD1 to PD4 and PD7). $T_{402}$ and $T_{403}$ may each independently be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, and the like), or any combination thereof.

The phosphorescent dopant may include, for example, one of Compounds PD1 to PD39, or any combination thereof:

-continued
PD1
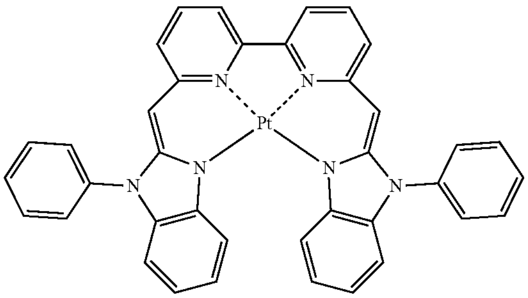
PD2
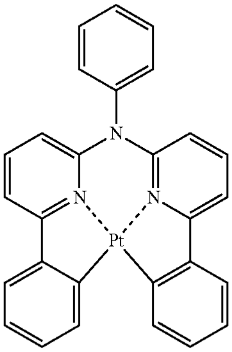
PD3
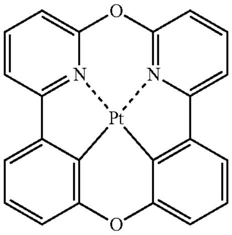
PD4
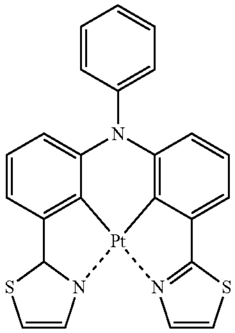
PD5
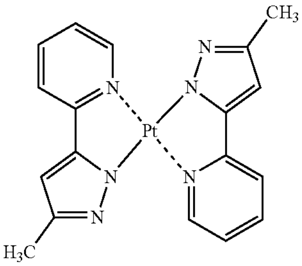
PD6
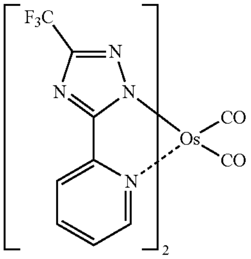
PD7
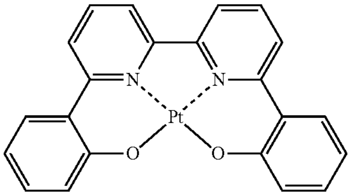
PD8
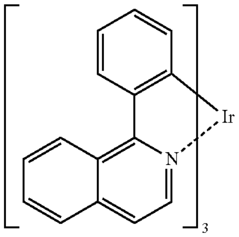
PD9
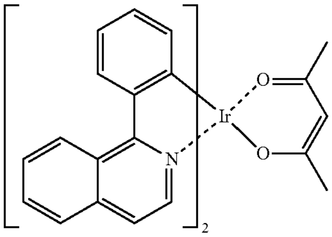
PD10
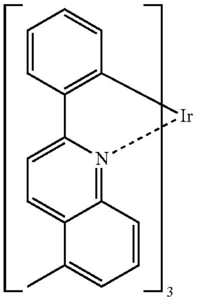
PD11
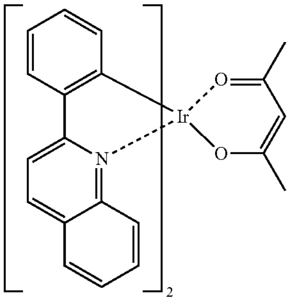

-continued
PD12
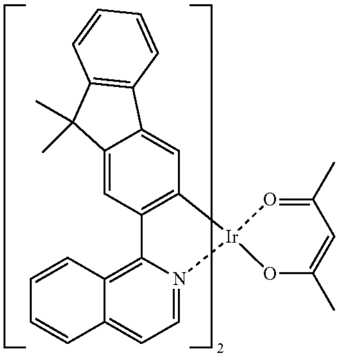
PD13
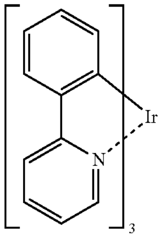
PD14
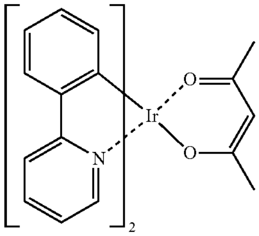
PD15
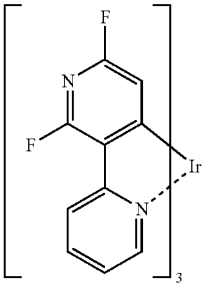
PD16
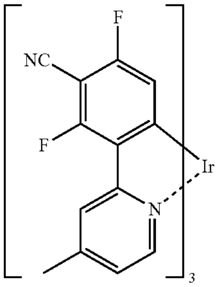
-continued
PD17
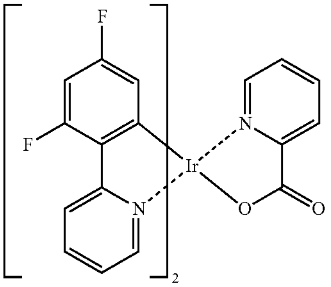
PD18
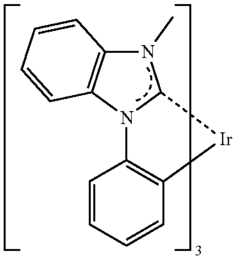
PD19
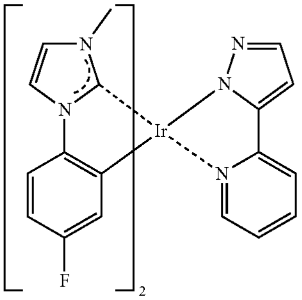
PD20
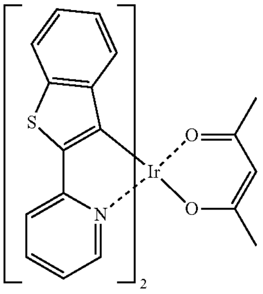
PD21
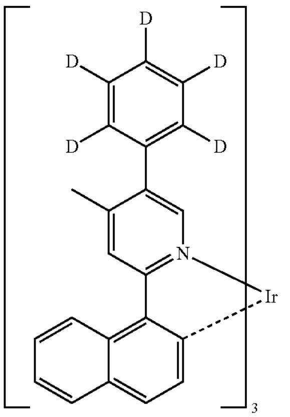

-continued
PD22
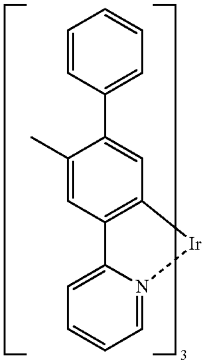
PD23
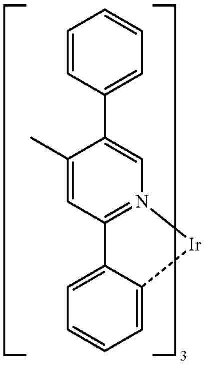
PD24
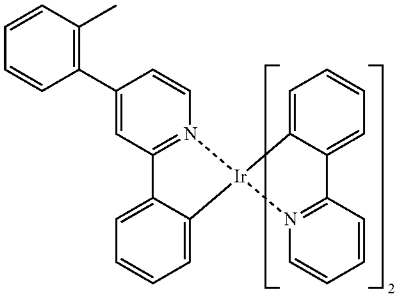
PD25
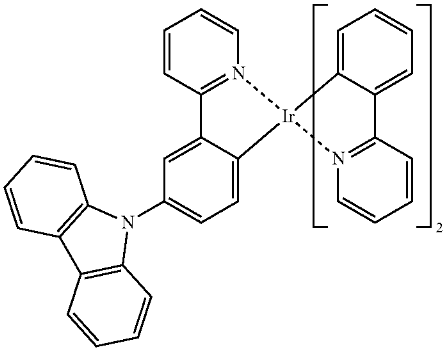
-continued
PD26
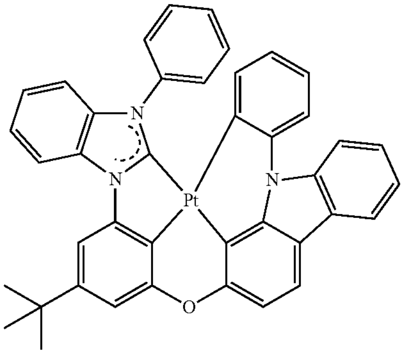
PD27
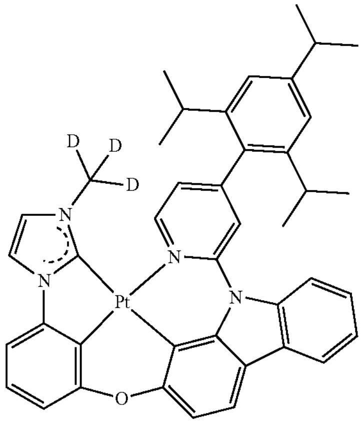
PD28
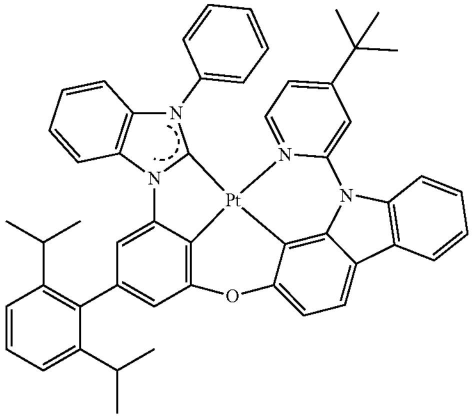
PD29
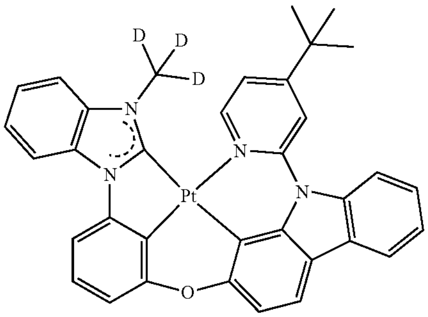

-continued
PD30
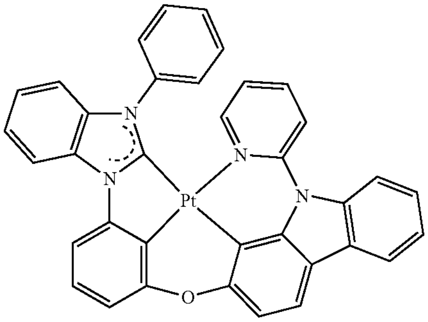
PD31
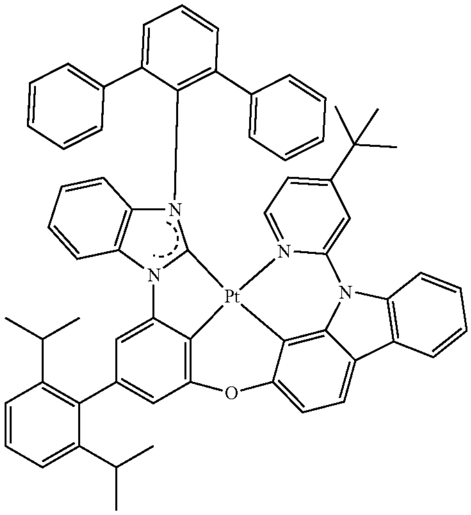
PD32
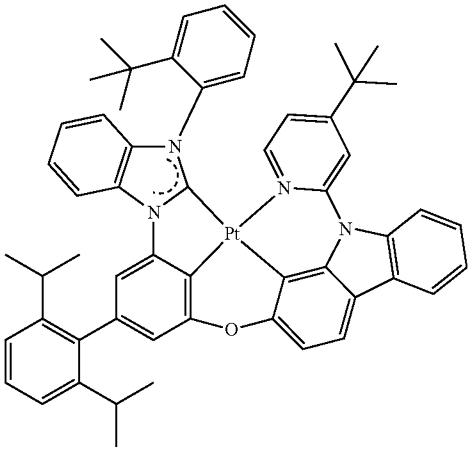
-continued
PD33
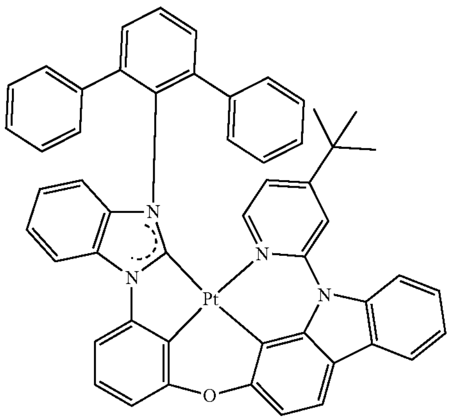
PD34
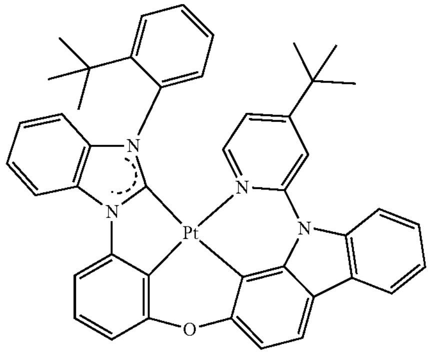
PD35
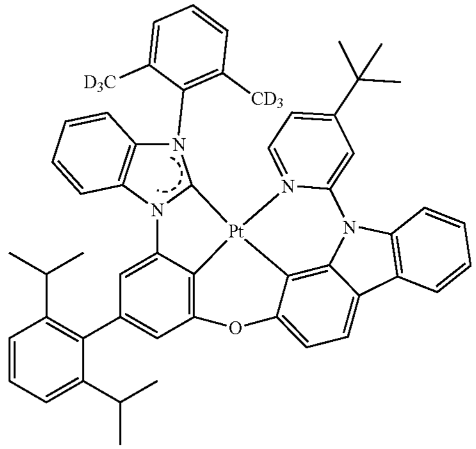
PD36
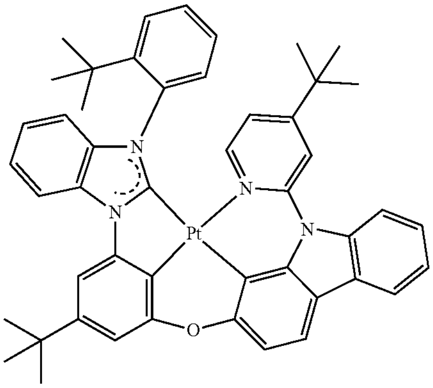

-continued

PD37

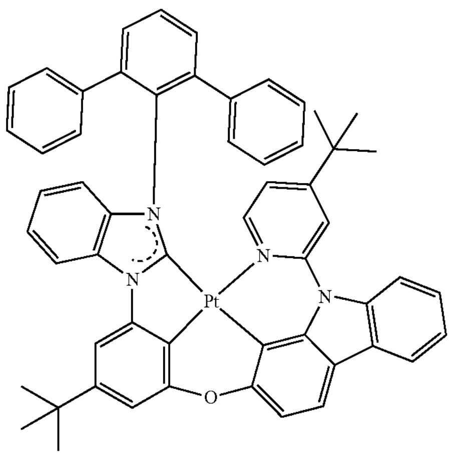

PD38

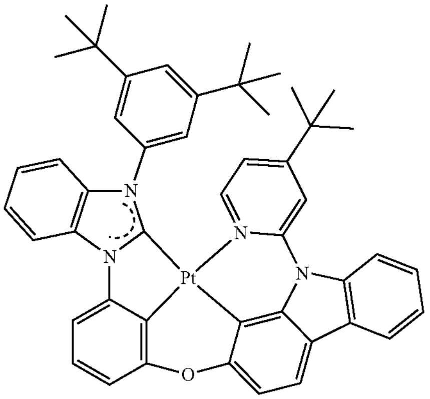

PD39

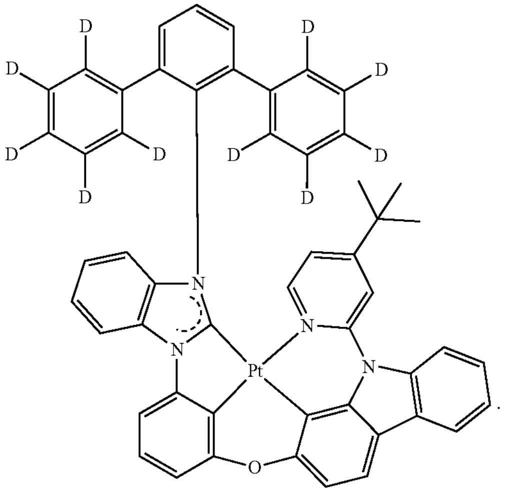

[Fluorescent Dopant]

The fluorescent dopant may include an amine group-containing compound, a styryl group-containing compound, or any combination thereof.

For example, the fluorescent dopant may include a compound represented by Formula 501:

[Formula 501]

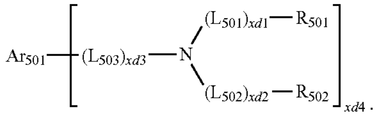

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may include a condensed cyclic group (for example, an anthracene group, a chrysene group, a pyrene group, and the like) in which three or more monocyclic groups are condensed together.

For example, xd4 in Formula 501 may be 2.

In embodiments, the fluorescent dopant may include one of Compounds FD1 to FD36, DPVBi, DPAVBi, or any combination thereof:

FD1

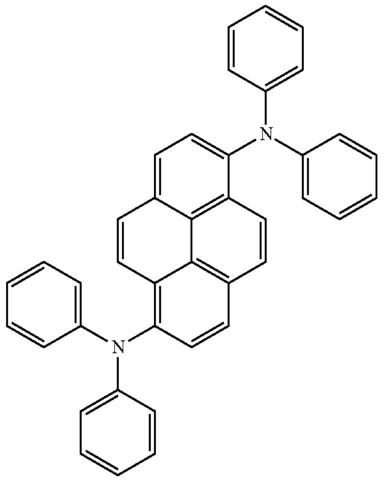

FD2

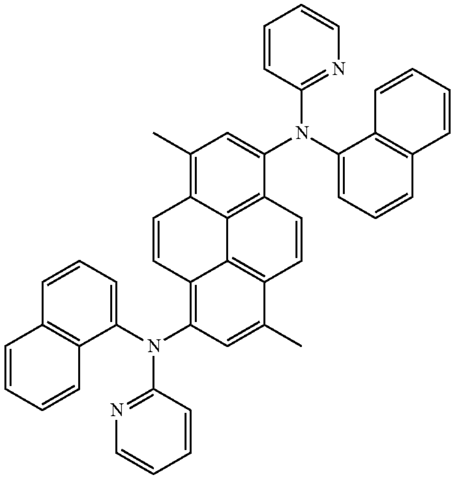

-continued
FD3
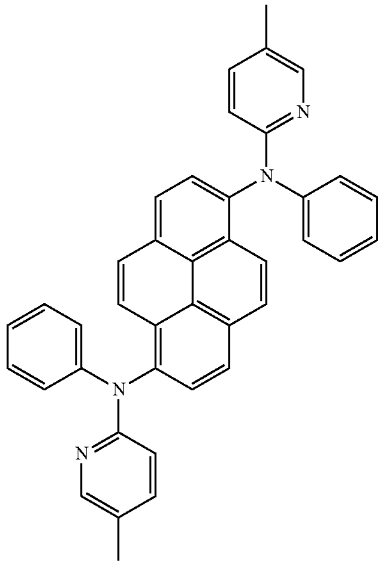
FD4
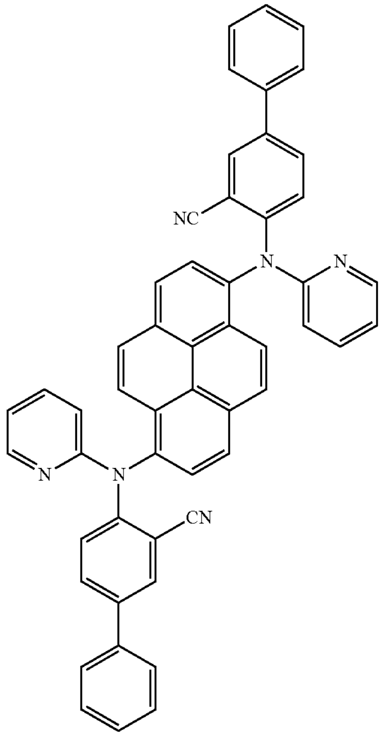
-continued
FD5
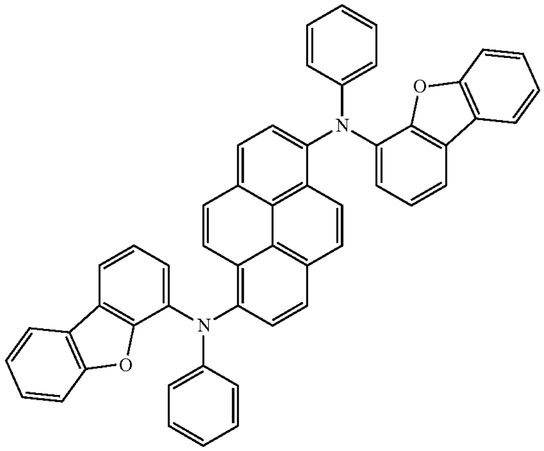
FD6
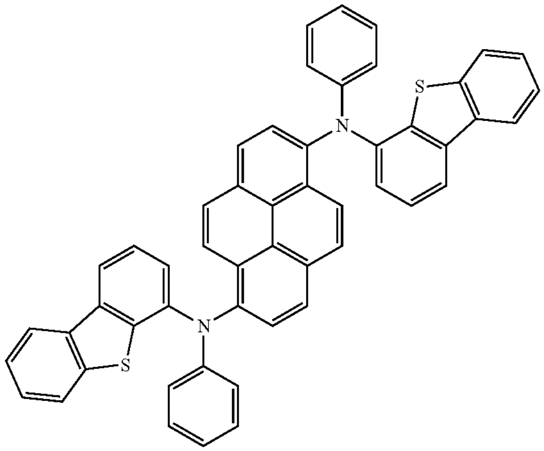
FD7
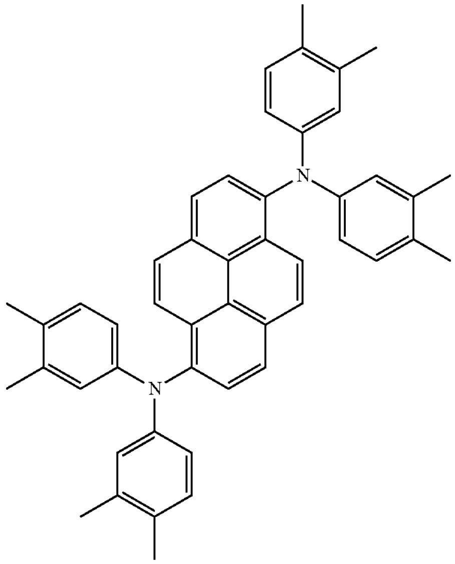

FD8
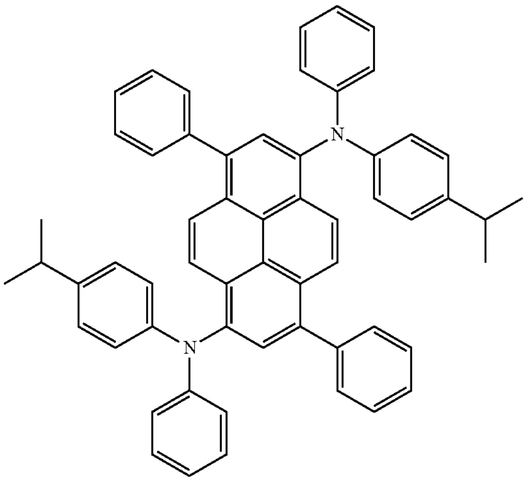
FD9
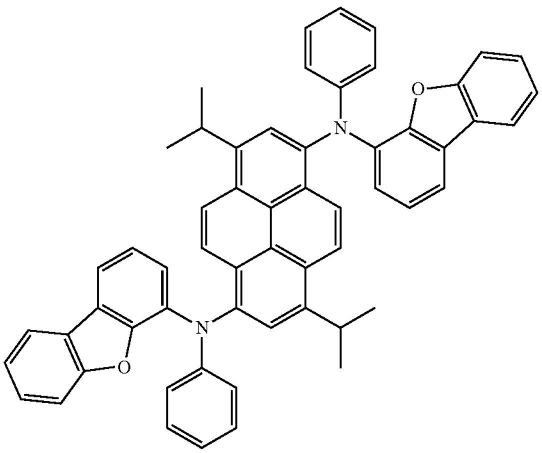
FD10
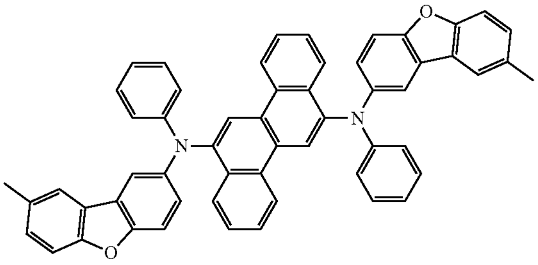
FD11
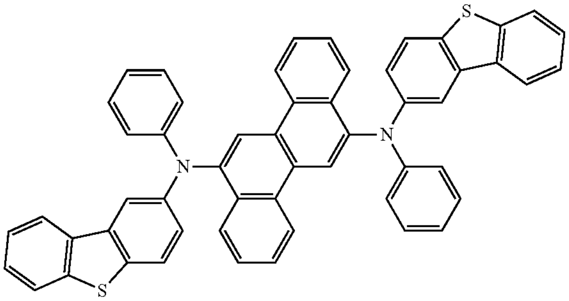
FD12
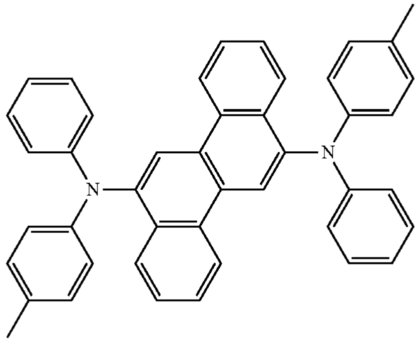
FD13
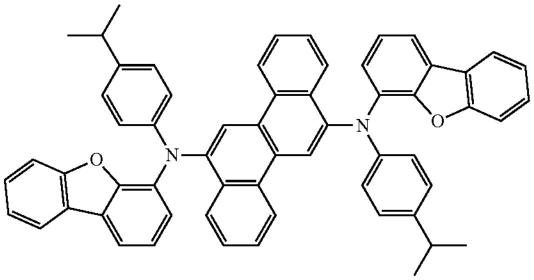
FD14
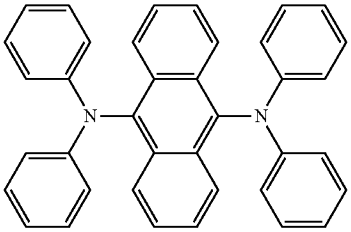
FD15
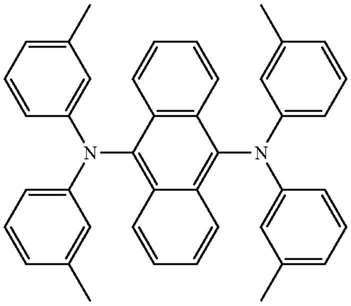
FD16
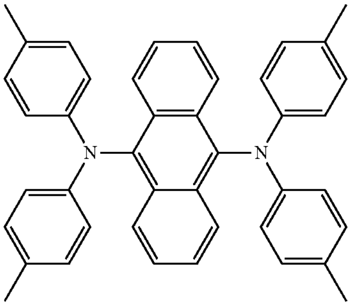

FD17
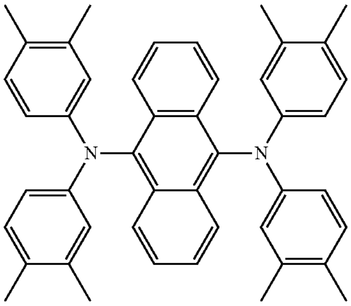
FD18
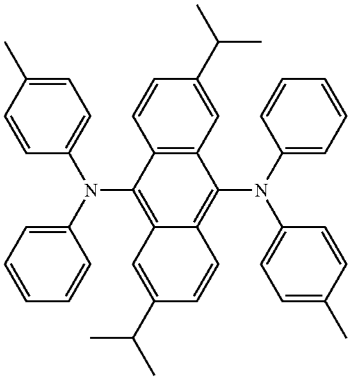
FD19
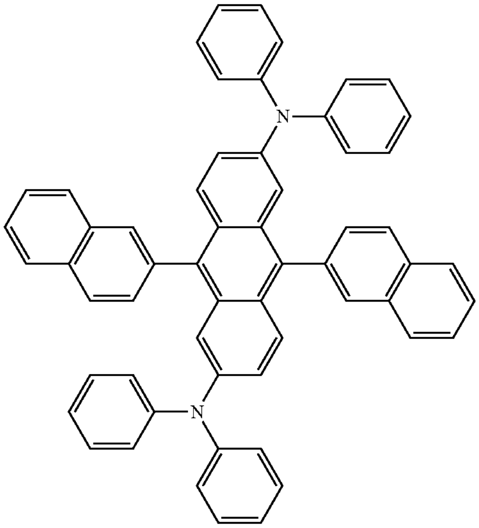
FD20
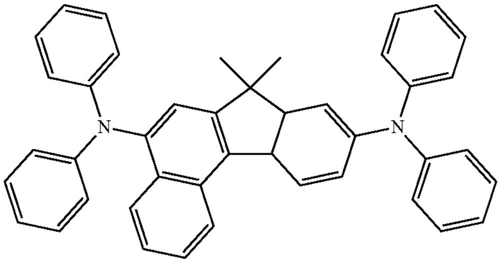
FD21
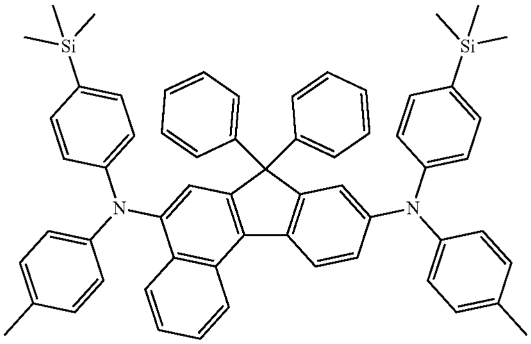
FD22
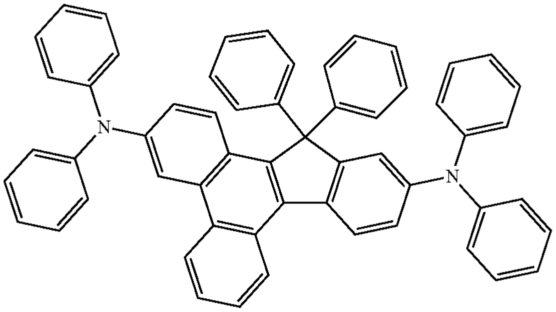
FD23
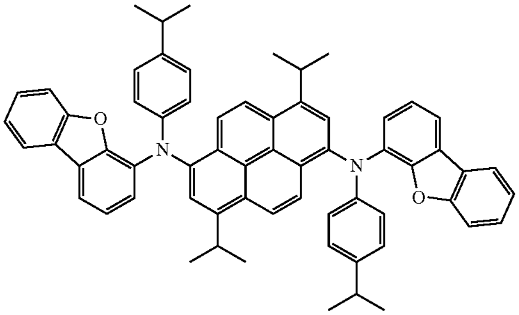
FD24
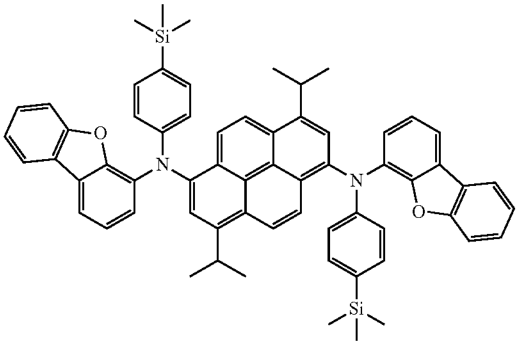

-continued
FD25
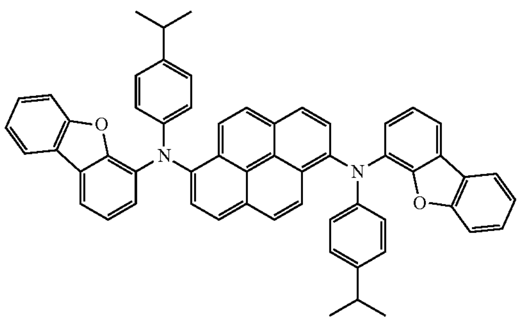
FD26
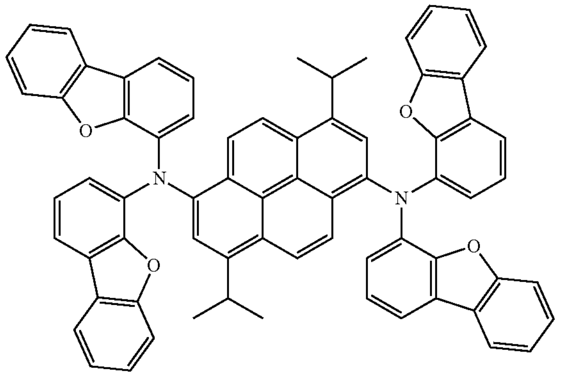
FD27
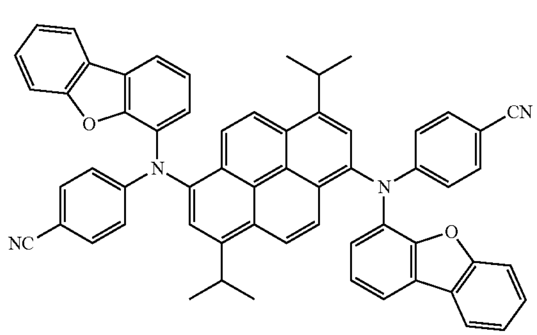
FD28
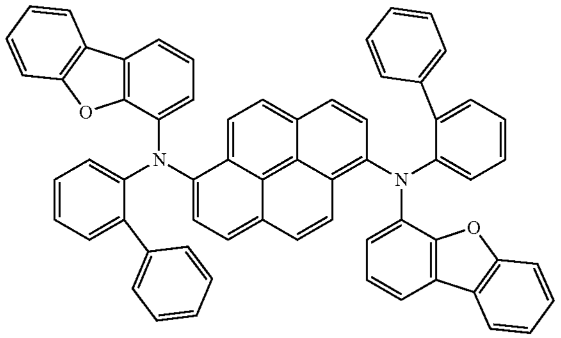
-continued
FD29
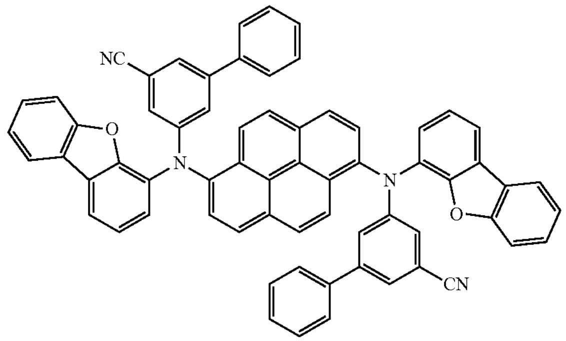
FD30
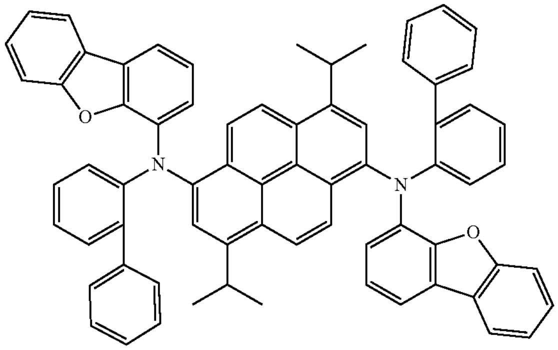
FD31
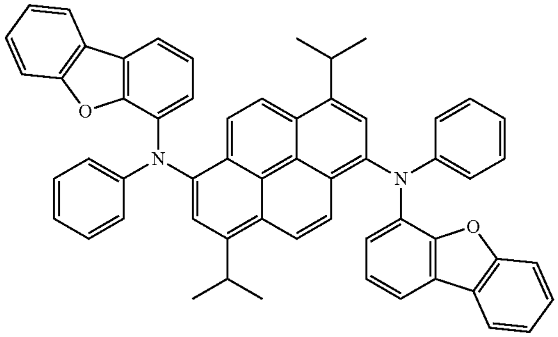
FD32
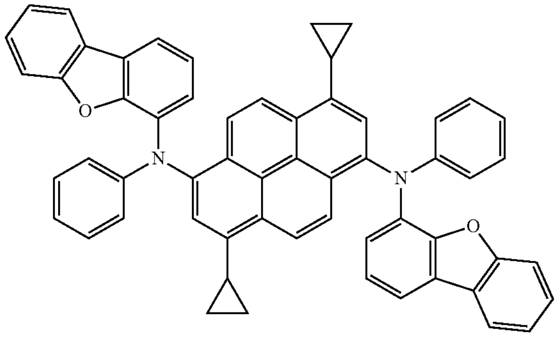

-continued

FD33

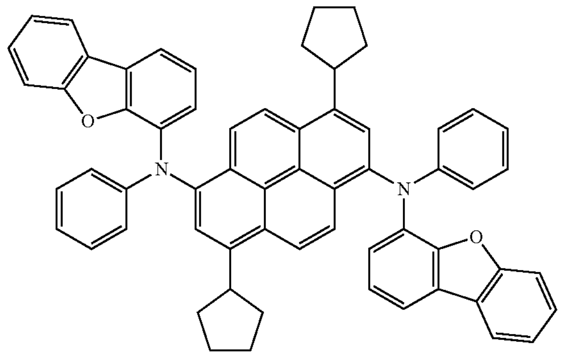

FD34

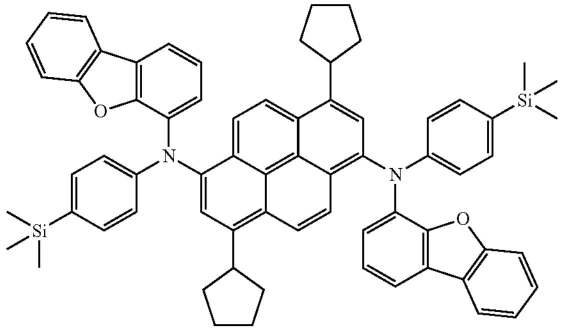

FD35

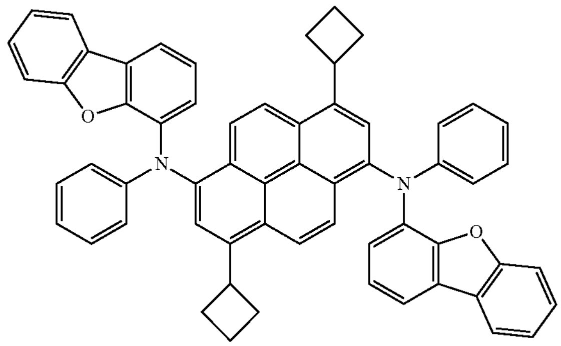

FD36

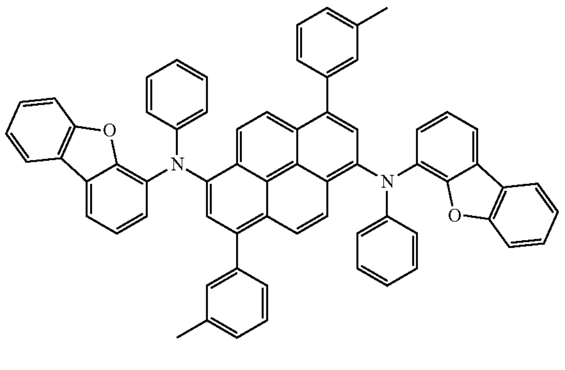

-continued

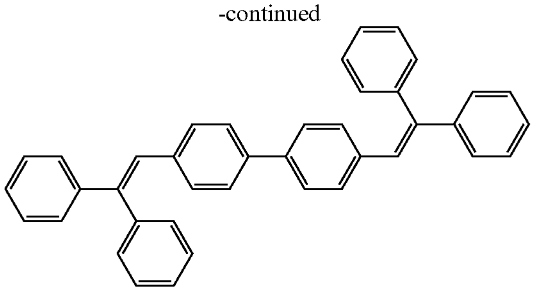

DPVBi

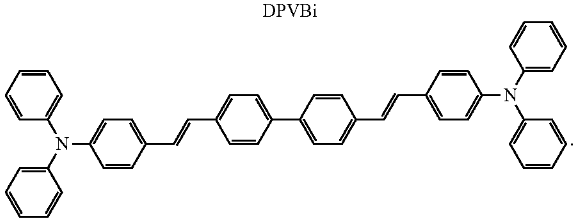

DPAVBi

[Delayed Fluorescence Material]

The emission layer 151 may include a delayed fluorescence material.

In the specification, the delayed fluorescence material may be selected from compounds capable of emitting delayed fluorescence by a delayed fluorescence emission mechanism.

The delayed fluorescence material included in the emission layer may serve as a host or as a dopant, depending on the type of other materials included in the emission layer.

In an embodiment, a difference between a triplet energy level (eV) of the delayed fluorescence material and a singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the ranges above, up-conversion from the triplet state to the singlet state of the delayed fluorescence materials may effectively occur, thereby improving luminescence efficiency or the like of the light-emitting device 10.

For example, the delayed fluorescence material may include a material including at least one electron donor (for example, a π electron-rich $C_3$-$C_{60}$ cyclic group and the like, such as a carbazole group) and at least one electron acceptor (for example, a sulfoxide group, a cyano group, a π electron-deficient nitrogen-containing $C_1$-$C_{60}$ cyclic group, and the like); or a material including a $C_8$-$C_{60}$ polycyclic group in which two or more cyclic groups are condensed while sharing boron (B).

Examples of the delayed fluorescence material may include at least one of Compounds DF1 to DF9:

DF1
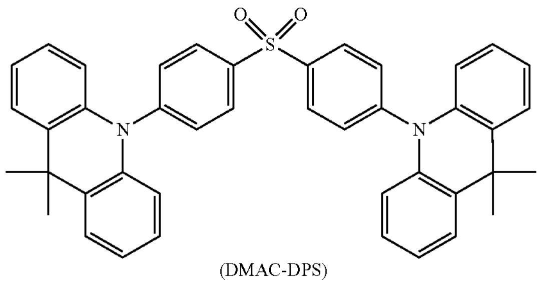
(DMAC-DPS)
DF2
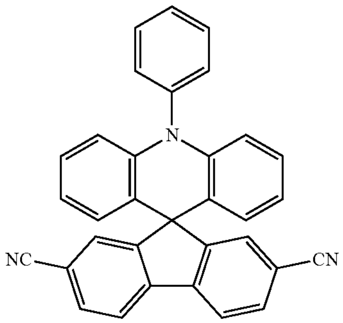
(ACRFLCN)
DF3
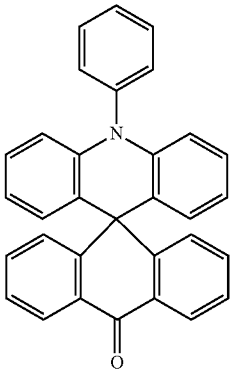
(ACRSA)
DF4
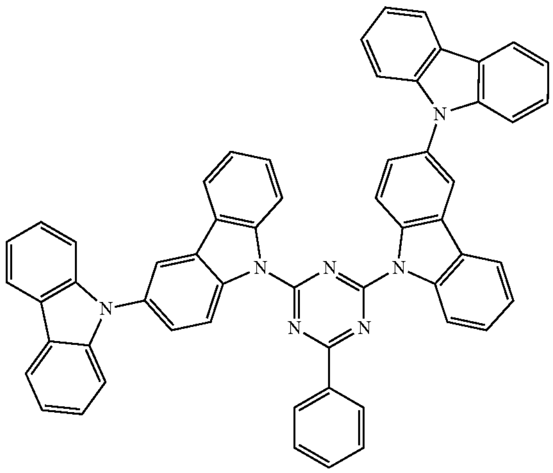
(CC2TA)
-continued
DF5
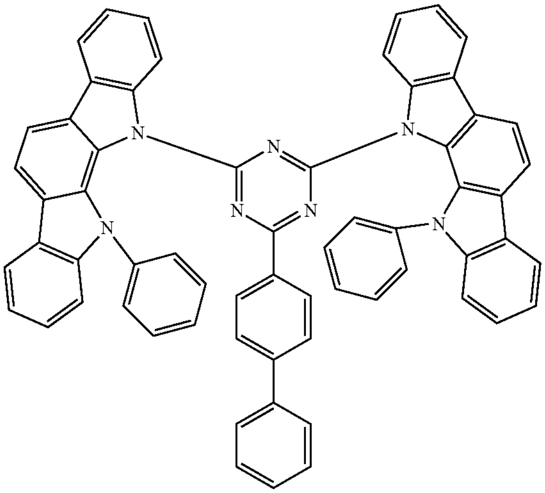
(PIC-TRZ)
DF6
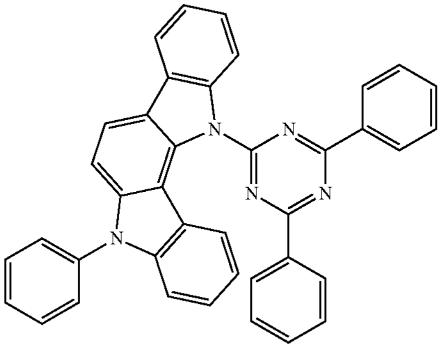
(PIC-TRZ2)
DF7
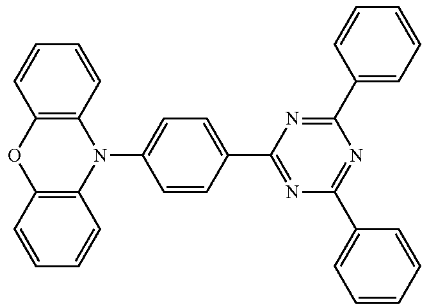
(PXZ-TRZ)
DF8
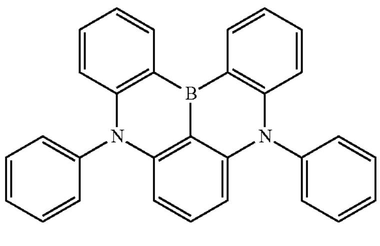
(DABNA-1)

-continued

DF9

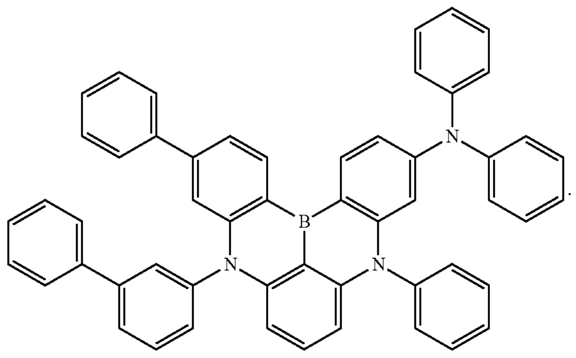

(DABNA-2)

[Quantum Dot]

The emission layer may include a quantum dot.

The term "quantum dot" as used herein may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which has lower costs, and may be more readily performed than vapor deposition methods, such as metal organic chemical vapor deposition (MOCVD) or molecular beam epitaxy (MBE).

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound, such as CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the Group III-V semiconductor compound may include: a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and the like; a quaternary compound, such as GaAlNP, GaAlNAs, GaAlNSb, GaAlPAs, GaAlPSb, GalnNP, GalnNAs, GalnNSb, GalnPAs, GalnPSb, InAlNP, InAlNAs, InAlNSb, InAlPAs, InAlPSb, and the like; or any combination thereof. The Group III-V semiconductor compound may further include a Group II element. Examples of the Group III-V semiconductor compound further including a Group II element are InZnP, InGaZnP, InAlZnP, and the like Examples of the Group III-VI semiconductor compound may include: a binary compound, such as GaS, GaSe, $GazSe_3$, GaTe, InS, InSe, $In_2S_3$, $In_2Se_3$, InTe, and the like; a ternary compound, such as $InGaS_3$, $InGaSe_3$, and the like; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, $AgAlO_2$, and the like; or any combination thereof.

Examples of the Group IV-VI semiconductor compound may include: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

Examples of the Group IV element or compound may include: a single element, such as Si, Ge, and the like; a binary compound, such as SiC, SiGe, and the like; or any combination thereof.

Each element included in a multi-element compound, such as a binary compound, a ternary compound, and a quaternary compound, may exist in a particle at a uniform concentration or at a non-uniform concentration.

The quantum dot may have a single structure or a core-shell structure. When the quantum dot has a single structure, a concentration of each element included in the corresponding quantum dot may be uniform. When the quantum dot has a core-shell structure, a material included in the core and a material included in the shell may be different from each other.

The shell of the quantum dot may serve as a protective layer that prevents chemical degeneration of the core to maintain semiconductor characteristics, and/or may serve as a charging layer that imparts electrophoretic characteristics to the quantum dot. The shell may be a single layer or a multi-layer. An element that is present at an interface between the core and the shell may have a concentration gradient in which the concentration of an element existing in the shell decreases toward the center of the core.

Examples of the shell of the quantum dot may include a metal oxide, a metalloid oxide, a non-metal oxide, a semiconductor compound, or any combination thereof. Examples of a metal oxide, a metalloid oxide, or a non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound, such as $MgAl_2O_4$, $CoFe_2O_4$, $NiFe_2O_4$, $CoMn_2O_4$, and the like; or any combination thereof. Examples of the semiconductor compound may include as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width of half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be increased. Light emitted through the quantum dot may be emitted in all directions, and thus, a wide viewing angle may be improved.

The quantum dot may be a spherical particle, a pyramidal particle, a multi-arm particle, a cubic particle, or the quantum dot may be in the form of nanoparticles, nanotubes, nanowires, nanofibers, or nanoplates.

Since the energy band gap may be adjusted by controlling the size of the quantum dot, light having various wavelength bands may be obtained from the emission layer including the quantum dot. Accordingly, by using quantum dots of different sizes, a light-emitting device that emits light of various wavelengths may be implemented. The size of the quantum dot may be selected in consideration of emitting red light, green light, and/or blue light. The size of the quantum dot may be configured so that the quantum dot may emit white light by combination of light of various colors.

[Electron Transport Region 160 in Interlayer 150]

The electron transport region 160 may include the electron transport layer 161 and the electron injection layer 162. The descriptions of the electron transport layer 161 and the electron injection layer 162 may be the same as provided herein.

The electron transport region 160 may have a structure consisting of a layer consisting of a single material, a structure consisting of a layer consisting of different materials, or a structure including multiple layers including different materials.

In an embodiment, the electron transport region 160 may include a buffer layer, a hole blocking layer, an electron control layer, or any combination thereof.

For example, the electron transport region 160 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituent layers of each structure are stacked from the emission layer 150 in its respective stated order, but the structure of the electron transport region is not limited thereto.

In embodiments, the electron transport layer 161 may include the first material and the second material.

In embodiments, the electron injection layer 162 may include the third material and the fourth material.

In an embodiment, the electron transport region 160 (for example, a buffer layer, a hole-blocking layer, or an electron control layer of the electron transport region 160) may include, in addition to the first material to the fourth material, a metal-free compound including at least one π electron-deficient nitrogen-containing $C_1$-$C_{60}$ cyclic group.

For example, the electron transport region 160 may include a compound represented by Formula 601:

$$[Ar_{601}]_{xe11}\text{-}[(L_{601})_{xe1}\text{-}R_{601}]_{xe21} \quad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$ may be bonded together via a single bond.

In embodiments, $Ar_{601}$ in Formula 601 may be a substituted or unsubstituted anthracene group.

In embodiments, the electron transport region may include a compound represented by Formula 601-1:

[Formula 601-1]

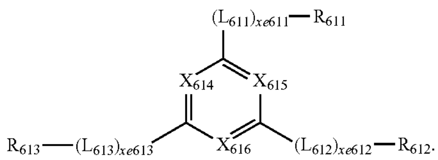

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1
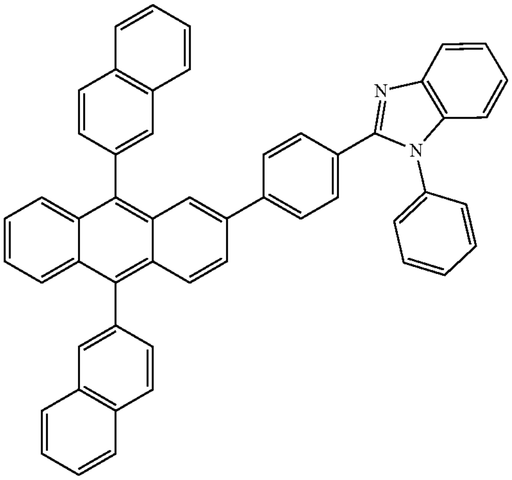
ET2
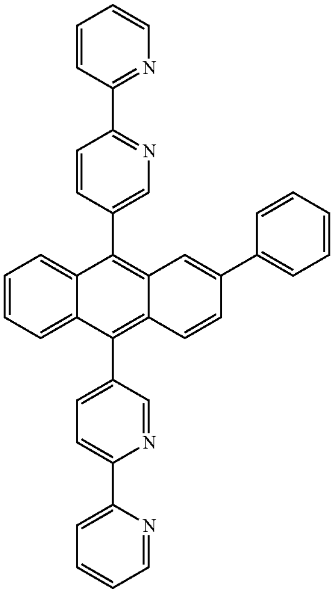
ET3
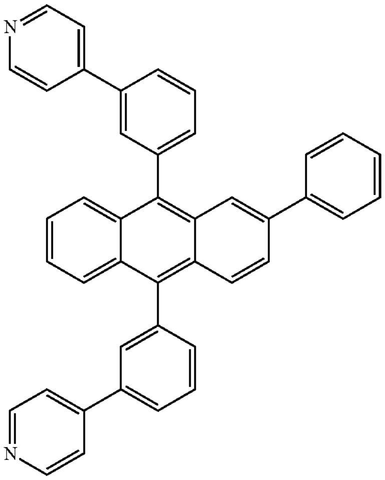
-continued
ET4
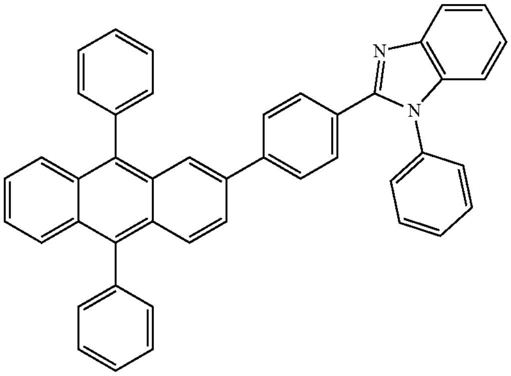
ET5
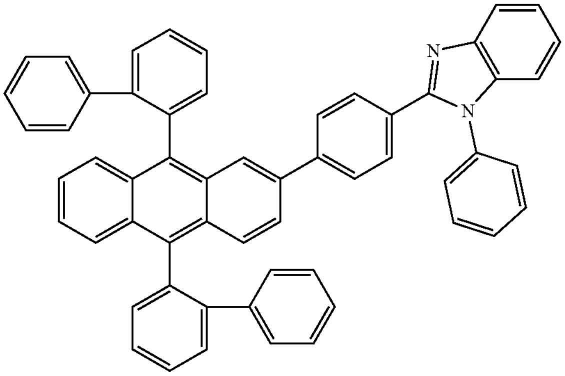
ET6
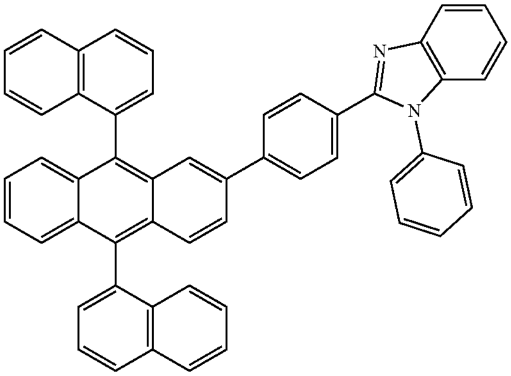
ET7
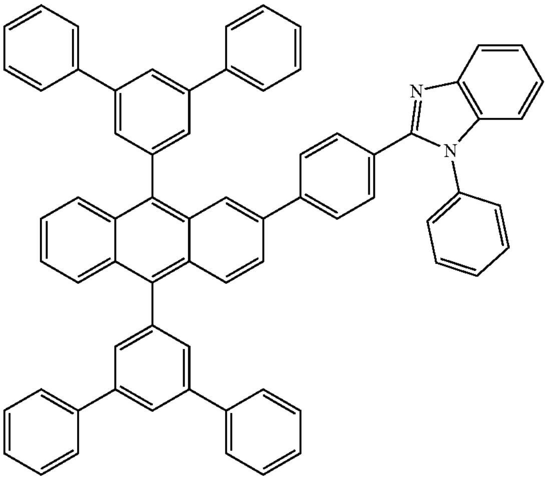

-continued
ET8
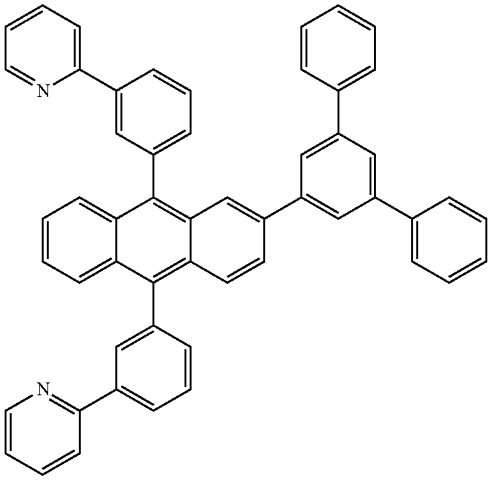
ET9
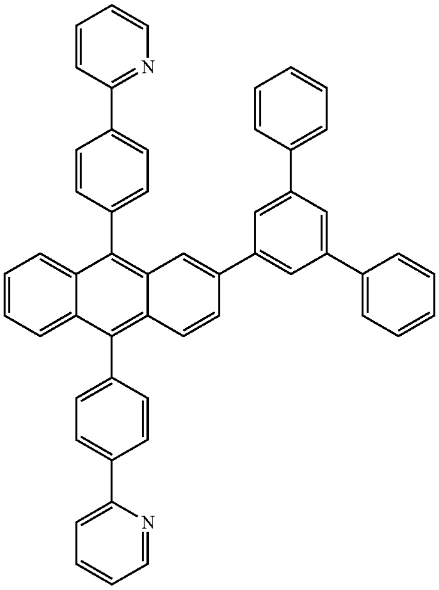
ET10
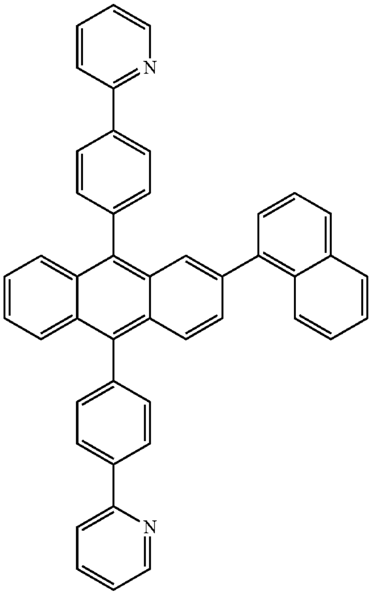
-continued
ET11
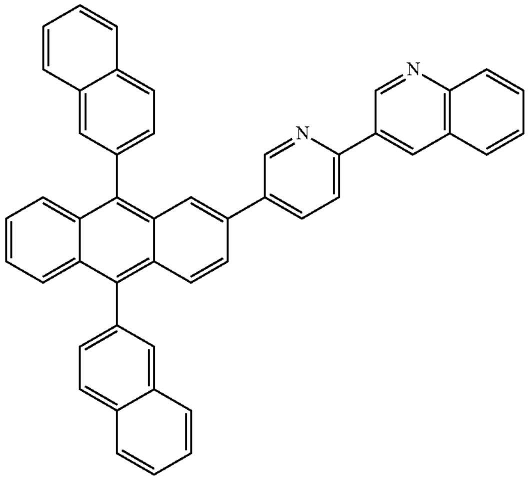
ET12
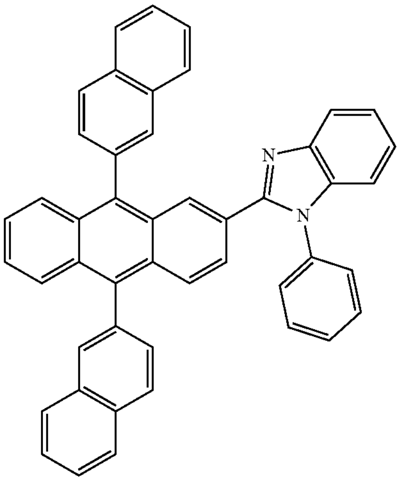
ET13
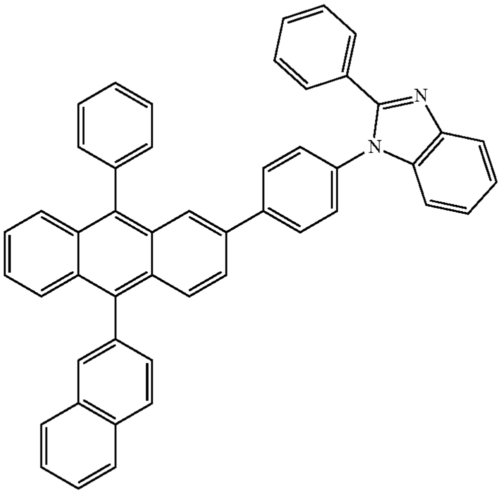

-continued
ET14
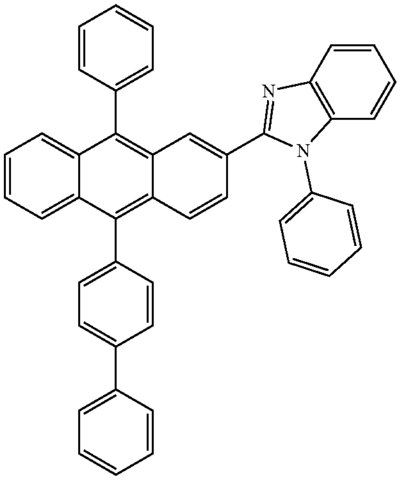
ET15
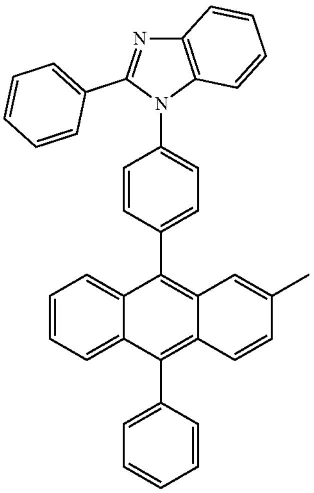
ET16
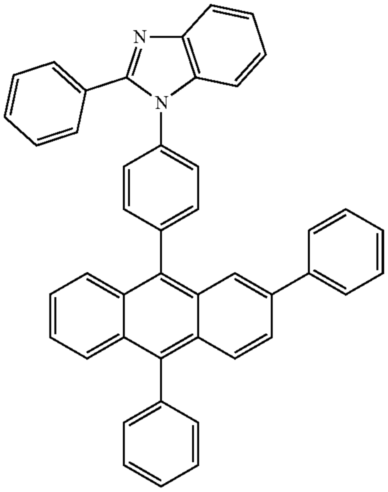
-continued
ET17
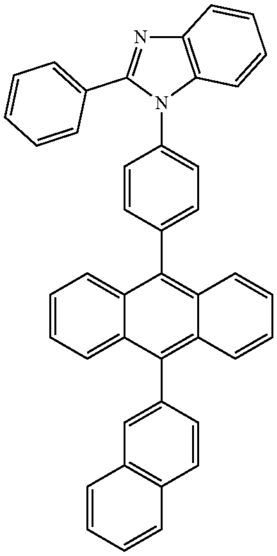
ET18
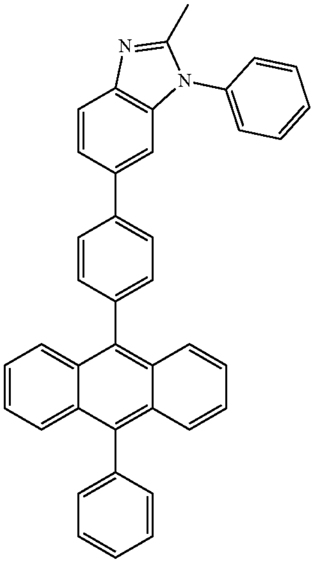
ET19
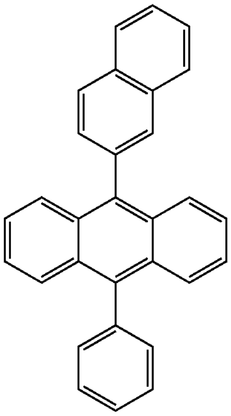

-continued
ET20
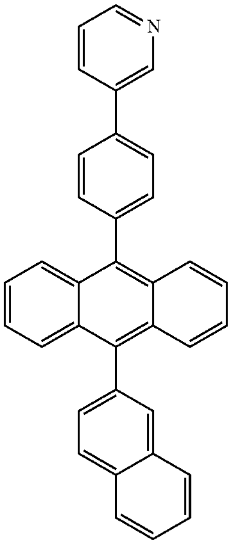
ET21
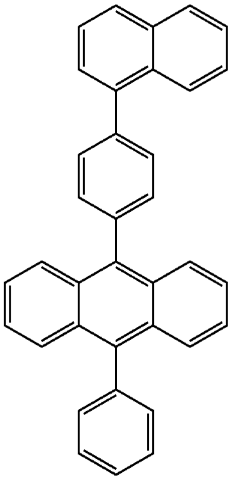
ET22
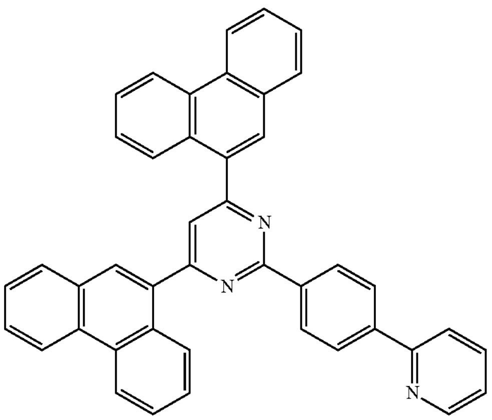
-continued
ET23
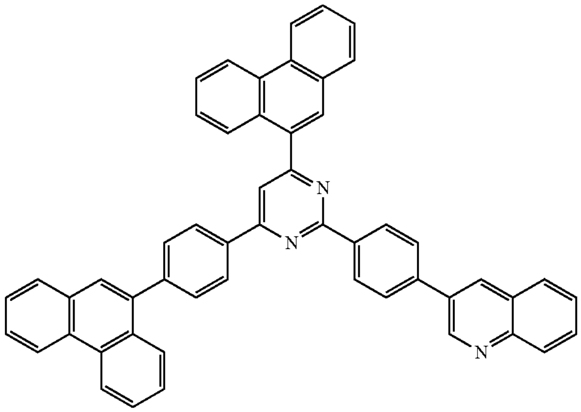
ET24
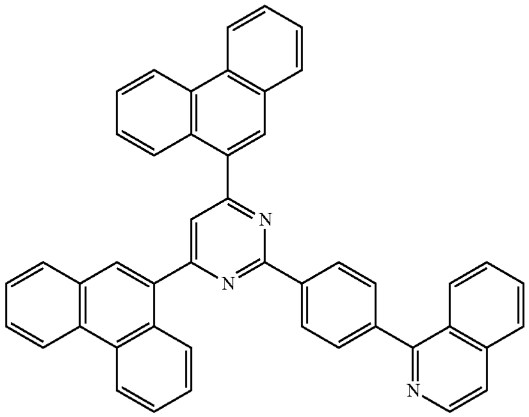
ET25
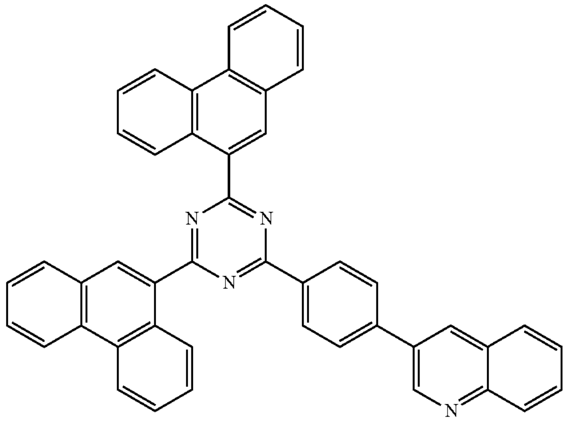

-continued
ET26
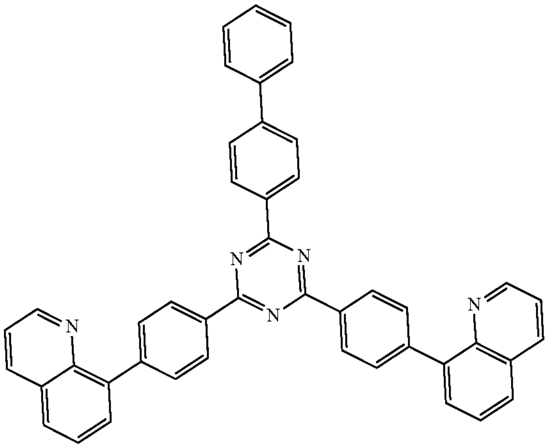
ET27
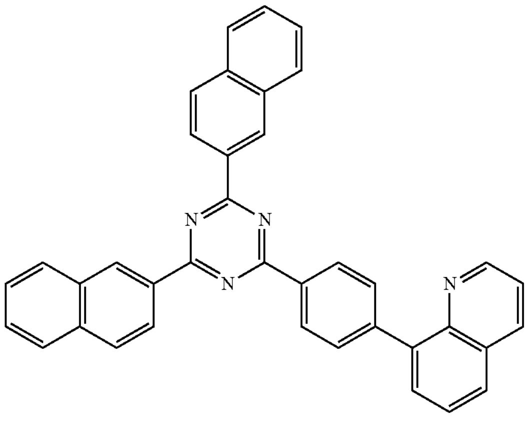
ET28
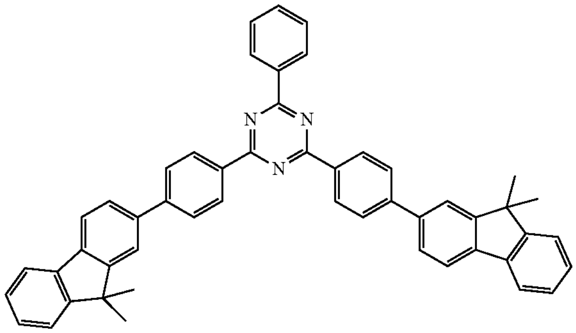
-continued
ET29
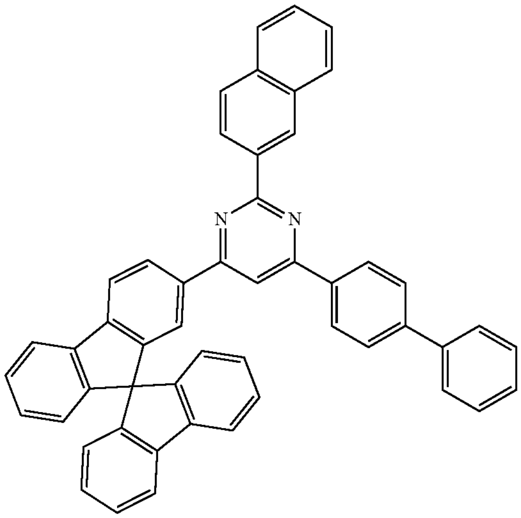
ET30
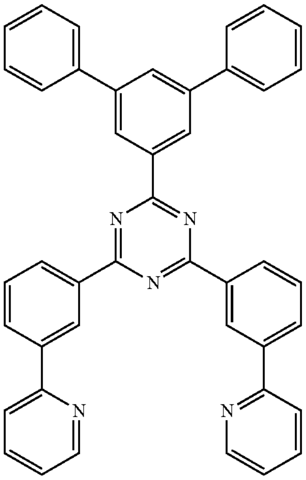
ET31
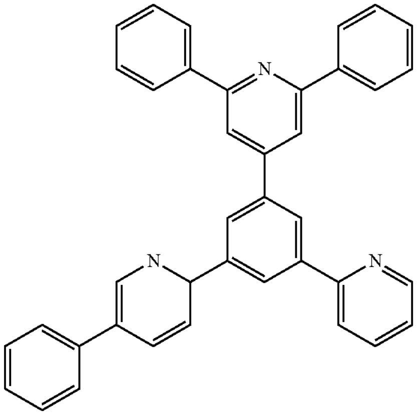

-continued
ET32
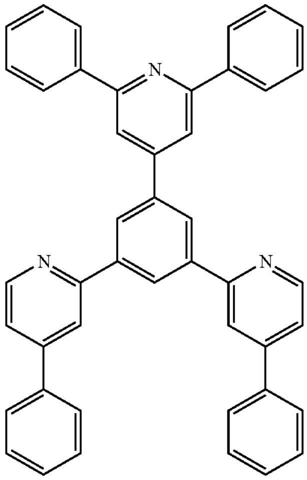
ET33
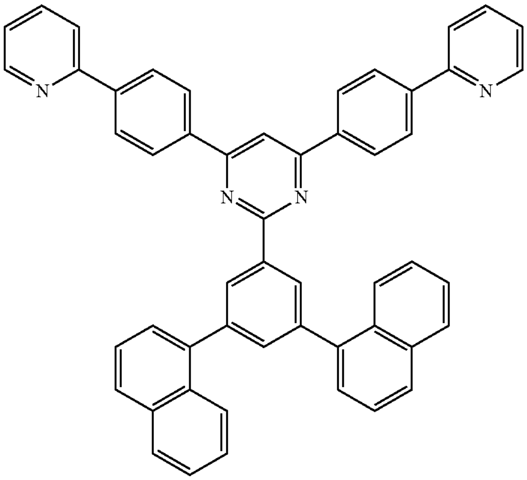
ET34
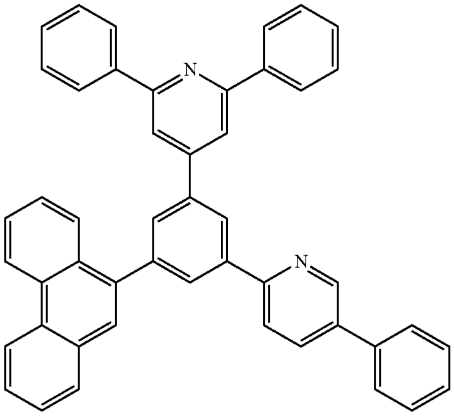
-continued
ET35
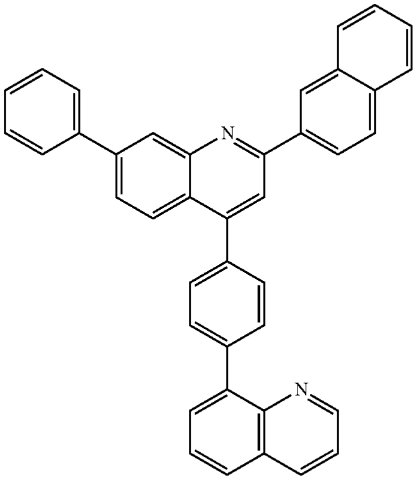
ET36
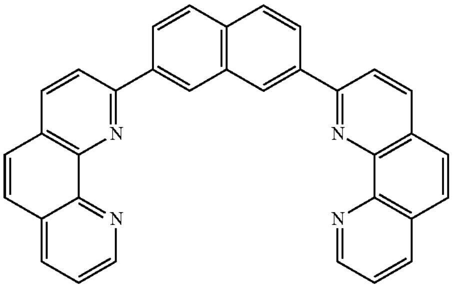
ET37
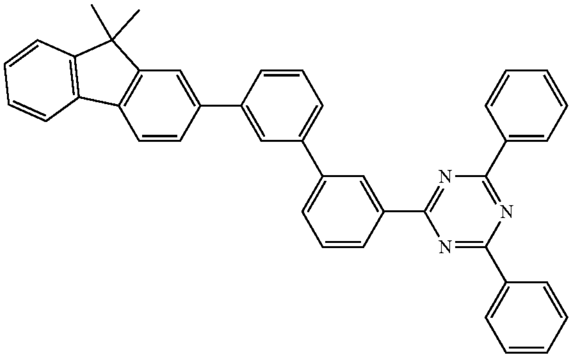
ET38
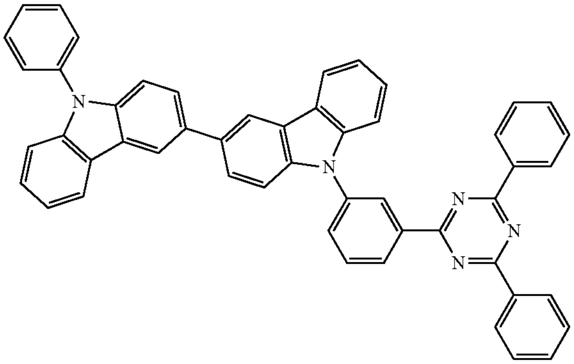

-continued
ET39
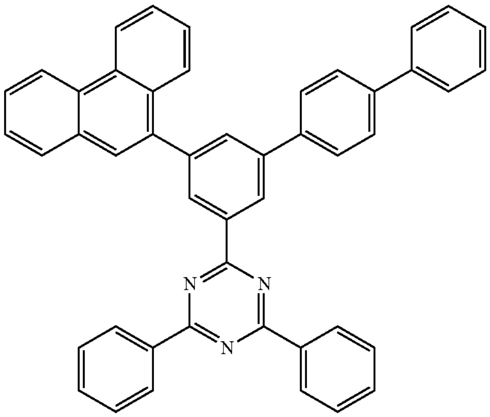
ET40
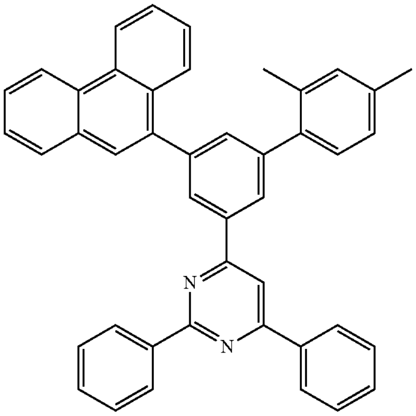
ET41
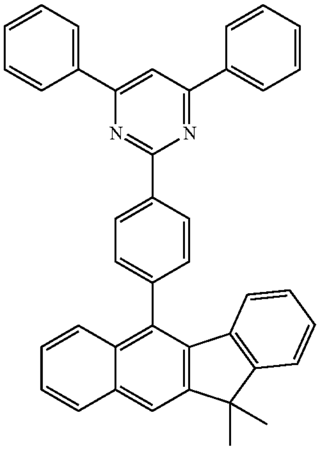
-continued
ET42
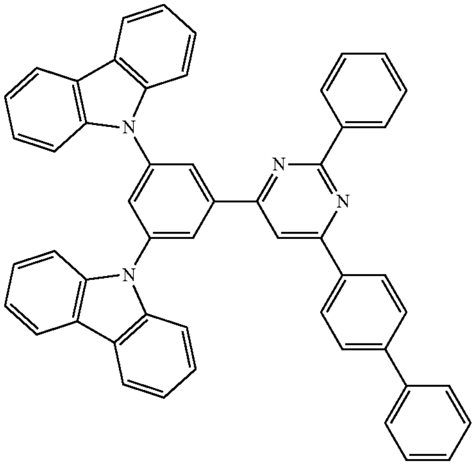
ET43
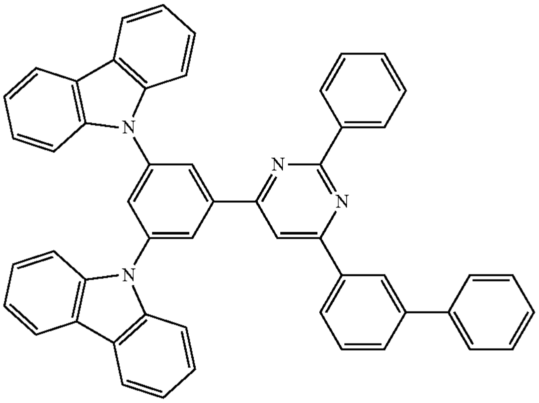
ET44
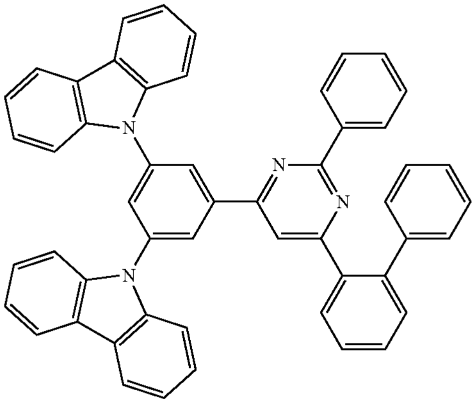
ET45
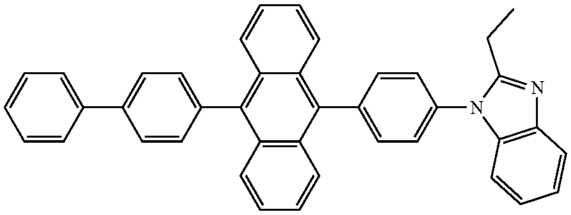

-continued

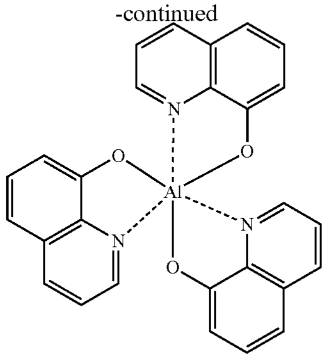

Alq3

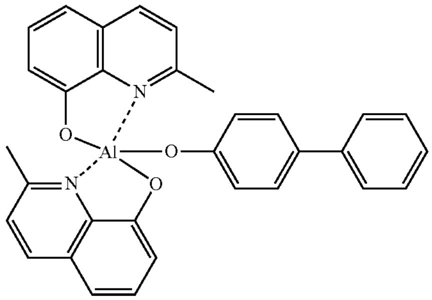

BAlq

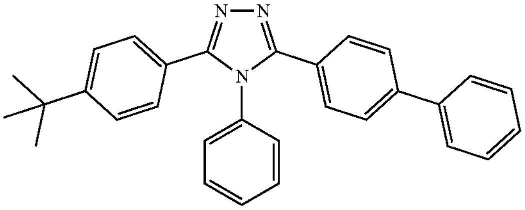

TAZ

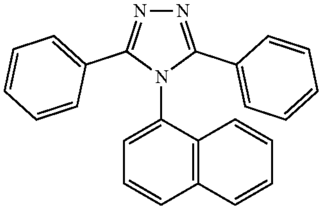

NTAZ .

A thickness of the electron transport region 160 may be in a range of about 100 Å to about 5,000 Å. For example, the thickness of the electron transport region 160 may be in a range of about 100 Å to about 4,000 Å. When the electron transport region 160 includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer 161 may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer 161 may be in a range of about 150 Å to about 500 Å. When the thicknesses of the buffer layer, the hole blocking layer, the electron control layer, the electron transport layer 161, and/or the electron transport region 160 are within these ranges, satisfactory electron transporting characteristics may be obtained without a substantial increase in driving voltage.

The electron transport region 160 (for example, an electron transport layer 161 in the electron transport region 160) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

ET-D1

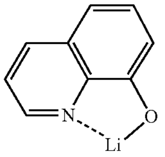

ET-D2

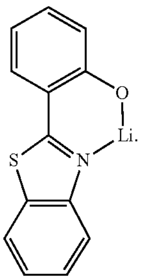

The electron transport region 160 may include the electron injection layer 162 that facilitates the injection of electrons from the second electrode 190. The electron injection layer 162 and the second electrode 190 may directly contact each other.

The electron injection layer 162 may have a structure consisting of a layer consisting of a single material, a structure consisting of a layer consisting of different materials, or a structure including multiple layers including different materials.

The electron injection layer 162 may include an alkali metal, an alkaline earth metal, a rare earth metal, an alkali metal-containing compound, am alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, iodides, and the like), or tellurides of the alkali metal, the alkaline earth metal, and the rare earth metal, or any combination thereof.

The alkali metal-containing compound may include: alkali metal oxides, such as $Li_2O$, $Cs_2O$, $K_2O$, and the like; alkali metal halides, such as LiF, NaF, CsF, KF, LiI, NaI, CsI, KI, and the like; or any combination thereof. The alkaline earth metal-containing compound may include an alkaline earth metal compound, such as BaO, SrO, CaO, $Ba_xSr_{1-x}O$ (wherein x is a real number satisfying the condition of 0<x<1), $Ba_xCa_{1-x}O$ (wherein x is a real number satisfying the condition of 0<x<1), or the like. The rare earth metal-containing compound may include $YbF_3$, $ScF_3$, $SC_2O_3$, $Y_2O_3$, $Ce_2O_3$, $GdF_3$, $TbF_3$, $YbI_3$, $ScI_3$, $TbI_3$, or any combination thereof. For example, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $CezTe_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, Luz $Te_3$, and the like.

The alkali metal complex, the alkaline earth-metal complex, and the rare earth metal complex may include one of the alkali metal, ions of the alkaline earth metal, and ions of the rare earth metal, and a ligand bonded to the metal ion, for example, a hydroxyquinoline, a hydroxyisoquinoline, a hydroxybenzoquinoline, a hydroxyacridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

In an embodiment, the electron injection layer 162 may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer 162 may further include an organic material (for example, the compound represented by Formula 601).

In embodiments, the electron injection layer 162 may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. In embodiments, the electron injection layer 162 may be a KI:Yb co-deposited layer, an RbI:Yb co-deposited layer, and the like.

When the electron injection layer 162 further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer 162 may be in a range of about 1 Å to about 100 Å. For example, thickness of the electron injection layer 162 may be in a range of about 3 Å to about 90 Å. When the thickness of the electron injection layer 162 is within these ranges, satisfactory electron injection characteristics may be obtained without a substantial increase in driving voltage.

[Second Electrode 190]

The second electrode 190 is on the interlayer 150 having such a structure as described above. The second electrode 190 may be a cathode, which is an electron injection electrode. The second electrode 190 may include a material having a low work function, for example, a metal, an alloy, an electrically conductive compound, or any combination thereof.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 190 may be a transmissive electrode, a semi-transmissive electrode, or a reflective electrode.

The second electrode 190 may have a single-layered structure or a multi-layered structure including two or more layers.

[Capping Layer]

A first capping layer may be arranged outside the first electrode 110, and/or a second capping layer may be arranged outside the second electrode 190. For example, the light-emitting device 10 may have a structure in which the first capping layer, the first electrode 110, the interlayer 150, and the second electrode 190 are stacked in this stated order, a structure in which the first electrode 110, the interlayer 150, the second electrode 190, and the second capping layer are stacked in this stated order, or a structure in which the first capping layer, the first electrode 110, the interlayer 150, the second electrode 190, and the second capping layer are stacked in this stated order.

In an embodiment, light generated in the emission layer 151 of the interlayer 150 of the light-emitting device 10 may be extracted toward the outside through the first electrode 110, which is a semi-transmissive electrode or a transmissive electrode, and through the first capping layer. In embodiments, light generated in the emission layer of the interlayer 150 of the light-emitting device 10 may be extracted toward the outside through the second electrode 190, which is a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 may be increased, so that the luminescence efficiency of the light-emitting device 10 may be also improved.

The first capping layer and the second capping layer may each include a material having a refractive index equal to or greater than about 1.6 (at a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

In an embodiment, at least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may each be optionally substituted with a substituent including O, N, S, Se, Si, F, Cl, Br, I, or any combination thereof.

In embodiments, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

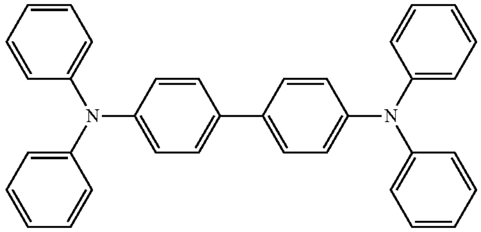

CP2

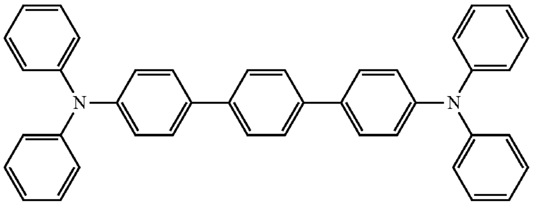

CP3

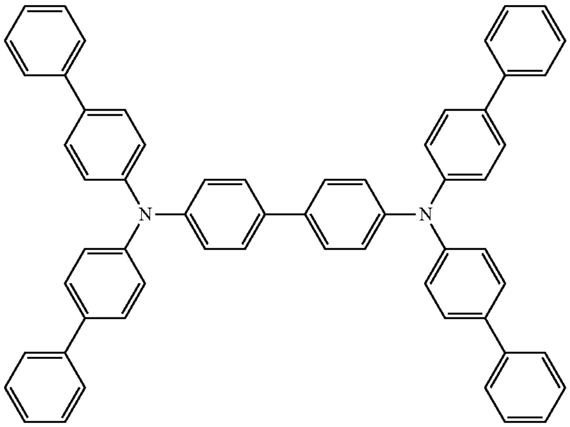

CP4

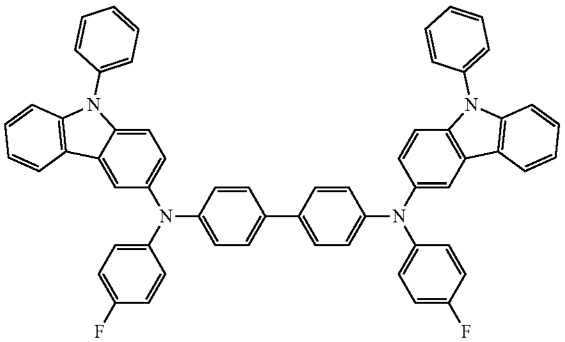

-continued

CP5

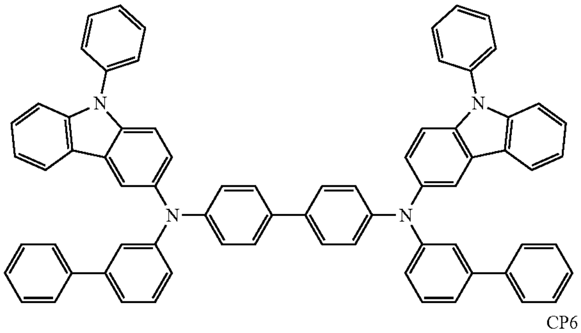

CP6

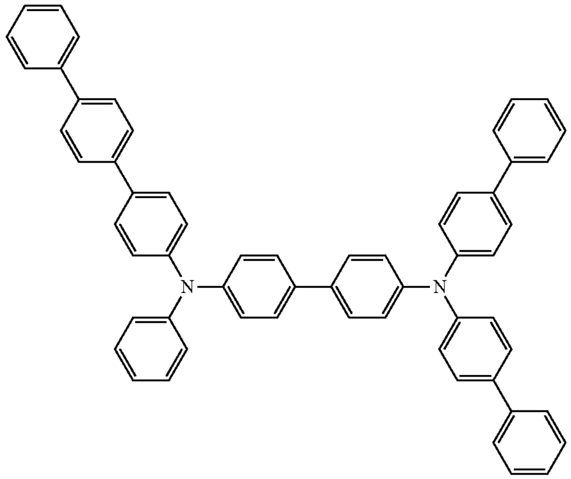

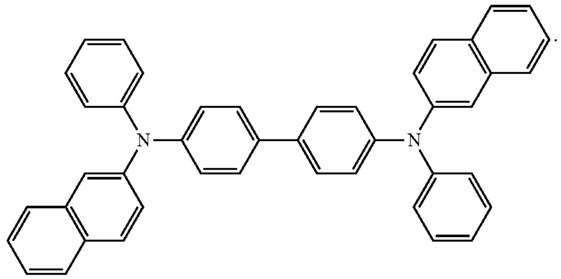

β-NPB

[Film]

The first material, the second material, the third material, the fourth material, or any combination thereof may be included in various films. Accordingly, another aspect of the disclosure provides a film including the first material, the second material, the third material, the fourth material, or any combination thereof. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, or the like), or a protective member (for example, an insulating layer, a dielectric layer, or the like).

[Electronic Apparatus]

The light-emitting device may be included in various electronic apparatuses. For example, an electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. For example, light emitted from the light-emitting device may be blue light or white light. Details for the light-emitting device may be the same as described herein. In an embodiment, the color conversion layer may include a quantum dot. The quantum dots may be, for example, the same as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be arranged between the subpixels to define each subpixel.

The color filter may further include color filter areas and light-shielding patterns arranged between the color filter areas, and the color conversion layer may further include color conversion areas and light-shielding patterns arranged between the color conversion areas.

The color filter areas (or the color conversion areas) may include a first area emitting first-color light, a second area emitting second-color light, and/or a third area emitting third-color light, wherein the first-color light, the second-color light, and/or the third-color light may have different maximum emission wavelengths from one another. For example, the first-color light may be red light, the second-color light may be green light, and the third-color light may be blue light. For example, the color filter areas (or the color conversion areas) may include quantum dots. For example, the first region may include red quantum dots, the second region may include green quantum dots, and the third region may not include quantum dots. Details for the quantum dots are the same as described herein. The first region, the second region, and/or the third region may each include a scatterer.

For example, the light-emitting device may emit first light, the first region may absorb the first light to emit first-first-color light, the second region may absorb the first light to emit second-first-color light, and the third region may absorb the first light to emit third-first-color light. The first-first-color light, the second-first-color light, and the third-first-color light may have different maximum emission wavelengths from each other. For example, the first light may be blue light, the first-first-color light may be red light, the second-first-color light may be green light, and the third-first-color light may be blue light.

The electronic apparatus may further include a thin-film transistor, in addition to the light-emitting device as described above. The thin-film transistor may include a source electrode, a drain electrode, and an active layer, wherein the source electrode or the drain electrode may be electrically connected to any one of the first electrode or the second electrode of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be arranged between the color conversion layer and/or color filter and the light-emitting device. The sealing portion may allow light from the light-emitting device to be extracted to the outside, and may simultaneously prevent ambient air and/or moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. Examples of the functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, and the like).

The authentication apparatus may further include, in addition to the light-emitting device as described above, a biometric information collector.

The electronic apparatus may be applied to various displays, such as light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
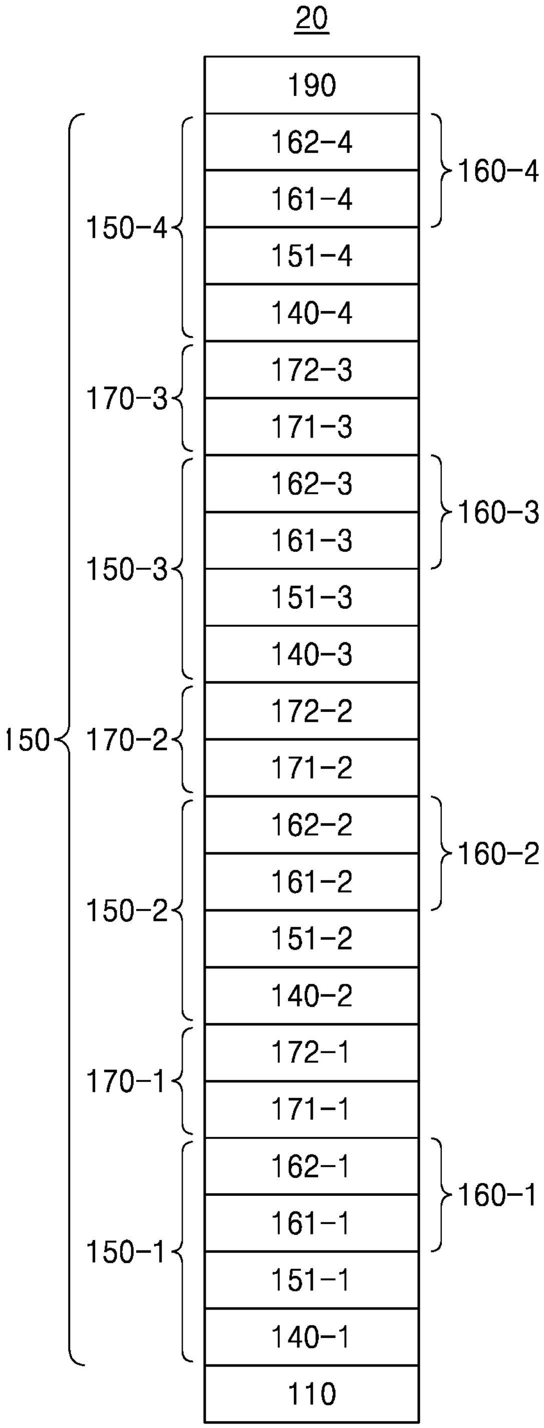
FIG. 2 is a schematic cross-sectional view of a structure of a light-emitting device according to an embodiment.

[Description of FIG. 2]

FIG. 2 is a schematic cross-sectional view of a light-emitting device 20 according to an embodiment. The light-emitting device 20 is an example of a light-emitting device in which the number m is 4, but embodiments are not limited thereto.

Referring to FIG. 2, the light-emitting device 20 includes the first electrode 110, the second electrode 190 facing the first electrode 110, and the interlayer 150. The interlayer 150 of the light-emitting device 20 may include, between the first electrode 110 and the second electrode 190, 4 emitting units 150-1, 150-2, 150-3, and 150-4, and 3 charge generation layers 170-1, 170-2, and 170-3.

The light-emitting device 20 may include a first emitting unit 150-1 closest to the first electrode 110, a fourth emitting unit 150-4 closest to the second electrode 190, a second emitting unit 150-2 between the first emitting unit 150-1 and the fourth emitting unit 150-4, and a third emitting unit 150-3 between the second emitting unit 150-2 and the fourth emitting unit 150-4.

For example, each of the first emitting unit 150-1 to the third emitting unit 150-3 may emit blue light, and the fourth emitting unit 150-4 may emit green light.

The light-emitting device 20 may include a first charge generation layer 170-1 between the first emitting unit 150-1 and the second emitting unit 150-2, a second charge generation layer 170-2 between the second emitting unit 150-2 and the third emitting unit 150-3, and a third charge generation layer 170-3 between the third emitting unit 150-3 and the fourth emitting unit 150-4.

The first emitting unit 150-1 may include a first hole transport region 140-1, a first emission layer 151-1, and a first electron transport region 160-1 that are sequentially arranged in this stated order. The first electron transport region 160-1 may include a first electron transport layer 161-1 and a first electron injection layer 162-1 that are sequentially arranged in this stated order.

The second emitting unit 150-2 may include a second hole transport region 140-2, a second emission layer 151-2, and a second electron transport region 160-2 that are sequentially arranged in this stated order. The second electron transport region 160-2 may include a second electron transport layer 161-2 and a second electron injection layer 162-2 that are sequentially arranged in this stated order.

The third emitting unit 150-3 may include a third hole transport region 140-3, a third emission layer 151-3, and a third electron transport region 160-3 that are sequentially arranged in this stated order. The third electron transport region 160-3 may include a third electron transport layer 161-3 and a third electron injection layer 162-3 that are sequentially arranged in this stated order.

The fourth emitting unit 150-4 may include a fourth hole transport region 140-4, a fourth emission layer 151-4, and a fourth electron transport region 160-4 that are sequentially arranged in this stated order. The fourth electron transport region 160-4 may include a fourth electron transport layer 161-4 and a fourth electron injection layer 162-4 that are sequentially arranged in this stated order.

As an example, FIG. 2 shows the light-emitting device 20 in which the first emitting unit 150-1, the second emitting unit 150-2, the third emitting unit 150-3, and the fourth emitting unit 150-4 include the first hole transport region to the fourth hole transport region 140-1, 140-2, 140-3, and 140-4, respectively, and the first electron transport region to the fourth electron transport region 160-1, 160-2, 160-3, and 160-4, respectively, wherein the first electron transport region to the fourth electron transport region 160-1, 160-2, 160-3, and 160-4 include the first electron transport layer to the fourth electron transport layer 161-1, 161-2, 161-3, and 161-4, respectively, and the first electron injection layer to the fourth electron injection layer 162-1, 162-2, 162-3, and 162-4, respectively. However, embodiments are not limited thereto.

The first electron transport region to the fourth electron transport region 160-1, 160-2, 160-3, and 160-4 may each independently further include a buffer layer, a hole blocking layer, an electron control layer, or any combination thereof. For example, the first electron transport region 160-1 may have a first electron transport layer 161-1/first electron injection layer 161-2 structure, a first hole blocking layer (not shown)/first electron transport layer 161-1/first electron injection layer 161-2 structure, a first electron control layer (not shown)/first electron transport layer 161-1/first electron injection layer 161-2 structure, or a first buffer layer (not shown)/first electron transport layer 161-1/first electron injection layer 161-2 structure, wherein constituent layers of each structure are sequentially stacked between the first emission layer 151-1 included in the first emitting unit 150-1 and the first charge generation layer 170-1.

The first electron transport layer 161-1 may include the first material and the second material (for example, a first-first material and a second-first material), and the first electron injection layer 162-1 may include the third material and the fourth material (for example, a third-first material and a fourth-first material); the second electron transport layer 161-2 may include the first material and the second material (for example, a first-second material and a second-second material), and the second electron injection layer 162-2 may include the third material and the fourth material (for example, a third-second material and a fourth-second material); the third electron transport layer 161-3 may include the first material and the second material (for example, a first-third material and a second-third material), and the third electron injection layer 162-3 may include the third material and the fourth material (for example, a third-third material and a fourth-third material); the fourth electron transport layer 161-4 may include the first material and the second material (for example, a first-fourth material and a second-fourth material), and the fourth electron injection layer 162-4 may include the third material and the fourth material (for example, a third-fourth material and a fourth-fourth material); or any combination thereof.

The first-first material, the first-second material, the first-third material, and the first-fourth material may be identical to or different from each other.

The second-first material, the second-second material, the second-third material, and the second-fourth material may be identical to or different from each other.

The third-first material, the third-second material, the third-third material, and the third-fourth material may be identical to or different from each other.

The fourth-first material, the fourth-second material, the fourth-third material, and the fourth-fourth material may be identical to or different from each other.

The first charge generation layer 170-1 may include a first n-type charge generation layer 171-1 and a first p-type charge generation layer 172-1. The first n-type charge generation layer 171-1 and the first p-type charge generation layer 172-1 may directly contact each other.

The second charge generation layer 170-2 may include a second n-type charge generation layer 171-2 and a second p-type charge generation layer 172-2. The second n-type charge generation layer 171-2 and the second p-type charge generation layer 172-2 may directly contact each other.

The third charge generation layer 170-3 may include a third n-type charge generation layer 171-3 and a third p-type charge generation layer 172-3. The third n-type charge generation layer 171-3 and the third p-type charge generation layer 172-3 may directly contact each other.

The first charge generation layer 170-1 to the third charge generation layer 170-3 may be identical to or different from each other.

Figure 3:
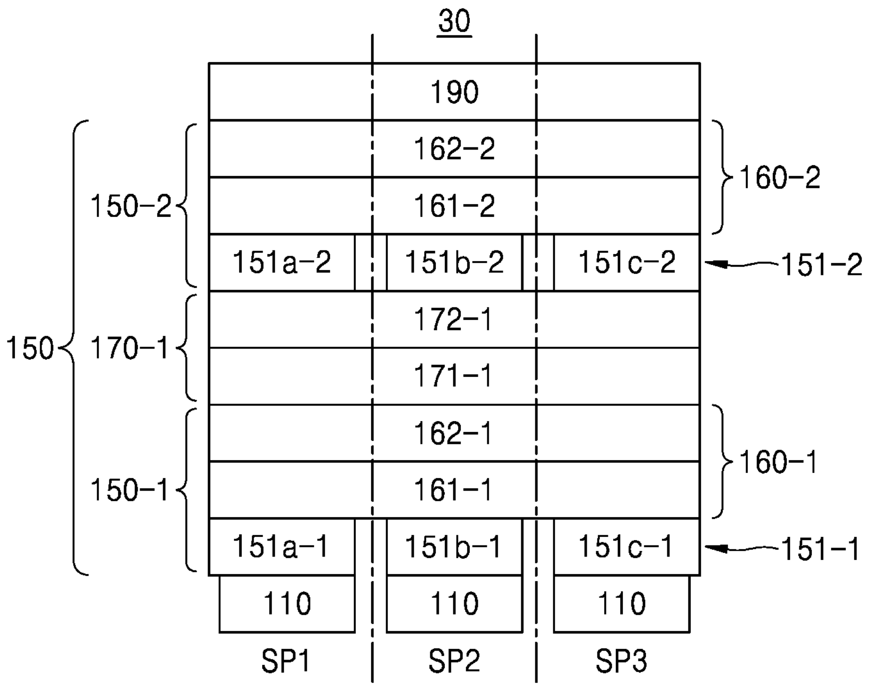
FIG. 3 is a schematic cross-sectional view of a structure of a light-emitting device according to an embodiment.

[Description of FIG. 3]

FIG. 3 shows a schematic cross-sectional view of a light-emitting device 30 according to an embodiment. The light-emitting device 30 is an example of a light-emitting device in which the number, m, is 2, but embodiments are not limited thereto. Among components of FIG. 3, the components already shown in FIG. 2 may have the same or similar functions to each other, and thus, detailed descriptions thereof will be omitted with respect to FIG. 3.

Referring to FIG. 3, the light-emitting device 30 includes: first electrodes 110 arranged for each of a first subpixel SP1, a second subpixel SP2, and a third subpixel SP3; the second electrode 190 facing the first electrodes 110; and the interlayer 150. The interlayer 150 of the light-emitting device 30 may include, between the second electrode 190 and the first electrodes 110, 2 emitting units 150-1 and 150-2 and 1 charge generation layer 170-1.

The first emitting unit 150-1 may include the first emission layer 151-1 and the first electron transport region 160-1 that are sequentially arranged.

The first emission layer 151-1 may include a first-first emission layer 151_a_-1 arranged on the first subpixel SP1 and emitting first-first-color light, a second-first emission layer **151*b*-1 arranged on the second subpixel SP2 and emitting second-first-color light, and a third-first emission layer 151*c*-1 arranged on the third subpixel SP3** and emitting third-first-color light. The first-first-color light may be red light, the second-first-color light may be green light, and the third-first-color light may be blue light.

The second emitting unit 150-2 may include the second emission layer 151-2 and the second electron transport region 160-2 that are sequentially arranged.

The second emission layer 151-2 may include a first-second emission layer **151*a*-2 arranged on the first subpixel SP1 and emitting first-second-color light, a second-second emission layer 151*b*-2 arranged on the second subpixel SP2 and emitting second-second-color light, and a third-second emission layer 151*c*-2 arranged on the third subpixel SP3** and emitting third-second-color light. In an embodiment, the first-second-color light may be red light, the second-second-color light may be green light, and the third-second-color light may be blue light.

Although not shown in FIG. 3, each of the two emitting units 150-1 and 150-2 of the light-emitting device 30 may further include a hole transport region. For example, when the first emitting unit 150-1 further includes a first hole transport region, the first hole transport region may be arranged in the form of a common layer between the first electrodes 110 and the first emission layer 151-1 including the first-first emission layer **151*a*-1, the second-first emission layer 151*b*-1, and the third-first emission layer 151*c*-1**.

Figure 4:
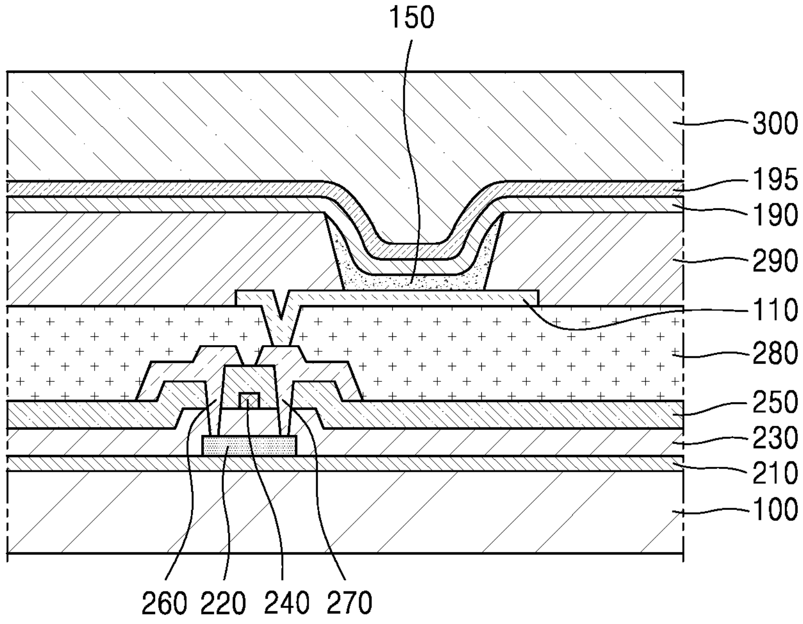
FIG. 4 is a schematic cross-sectional view of a structure of an electronic apparatus according to an embodiment.
Figure 5:
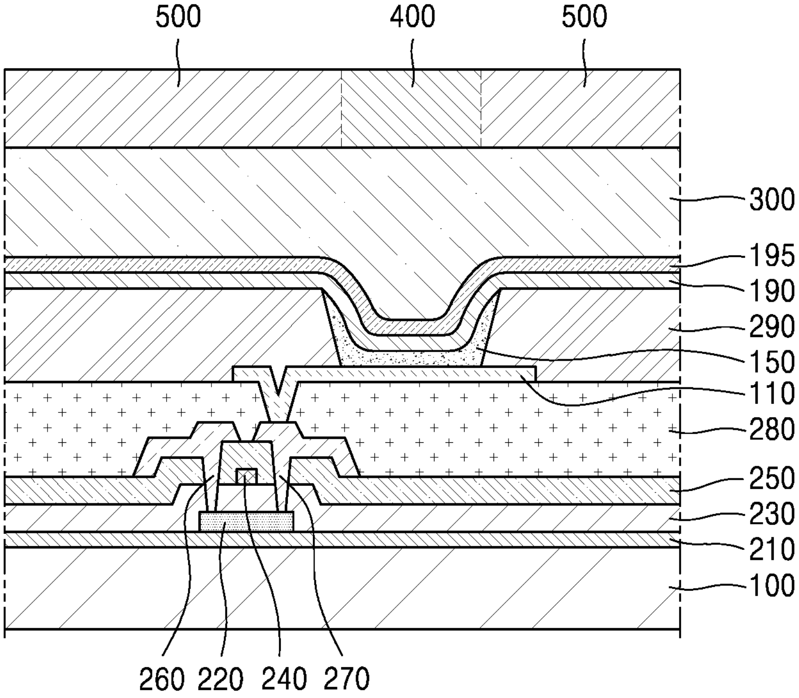
FIG. 5 is a schematic cross-sectional view of a structure of an electronic apparatus according to another embodiment.

[Descriptions of FIGS. 4 and 5]

FIG. 4 is a schematic cross-sectional view showing an electronic apparatus according to an embodiment.

The light-emitting apparatus of FIG. 4 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent penetration of impurities through the substrate 100 and may provide a flat surface on the substrate 100.

A TFT may be arranged on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be arranged on the active layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to insulate from one another.

The source electrode 260 and the drain electrode 270 may be arranged on the interlayer insulating film 250. The interlayer insulating film 250 and the gate insulating film 230 may be formed to expose the source region and the drain region of the active layer 220, and the source electrode 260 and the drain electrode 270 may be respectively contact the exposed portions of the source region and the drain region of the active layer 220.

The TFT may be electrically connected to a light-emitting device to drive the light-emitting device, and may be covered with a passivation layer 280. The passivation layer 280 may include an inorganic insulating film, an organic insulating film, or any combination thereof. A light-emitting device may be provided on the passivation layer 280. The light-emitting device may include the first electrode 110, the interlayer 150, and the second electrode 190.

The first electrode 110 may be arranged on the passivation layer 280. The passivation layer 280 may be expose a portion of the drain electrode 270, not fully covering the drain electrode 270, and the first electrode 110 may be electrically connected to the exposed portion of the drain electrode 270.

A pixel defining layer 290 including an insulating material may be arranged on the first electrode 110. The pixel defining layer 290 may expose a certain region of the first electrode 110, and the interlayer 150 may be formed in the exposed region of the first electrode 110. The pixel defining layer 290 may be a polyimide-based organic film or a polyacrylic-based organic film. Although not shown in FIG. 4, at least one layer of the interlayer 150 may extend beyond the upper portion of the pixel defining layer 290, and may thus be provided in the form of a common layer.

The second electrode 190 may be arranged on the interlayer 150, and a capping layer 170 may be additionally formed on the second electrode 190. The capping layer 170 may be formed to cover the second electrode 190.

The encapsulation portion 300 may be arranged on the capping layer 170. The encapsulation portion 300 may be arranged on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and the like), an epoxy-based resin (for example, aliphatic glycidyl ether (AGE), and the like), or any combination thereof; or any combination of the inorganic films and the organic films.

FIG. 5 is a schematic cross-sectional view of an electronic apparatus according to another embodiment.

The electronic apparatus of FIG. 5 differs from the electronic apparatus of FIG. 4, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 5 may be a tandem light-emitting device.

[Manufacturing Method]

The layers included in the hole transport region, the emission layer, and the layers included in the electron transport region may be formed in a certain region by using various methods such as vacuum deposition, spin coating, casting, Langmuir-Blodgett (LB) deposition, ink-jet printing, laser-printing, laser-induced thermal imaging, and the like.

When the layers constituting the hole transport region, the emission layer, and the layers constituting the electron transport region are formed by vacuum deposition, the deposition may be performed at a deposition temperature in a range of about 100° C. to about 500° C., at a vacuum degree in a range of about $10^{-8}$ torr to about $10^{-3}$ torr, and at a deposition speed in a range of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon as the only ring-forming atoms and having 3 to 60 carbon atoms, and the term "$C_1$-$C_{60}$ heterocyclic group" as used herein may be a cyclic group that has 1 to 60 carbon atoms and further has, in addition to carbon, at least one heteroatom as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has 3 to 60 carbon atoms and may not include *—N=*' as a ring-forming moiety, and the term "π electron-deficient nitrogen-containing $C_1$-$C_{60}$ cyclic group" as used herein may be a heterocyclic group that has 1 to 60 carbon atoms and may include *—N=*' as a ring-forming moiety.

In embodiments, the $C_3$-$C_{60}$ carbocyclic group may be a T1 group or a cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a cyclic group in which two or more T2 groups are condensed with each other, or a cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be a T1 group, a cyclic group in which two or more T1 groups are condensed with each other, a T3 group, a cyclic group in which two or more T3 groups are condensed with each other, or a cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and the like), the π electron-deficient nitrogen-containing $C_1$-$C_{60}$ cyclic group may be a T4 group, a cyclic group in which two or more T4 groups are condensed with each other, a cyclic group in which at least one T4 group and at least one T1 group are condensed with each other, a cyclic group in which at least one T4 group and at least one T3 group are condensed with each other, or a cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, and the like) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and the like. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of the $C_2$-$C_{60}$ alkyl group, and examples thereof may include an ethenyl group, a propenyl group, a butenyl group, and the like. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of the $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$O(A_{101})$ (wherein $A_{101}$ may be a $C_1$-$C_{60}$ alkyl group), and examples thereof may include a methoxy group, an ethoxy group, an isopropyloxy group, and the like.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and the like. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and the like. The term "divalent non-aromatic condensed heteropolycyclic group" as used herein may be a divalent group having a same structure as the monovalent non-aromatic condensed heteropolycyclic group described above.

The term "$C_6$-$C_{60}$ aryloxy group" as used herein may be represented by —O($A_{102}$) (wherein $A_{102}$ may be a $C_6$-$C_{60}$ aryl group), and the term "$C_6$-$C_{60}$ arylthio group" as used herein may be represented by —S($A_{103}$) (wherein $A_{103}$ may be a $C_6$-$C_{60}$ aryl group).

The term "$C_7$-$C_{60}$ aryl alkyl group" as used herein may be represented by -($A_{104}$)($A_{105}$) (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be represented by -($A_{106}$)($A_{107}$) (where $A_{106}$ may be a $C_1$-$C_{59}$ alkylene group, and $A_{107}$ may be a $C_1$-$C_{59}$ heteroaryl group).

The group "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term “heteroatom” as used herein may be any atom other than a carbon atom or a hydrogen atom. Examples of the heteroatom may include O, S, N, P, Si, B, Ge, Se, or any combination thereof.

The term “third-row transition metal” as used herein may include hafnium (Hf), tantalum (Ta), tungsten (W), rhenium (Re), osmium (Os), iridium (Ir), platinum (Pt), gold (Au), and the like.

The term “Ph” as used herein refers to a phenyl group, the term “Me” as used herein refers to a methyl group, the term “Et” as used herein refers to an ethyl group, the terms “tert-Bu” or “$Bu^t$” as used herein each refer to a tert-butyl group, and the term “OMe” as used herein refers to a methoxy group.

The term “biphenyl group” as used herein may be a phenyl group substituted with a phenyl group. For example, the “biphenyl group” may be a substituted phenyl group having a $C_6$-$C_{60}$ aryl group as a substituent.

The term “terphenyl group” as used herein may be a phenyl group substituted with a biphenyl group. For example, the “terphenyl group” may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, compounds according to embodiments and light-emitting devices according to embodiments will be described in detail with reference to the Synthesis Examples and the Examples. The wording “B was used instead of A” used in describing Synthesis Examples means that an identical molar equivalent of B was used in place of A.

EXAMPLES

Example 1

As an anode, a Corning 15 $\Omega/cm^2$ (1,200 Å) ITO glass substrate was cut to a size of 50 mm×50 mm×0.5 mm, sonicated with isopropyl alcohol and pure water each for 15 minutes, and subjected to a plasma treatment. The resultant ITO glass substrate was loaded onto a vacuum deposition apparatus.

HTM1 (Compound HT3) was vacuum-deposited on the ITO anode formed on the glass substrate to form a hole injection layer having a thickness of 120 nm, and HTM2 was vacuum-deposited on the hole injection layer to form a hole transport layer having a thickness of 10 nm.

BH1 and DF8 were co-deposited on the hole transport layer at a weight ratio of 98:2 to form an emission layer having a thickness of 20 nm.

Compound 2-69 and Yb were co-deposited on the emission layer at a weight ratio of 97:3 to form an electron transport layer, and LiF and Yb were co-deposited on the electron transport layer at a weight ratio of 90:10 to form an electron injection layer having a thickness of 1 nm.

Ag and Mg were co-deposited on the electron injection layer at a weight ratio of 1:9 to form an electron having a thickness of 10 nm, and CP7 was deposited on the electrode to form a capping layer having a thickness of 70 nm, thereby completing the manufacture of a light-emitting device.

HTM1(HT3)

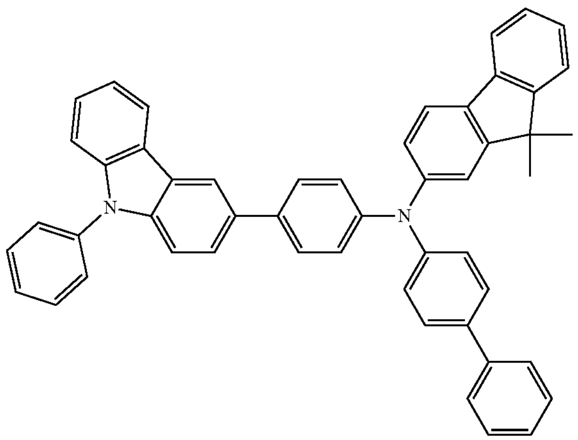

HTM2

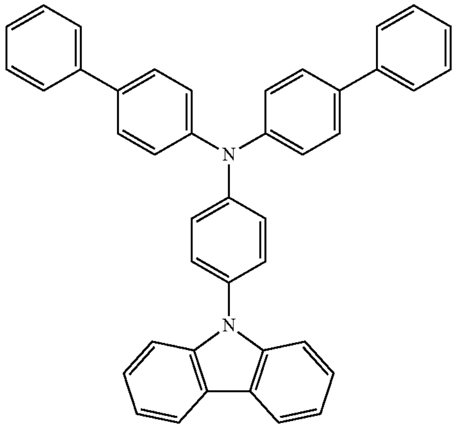

BH1

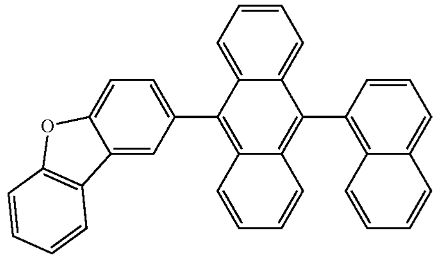

DF8

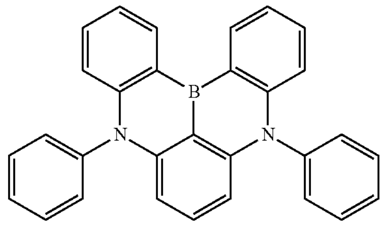

-continued 2-69

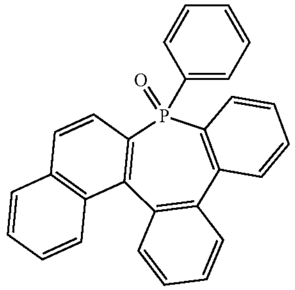

CP7

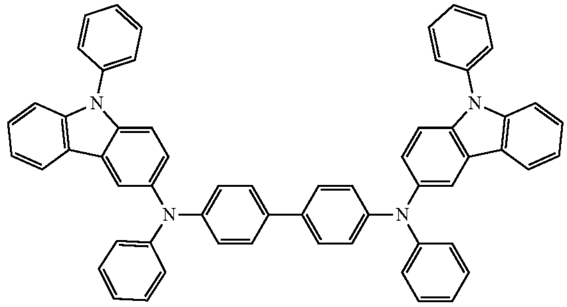

A

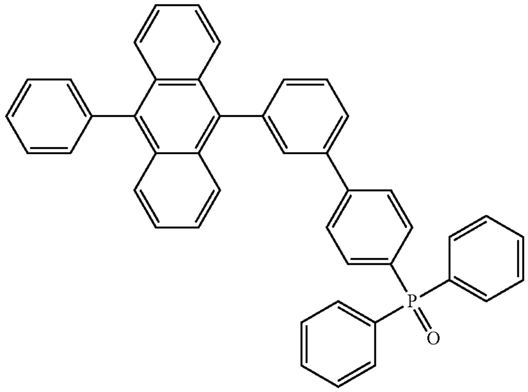

Li-1

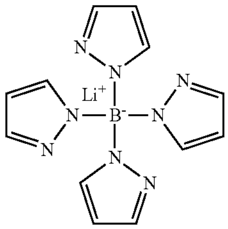

Examples 2 to 8 and Comparative Example 1

Light-emitting devices were manufactured in the same manner as in Example 1, except that compounds of Table 1 were used at weight ratios as shown in Table 1 in forming an electron transport layer, an electron injection layer, and a second electrode.

Comparative Example 2

A light-emitting device was used in the same manner as in Example 1, except that Compound A and Li-1 were used at a volume ratio of 75:25 in forming an electron transport layer and that RbI and Yb were used at a weight ratio 30:70 (volume ratio of 50:50) in forming an electron injection layer.

Evaluation Example 1

To evaluate characteristics of the light-emitting devices of Examples 1 to 8 and Comparative Example 1, the driving voltage (V) at 1,000 cd/$m^2$, luminescence efficiency (%), and lifespan (%) thereof were measured using Keithley MU 236 and luminance meter PR650, and results are shown in Table 1. Regarding the driving voltage in Table 1, the driving voltage value of Comparative Example 1 was set to 0, and the difference therewith was converted. The luminescence efficiency was expressed as a relative value (%). The lifespan was expressed as a relative value (%) by measuring the time it takes to achieve 90% of the luminance compared to the initial luminance.

TABLE 1

| | Electron transport layer (weight ratio) | Electron injection layer (weight ratio) | Second electrode (weight ratio) | Driving voltage (V) | Luminescence efficiency (%) | Lifespan (T90) (%) |
|---|---|---|---|---|---|---|
| Example 1 | Compound 2-69: Yb (97:3) | LiF:Yb (90:10) | Ag:Mg (97:3) | −0.3 V | 107% | 110% |
| Example 2 | Compound 2-69: Yb (97:3) | LiF:Yb (90:10) | Ag | −0.3 V | 108% | 111% |
| Example 3 | Compound 2-69: Li (97:3) | KI:Yb (90:10) | Ag:Mg (97:3) | −0.25 V | 105% | 108% |
| Example 4 | Compound 2-69: Li (97:3) | KI:Yb (90:10) | Ag | −0.25 V | 106% | 109% |
| Example 5 | Compound 2-69: Yb (97:3) | KI:Li (90:10) | Ag:Mg (97:3) | −0.27 V | 106% | 105% |
| Example 6 | Compound 2-69: Yb (97:3) | KI:Li (90:10) | Ag | −0.27 V | 107% | 106% |

TABLE 1-continued

| | Electron transport layer (weight ratio) | Electron injection layer (weight ratio) | Second electrode (weight ratio) | Driving voltage (V) | Luminescence efficiency (%) | Lifespan (T90) (%) |
|---|---|---|---|---|---|---|
| Example 7 | Compound 2-69: Li (97:3) | KI:Li (90:10) | Ag:Mg (97:3) | −0.23 V | 105% | 102% |
| Example 8 | Compound 2-69: Li (97:3) | KI: Li (90:10) | Ag | −0.23 V | 106% | 103% |
| Comparative Example 1 | Compound 2-69: LiQ (97:3) | Yb | Ag | 0 | 100% | 100% |
| Comparative Example 2 | Compound A: Li-1 (volume ratio of 75:25) | RbI:Yb (30:70) | Ag:Mg (97:3) | 0 | 85% | 89% |

Referring to Table 1, it was confirmed that the light-emitting devices of Examples 1 to 8 had low driving voltage, high luminescence efficiency, and long lifespan characteristics compared to the light-emitting devices of Comparative Examples 1 and 2.

As described above, according to the embodiments, a light-emitting device may have low driving voltage, high luminescence efficiency, and a long lifespan, and thus may be used to manufacture a high-quality electronic apparatus.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode; and an interlayer comprising:

an emission layer between the first electrode and the second electrode; and an electron transport region between the emission layer and the second electrode, wherein the electron transport region comprises:

an electron transport layer; and an electron injection layer between the electron transport layer and the second electrode, the electron transport layer comprises a co-deposited layer of a first material and a second material, the first material is a compound represented by Formula 1 or Formula 2, the second material comprises a first metal, a halide of the first metal, a complex comprising the first metal, or a combination thereof, the electron injection layer comprises a third material and a fourth material, the third material comprises a second metal, a halide of the second metal, a complex comprising the second metal, or a combination thereof, the fourth material comprises a third metal, a halide of the third metal, a complex comprising the third metal, or a combination thereof, the first metal, the second metal, and the third metal are each independently an alkali metal, an alkaline earth metal, a rare earth metal, a third-row transition metal of the periodic table, or a combination thereof, the second metal and the third metal are different from each other, and an amount of the third material is in a range of about 50 parts by weight to about 99 parts by weight, based on a total of 100 parts by weight of the electron injection layer:

[Formula 1]

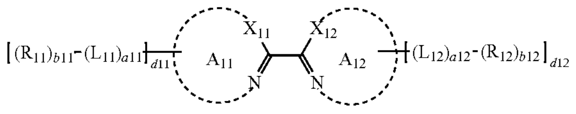

[Formula 2]

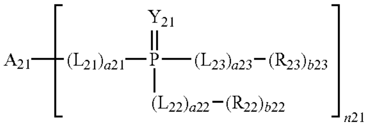

wherein in Formula 1, $X_{11}$ is N or $C(Z_{11})$, $X_{12}$ is N or $C(Z_{12})$, $A_{11}$ and $A_{12}$ are each independently a $C_1$-$C_{60}$ heterocyclic group including at least one N, and d11 and d12 are each independently an integer from 1 to 10, wherein in Formula 2, $Y_{21}$ is O, S, or Se, $A_{21}$ is a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and n21 is an integer from 1 to 3, wherein in Formulae 1 and 2, $L_{11}$, $L_{12}$, and $L_{21}$ to $L_{23}$ are each independently a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a11, a12, and a21 to a23 are each independently an integer from 1 to 5, $R_{11}$, $R_{12}$, $R_{22}$, $R_{23}$, $Z_{11}$, and $Z_{12}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b11, b12, b22, and b23 are each independently an integer from 1 to 10, $R_{22}$ and $R_{23}$ are optionally bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, $Z_{11}$ and $Z_{12}$ are optionally bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_3$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein the first electrode is an anode, the second electrode is a cathode, the interlayer further comprises a hole transport region between the emission layer and the first electrode, the hole transport region comprises a hole injection layer, a hole transport layer, an emission auxiliary layer, an electron blocking layer, or a combination thereof, and the electron transport region further comprises a buffer layer, a hole blocking layer, an electron control layer, or a combination thereof.

3. The light-emitting device of claim 1, further comprising:

a first capping layer disposed outside the first electrode;

a second capping layer disposed outside the second electrode; or both the first capping layer and the second capping layer.

4. The light-emitting device of claim 1, wherein the emission layer and the electron transport layer directly contact each other.

5. The light-emitting device of claim 1, wherein the electron transport layer and the electron injection layer directly contact each other.

6. The light-emitting device of claim 1, wherein the electron injection layer and the second electrode directly contact each other.

7. The light-emitting device of claim 1, wherein the emission layer comprises a dopant, and the dopant serves as a phosphorescent dopant to emit phosphorescence from the emission layer.

8. The light-emitting device of claim 1, wherein the emission layer comprises a dopant, and the dopant emits blue light having a maximum emission wavelength in a range of about 450 nm to about 490 nm.

9. The light-emitting device of claim 1, wherein the emission layer comprises a dopant, and the dopant comprises a boron-containing compound.

10. The light-emitting device of claim 1, wherein the electron injection layer is formed by co-depositing the third material and the fourth material.

11. The light-emitting device of claim 1, wherein the first metal included in the second material is an alkali metal, a rare earth metal, or a combination thereof.

12. The light-emitting device of claim 1, wherein the halide of the second metal comprises a fluoride of the second metal, a bromide of the second metal, an iodide of the second metal, or a combination thereof.

13. The light-emitting device of claim 1, wherein a moiety represented by

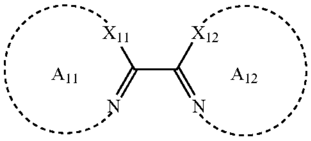

in Formula 1 is represented by one of Formulae 1-1 to 1-31:
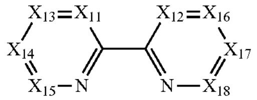
1-1
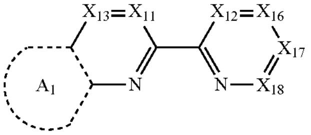
1-2
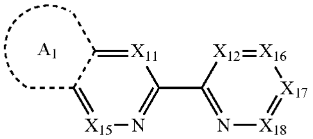
1-3
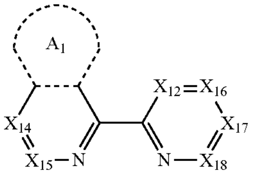
1-4
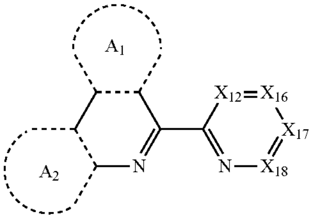
1-5
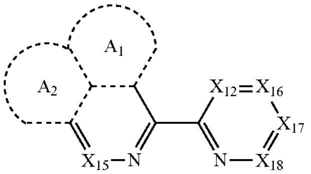
1-6
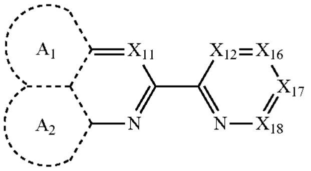
1-7
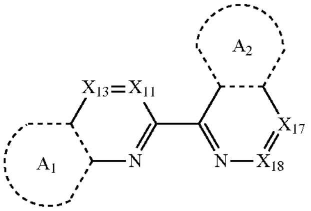
1-8
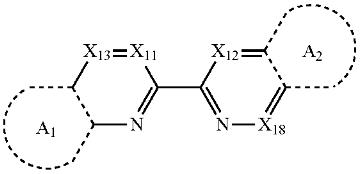
1-9
-continued
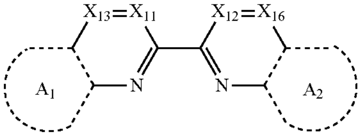
1-10
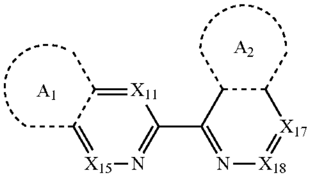
1-11
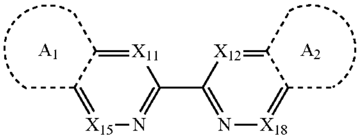
1-12
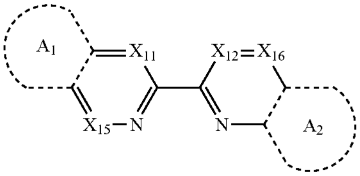
1-13
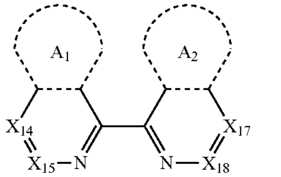
1-14
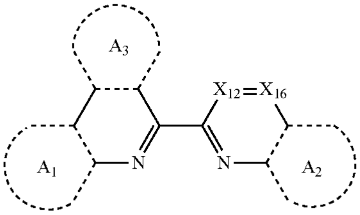
1-15
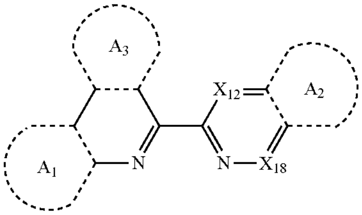
1-16
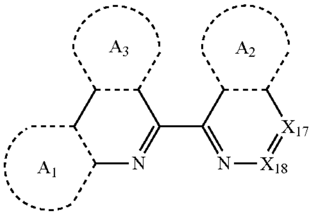
1-17

-continued 1-18

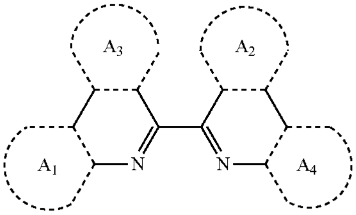

1-19

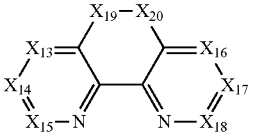

1-20

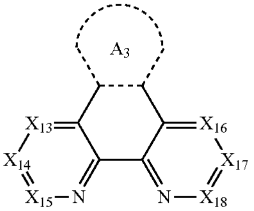

1-21

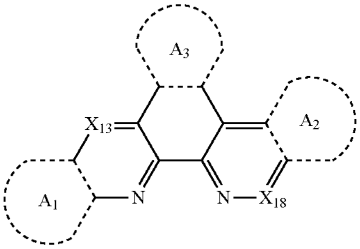

1-22

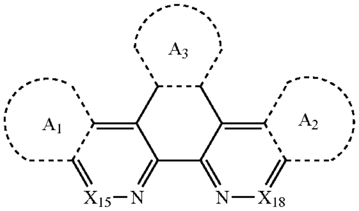

1-23

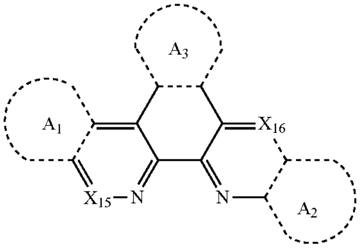

1-24

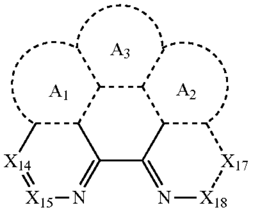

-continued 1-25

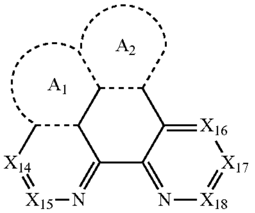

1-26

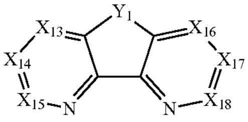

1-27

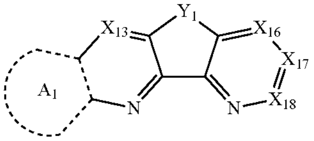

1-28

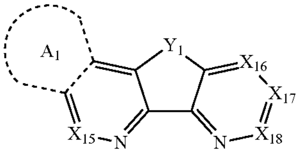

1-29

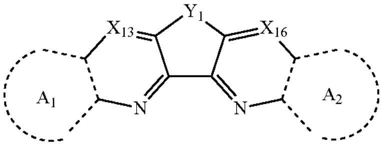

1-30

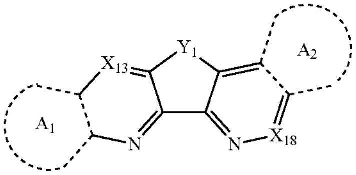

1-31

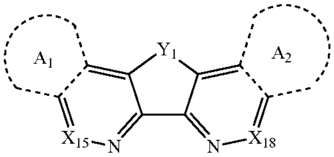

wherein in Formulae 1-1 to 1-31, $X_{11}$ and $X_{12}$ are respectively the same as described in Formula 1, $X_{13}$ is N or $C(Z_{13})$, $X_{14}$ is N or $C(Z_{14})$, $X_{15}$ is N or $C(Z_{15})$, $X_{16}$ is N or $C(Z_{16})$, $X_{17}$ is N or $C(Z_{17})$, $X_{18}$ is N or $C(Z_{18})$, $X_{19}$ is N or $C(Z_{19})$, $X_{20}$ is N or $C(Z_{20})$, $A_1$ to $A_3$ are each independently a benzene group, a naphthalene group, an anthracene group, a phenanthrene group, a triphenylene group, a pyrene group, a cyclopentadiene group, a thiophene group, a furan group, an indole group, an indene group, a benzosilole group, a benzogermole group, a benzothiophene group, a benzoselenophene group, a benzofuran group, a carbazole group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzoimidazole group, a benzooxazole group, a benzothiazole group, a benzooxadiazole group, a benzothiadiazole group, a 5,6,7,8-tetrahydroisoquinoline group, or a 5,6,7,8-tetrahydroquinoline group, each unsubstituted or substituted with at least one $R_{10a}$, $Y_1$ is O, S, $N(Z_{1a})$, or $C(Z_{1a})(Z_{1b})$, $Z_{13}$ to $Z_{20}$, $Z_{1a}$, and $Z_{1b}$ are each independently the same as described in connection with $R_{11}$ in Formula 1, $Z_{13}$ to $Z_{20}$, $Z_{1a}$, and $Z_{1b}$ are optionally bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, and $R_{10a}$ is the same as described in Formula 1.

14. The light-emitting device of claim 1, wherein the compound represented by Formula 2 is represented by one of Formulae 2-1 to 2-4:

[Formula 2-1]

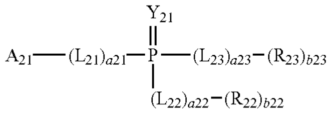

[Formula 2-2]

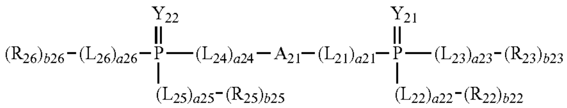

[Formula 2-3]

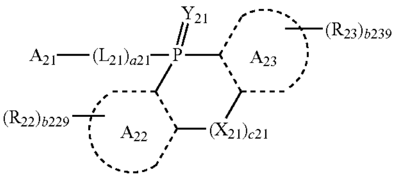

[Formula 2-4]

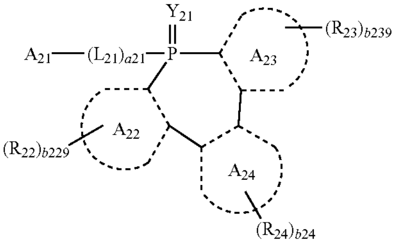

wherein in Formulae 2-1 to 2-4, $Y_{21}$, $A_{21}$, $L_{21}$ to $L_{23}$, a21 to a23, $R_{22}$, and $R_{23}$ are respectively the same as described in Formula 2, $X_{21}$ is a single bond, O, S, $N(Z_{21a})$, or $C(Z_{21a})(Z_{21b})$, c21 is 0 or 1, $Z_{21a}$ and $Z_{21b}$ are each independently the same as described in connection with $R_{22}$ in Formula 2, $Y_{22}$ is the same as described in connection with $Y_{21}$ in Formula 2, $L_{24}$ to $L_{26}$ are each independently the same as described in connection with $L_{21}$ in Formula 2, a24 to a26 are each independently an integer from 1 to 5, b229 and b239 are each independently an integer from 1 to 9, $R_{24}$ to $R_{26}$ are each independently the same as described in connection with $R_{22}$ in Formula 2, b24 to b26 are each independently an integer from 1 to 10, and $A_{22}$ to $A_{24}$ are each independently a $C_5$-$C_{60}$ carbocyclic group or a $C_2$-$C_{30}$ heterocyclic group.

15. The light-emitting device of claim 1, wherein $A_{21}$ in Formula 2 is represented by one of Formulae 3-1 to 3-7:

3-1

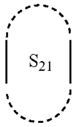

3-2

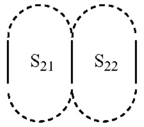

3-3

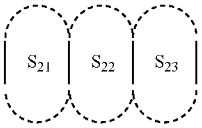

3-4

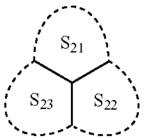

3-5

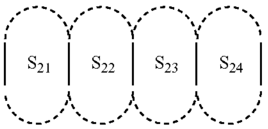

3-6

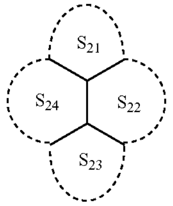

3-7

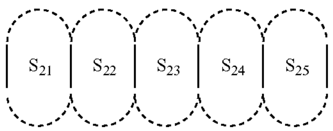

wherein in Formulae 3-1 to 3-7, $S_{21}$ to $S_{25}$ are each independently a benzene group, a naphthalene group, a phenanthrene group, an anthracene group, a triphenylene group, a cyclopentadiene group, a furan group, a pyrrole group, an imidazole group, a benzoxazole group, a benzothiazole group, a benzoimidazole group, a pyridine group, a pyrazine group, a pyrimidine group, an indole group, a quinoline group, an isoquinoline group, a benzoquinoline group, a phenanthridine group, an acridine group, a phenanthroline group, a triazole group, a tetrazole group, or a triazine group, each unsubstituted or substituted with at least one $R_{10a}$, and $R_{10a}$ is the same as described in Formula 2.

16. A light-emitting device comprising:

a plurality of first electrodes arranged for each of a first subpixel, a second subpixel, and a third subpixel;

a second electrode facing the plurality of first electrodes;

m emitting units between the second electrode and the plurality of first electrodes; and m−1 charge generation layers, each arranged between two neighboring emitting units among the m emitting units and comprising an n-type charge generation layer and a p-type charge generation layer, wherein m is an integer of 2 or more, each of the m emitting units comprises an emission layer and an electron transport region that are sequentially arranged, at least one of the m emission layers comprises a first emission layer arranged on the first subpixel and emitting first-color light, a second emission layer arranged on the second subpixel and emitting second-color light, and a third emission layer arranged on the third subpixel and emitting third-color light, the first-color light is red light, the second-color light is green light, and the third-color light is blue light, at least one of the m electron transport regions comprises an electron transport layer and an electron injection layer that are sequentially arranged, the electron transport layer comprises a co-deposited layer of a first material and a second material, the first material is a compound represented by Formula 1 or Formula 2, the second material comprises a first metal, a halide of the first metal, a complex comprising the first metal, or a combination thereof, the electron injection layer comprises a third material and a fourth material, the third material comprises a second metal, a halide of the second metal, a complex comprising the second metal, or a combination thereof, the fourth material comprises a third metal, a halide of the third metal, a complex comprising the third metal, or a combination thereof, the first metal, the second metal, and the third metal are each independently an alkali metal, an alkaline earth metal, a rare earth metal, a third-row transition metal of the periodic table, or a combination thereof, the second metal and the third metal are different from each other, and an amount of the third material is in a range of about 50 parts by weight to about 99 parts by weight, based on a total of 100 parts by weight of the electron injection layer:

[Formula 1]

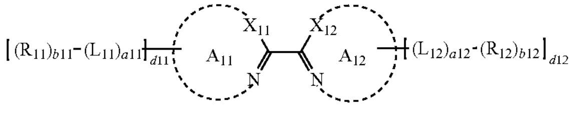

-continued

[Formula 2]

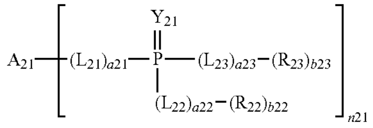

wherein in Formula 1, $X_{11}$ is N or $C(Z_{11})$, $X_{12}$ is N or $C(Z_{12})$, $A_{11}$ and $A_{12}$ are each independently a $C_1$-$C_{60}$ heterocyclic group including at least one N, and d11 and d12 are each independently an integer from 1 to 10, wherein in Formula 2, $Y_{21}$ is O, S, or Se, $A_{21}$ is a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and n21 is an integer from 1 to 3, wherein in Formulae 1 and 2, $L_{11}$, $L_{12}$, and $L_{21}$ to $L_{23}$ are each independently a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a11, a12, and a21 to a23 are each independently an integer from 1 to 5, $R_{11}$, $R_{12}$, $R_{22}$, $R_{23}$, $Z_{11}$, and $Z_{12}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b11, b12, b22, and b23 are each independently an integer from 1 to 10, $R_{22}$ and $R_{23}$ are optionally bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, $Z_{11}$ and $Z_{12}$ are optionally bonded to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-Coo carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen;

deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

17. An electronic apparatus comprising the light-emitting device of claim 1.

18. The electronic apparatus of claim 17, further comprising a thin-film transistor, wherein the thin-film transistor comprises a source electrode and a drain electrode, and the first electrode of the light-emitting device is electrically connected to the source electrode or the drain electrode.

19. The electronic apparatus of claim 17, further comprising a color filter, a color conversion layer, a touch screen layer, a polarizing layer, or a combination thereof.

20. The electronic apparatus of claim 17, wherein the electronic apparatus comprises a personal computer, a mobile personal computer, a mobile phone, a digital camera, an electronic organizer, an electronic dictionary, an electronic game machine, an electronic thermometer, a sphygmomanometer, a blood glucose meter, a pulse measurement device, a pulse wave measurement device, an electrocardiogram display, an ultrasonic diagnostic device, an endoscope display, a fish finder, a measuring instrument, a meter, or a projector.

* * * * *